(12) United States Patent
Shinkawa

(10) Patent No.: US 12,235,440 B2
(45) Date of Patent: Feb. 25, 2025

(54) MOVABLE APPARATUS

(71) Applicant: Mizuki Shinkawa, Kanagawa (JP)

(72) Inventor: Mizuki Shinkawa, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 472 days.

(21) Appl. No.: 17/639,340

(22) PCT Filed: Oct. 12, 2020

(86) PCT No.: PCT/JP2020/038498
§ 371 (c)(1),
(2) Date: Mar. 1, 2022

(87) PCT Pub. No.: WO2021/075403
PCT Pub. Date: Apr. 22, 2021

(65) Prior Publication Data
US 2022/0326512 A1    Oct. 13, 2022

(30) Foreign Application Priority Data

Oct. 18, 2019   (JP) ................. 2019-190737
Oct. 18, 2019   (JP) ................. 2019-190738
Mar. 16, 2020   (JP) ................. 2020-045695

(51) Int. Cl.
*G02B 26/08*    (2006.01)
*B81B 3/00*     (2006.01)
*G02B 26/10*    (2006.01)

(52) U.S. Cl.
CPC .......... *G02B 26/105* (2013.01); *B81B 3/0043* (2013.01); *G02B 26/0858* (2013.01); *G02B 26/101* (2013.01); *B81B 2201/042* (2013.01)

(58) Field of Classification Search
CPC .............. G02B 26/105; G02B 26/0858; G02B 26/101; G02B 26/0833; B81B 3/0043;
(Continued)

(56) References Cited

U.S. PATENT DOCUMENTS

2002/0125325 A1   9/2002   Plesko
2005/0162806 A1*  7/2005   Sarkar ................. B81B 3/0086
                                                       361/277
(Continued)

FOREIGN PATENT DOCUMENTS

EP      2955561         12/2015
JP      2009-265362 A   11/2009
(Continued)

OTHER PUBLICATIONS

International Search Report for PCT/JP2020/038498 mailed on Dec. 22, 2020, 12 pages.
(Continued)

*Primary Examiner* — Euncha P Cherry
(74) *Attorney, Agent, or Firm* — XSENSUS LLP

(57) ABSTRACT

A movable apparatus includes a movable unit including a mirror configured to reflect light, a support portion including a first end and a second end, the first end being connected to the movable unit, the support portion configured to swingably support the movable unit, and a fixed unit connected to the second end of the support portion. The support portion includes a plurality of beam units and a connection unit connecting adjacent beam units of the plurality of beam units, wherein where the support portion is divided into two parts at a predetermined or given position, the two parts including a first part closer to the fixed unit and a second part closer to the movable unit. A beam unit of the plurality of beam units in the first part has a higher rigidity than a beam unit of the plurality of beam units in the second part.

17 Claims, 64 Drawing Sheets

(58) Field of Classification Search
CPC ........ B81B 2201/042; B81B 2201/032; B81B 2203/058
See application file for complete search history.

(56) References Cited

U.S. PATENT DOCUMENTS

| | | |
|---|---|---|
| 2013/0301102 A1 | 11/2013 | Kamiya et al. |
| 2015/0260517 A1 | 9/2015 | Su et al. |
| 2015/0362724 A1* | 12/2015 | Ikegami ............. G02B 26/0858 359/199.4 |
| 2016/0299335 A1 | 10/2016 | Hofmann et al. |
| 2018/0282147 A1 | 10/2018 | Shinkawa et al. |
| 2019/0391394 A1 | 12/2019 | Shinkawa et al. |

FOREIGN PATENT DOCUMENTS

| | | |
|---|---|---|
| JP | 2012-108164 A | 6/2012 |
| JP | 2012-123117 A | 6/2012 |
| JP | 2014-232176 | 12/2014 |
| JP | 2015-175984 | 10/2015 |
| JP | 2017-009866 A | 1/2017 |
| JP | 2017-067877 A | 4/2017 |
| JP | 2017-167254 A | 9/2017 |
| JP | 2019-056935 A | 4/2019 |
| JP | 2019-082634 A | 5/2019 |
| JP | 2019-110279 A | 7/2019 |
| JP | 2021-067721 | 4/2021 |
| JP | 2021-067722 | 4/2021 |

OTHER PUBLICATIONS

Office Action issued Dec. 5, 2023 in Japanese Patent Application No. 2020-045695, 4 pages.
Office Action issued Jun. 13, 2023 in Japanese Patent Application No. 2019-190737, 2 pages.
Office Action issued Jun. 13, 2023 in Japanese Patent Application No. 2019-190738, 2 pages.

* cited by examiner

[Fig. 1]
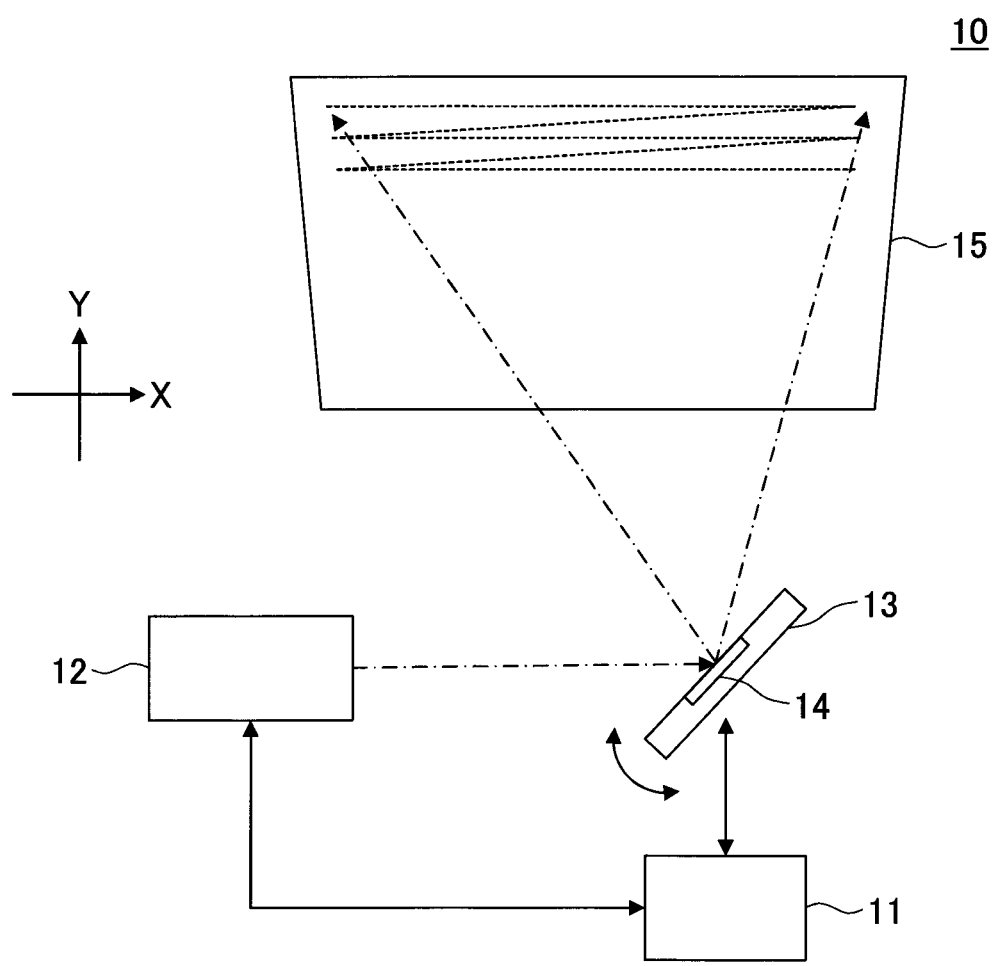

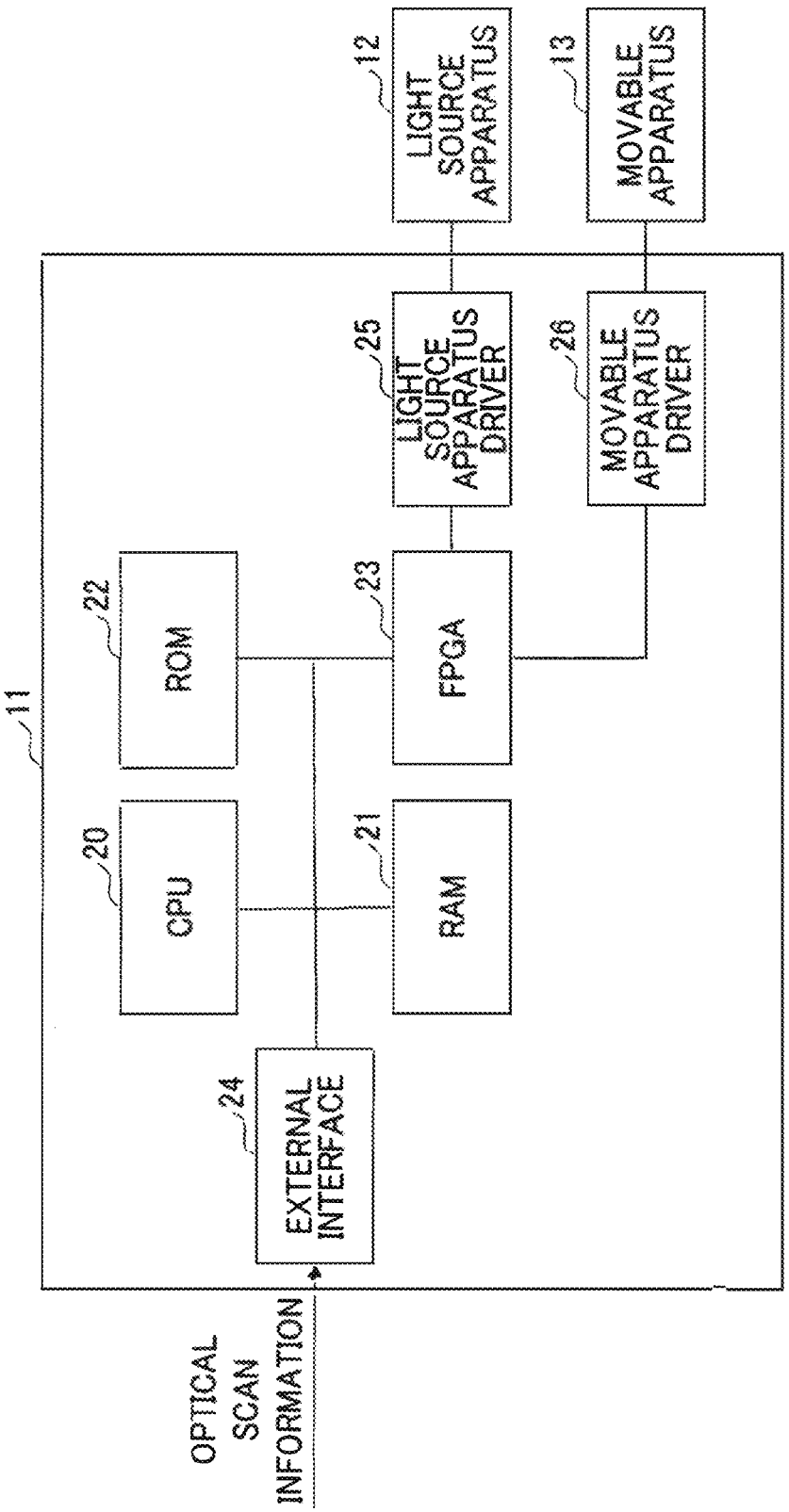

[Fig. 3]
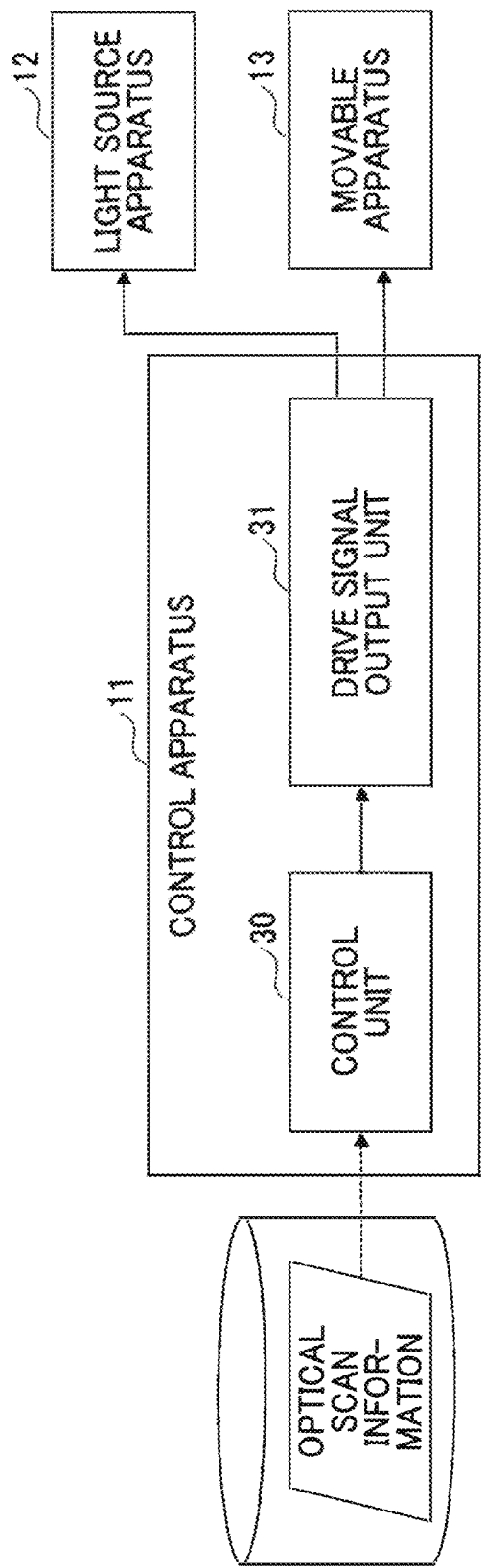

[Fig. 4]
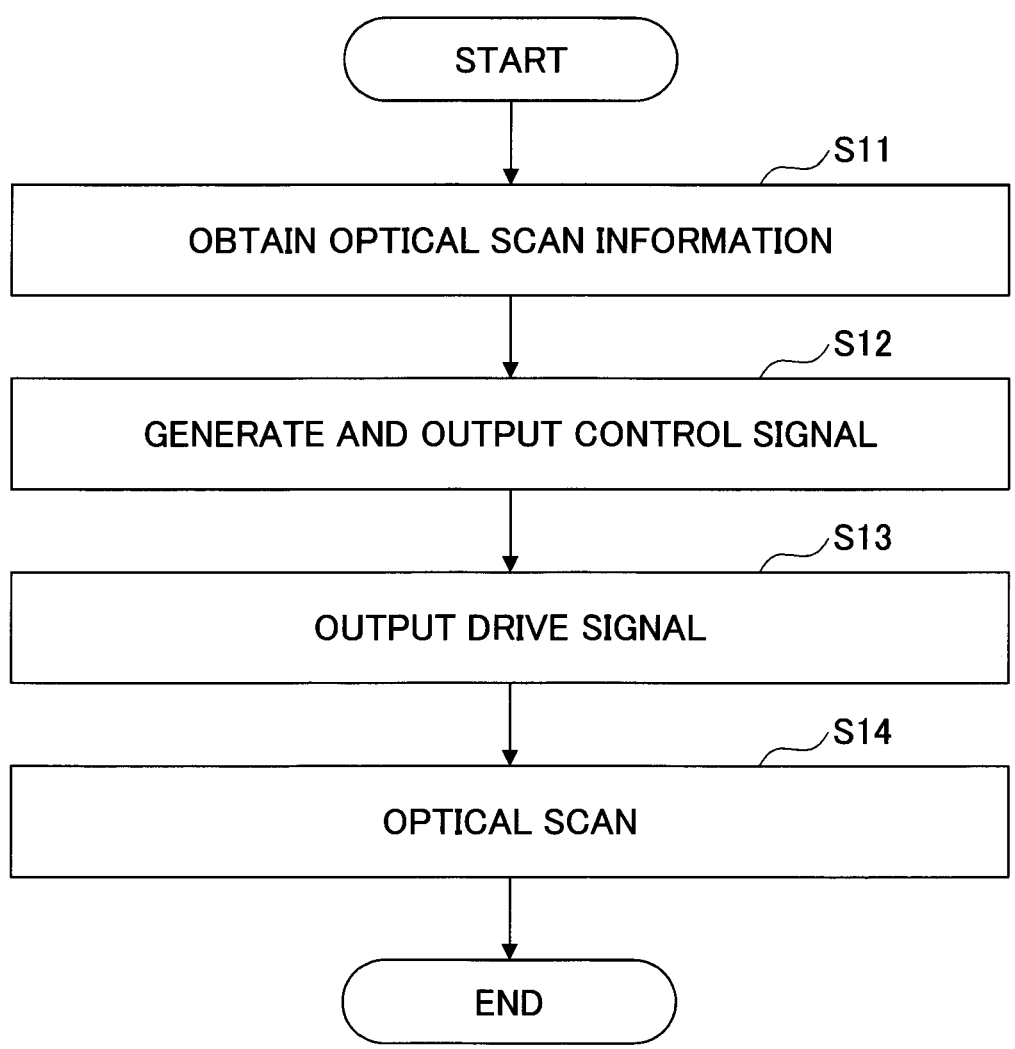

[Fig. 5]
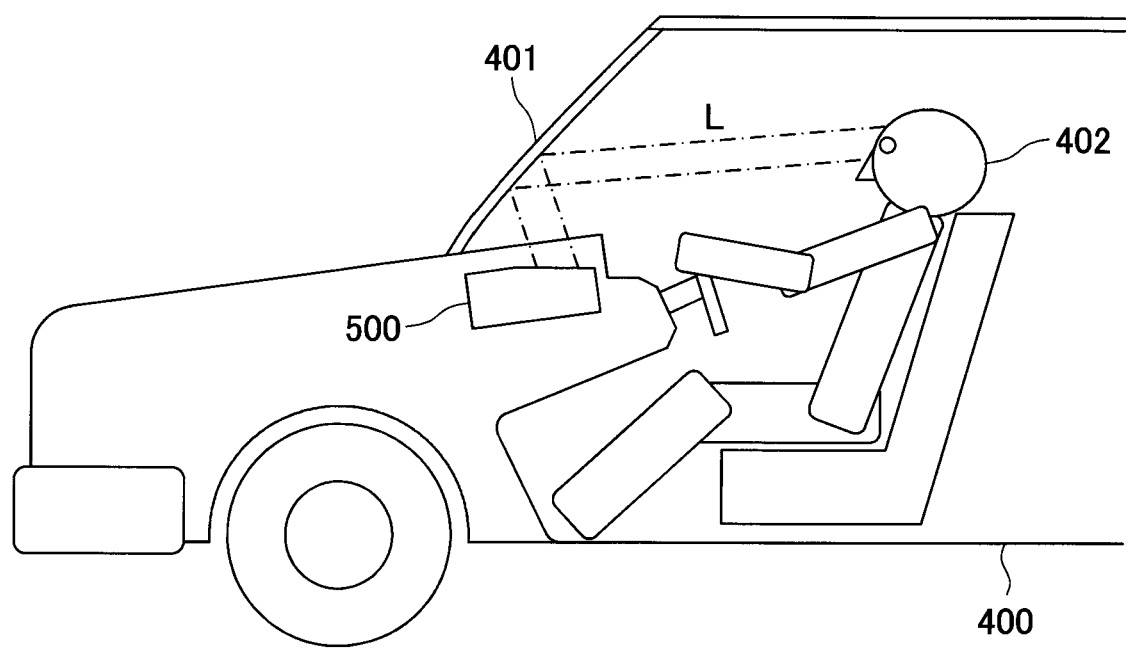

[Fig. 6]
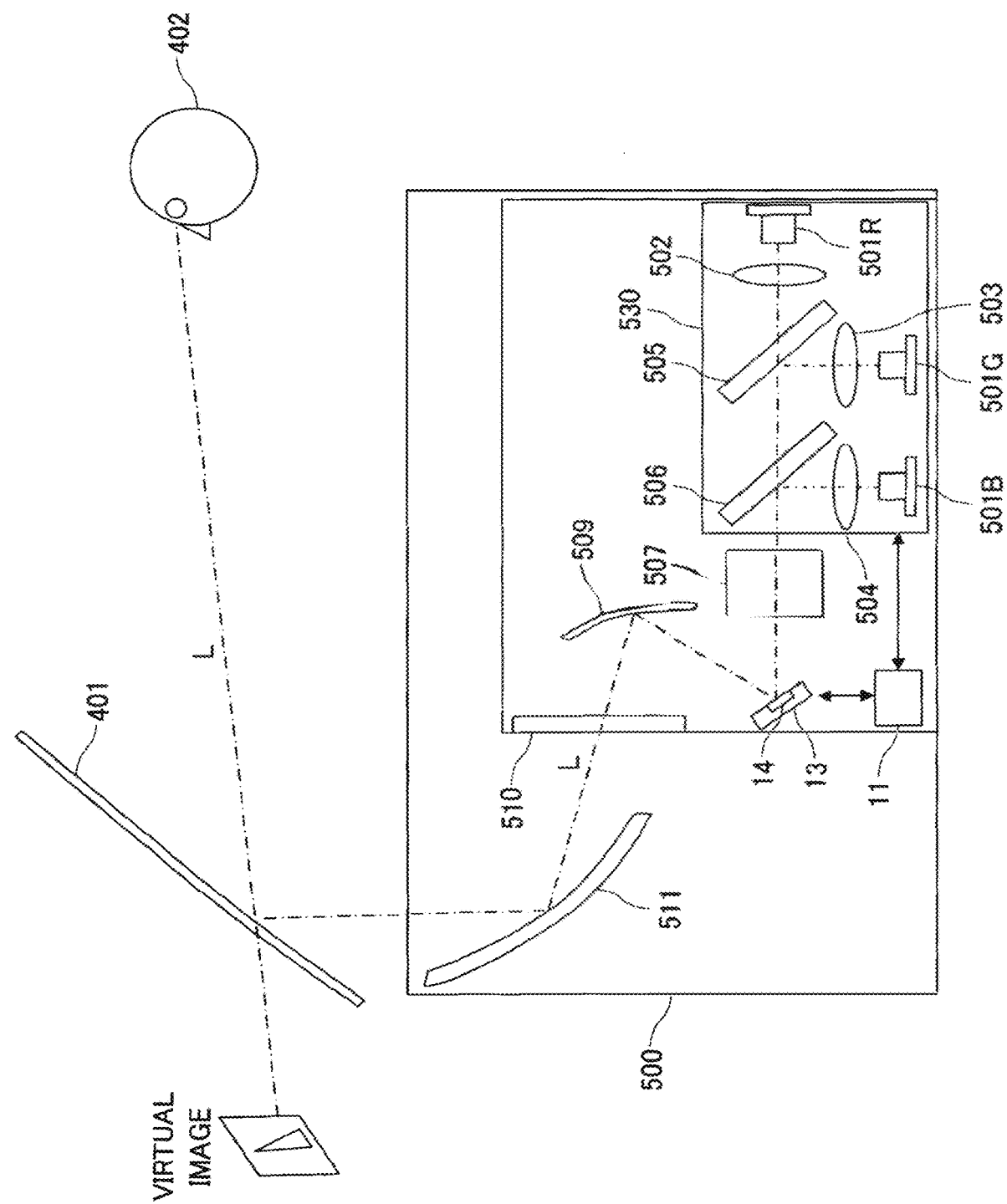

[Fig. 7]
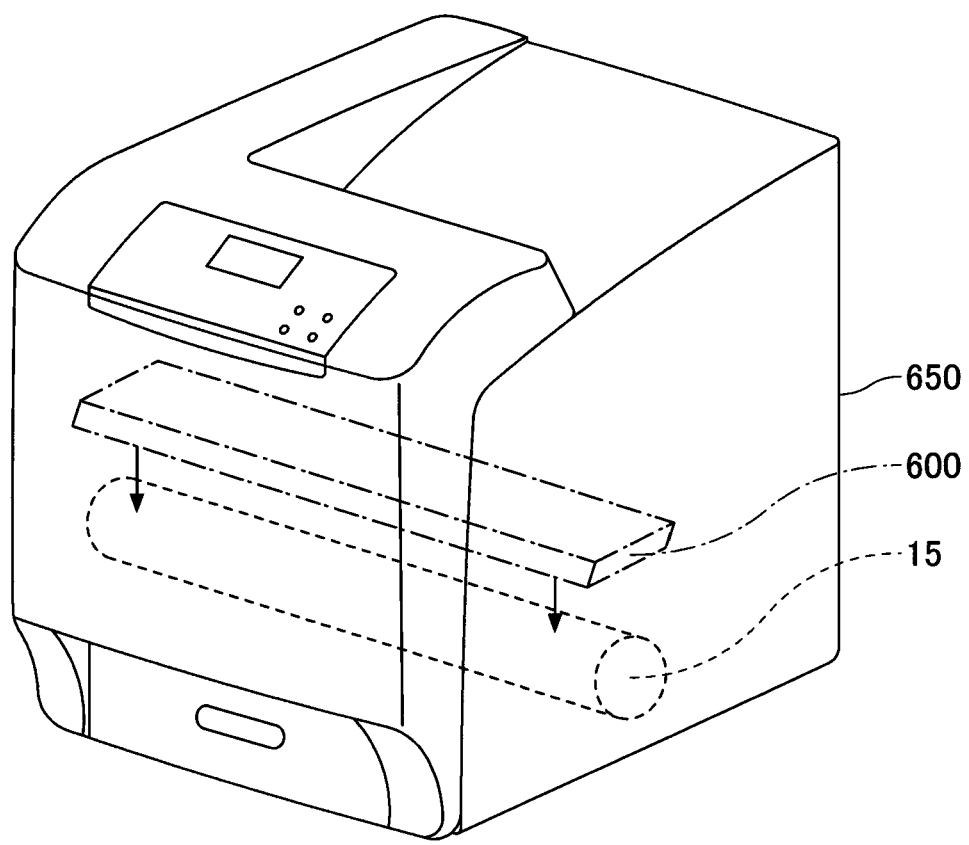

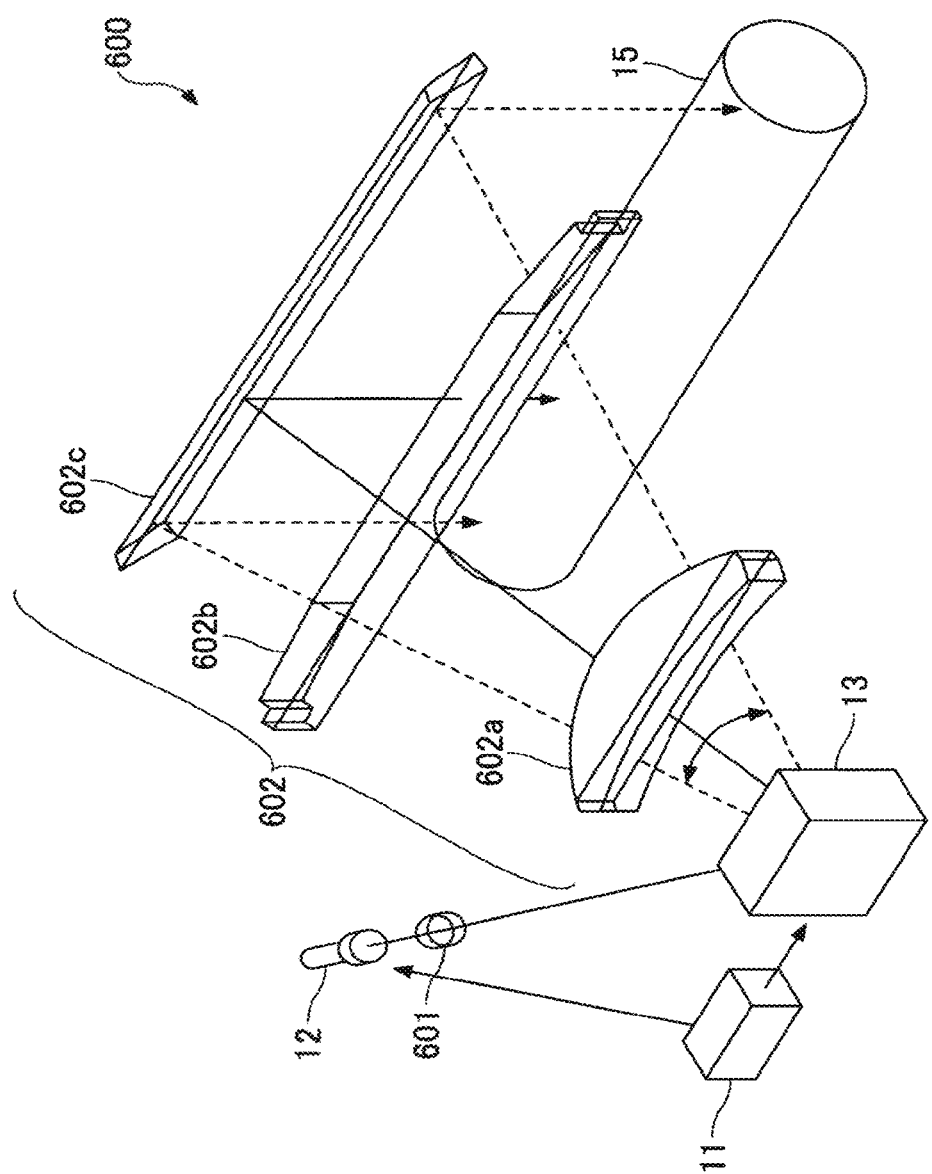
[Fig. 8]

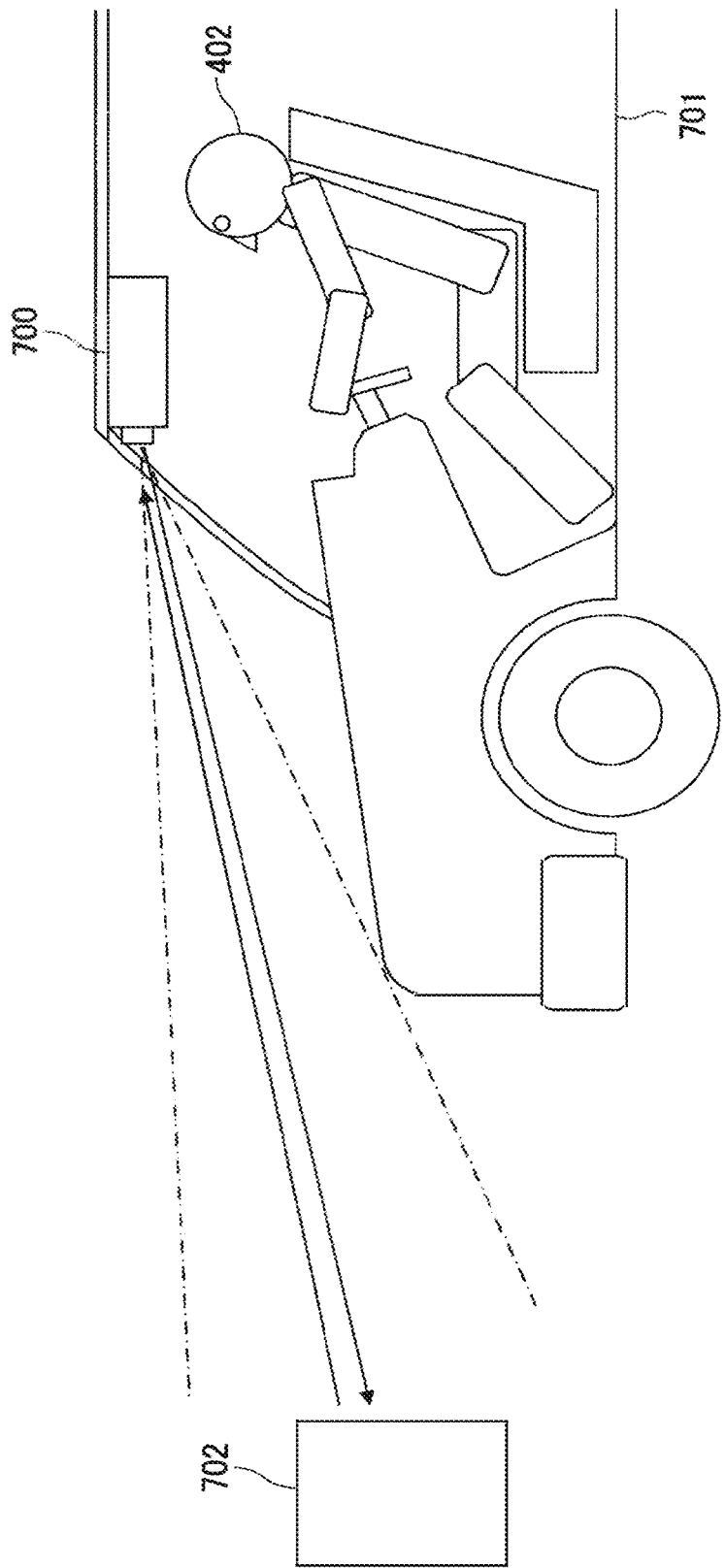
[Fig. 9]

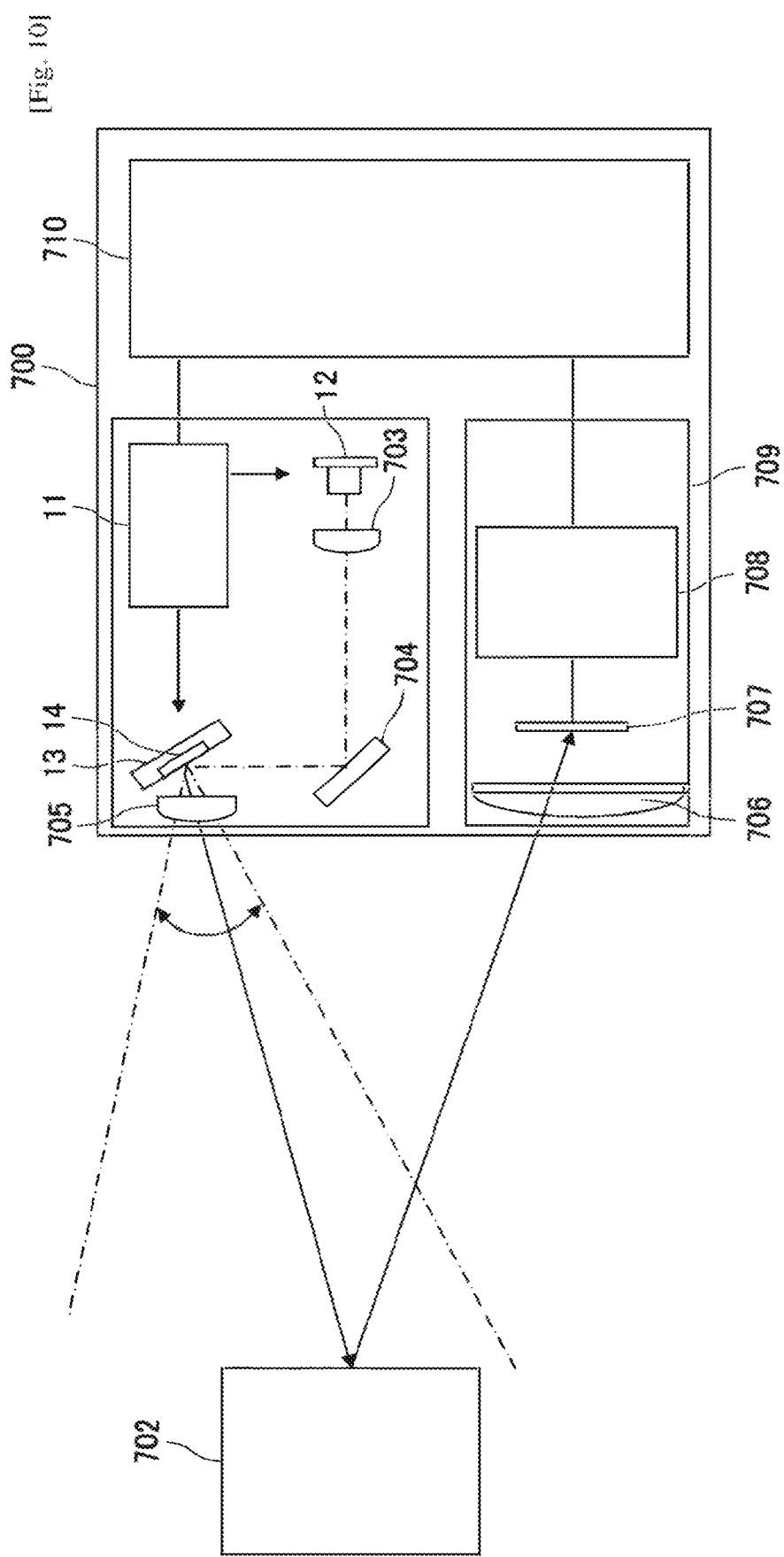
[Fig. 10]

[Fig. 11]
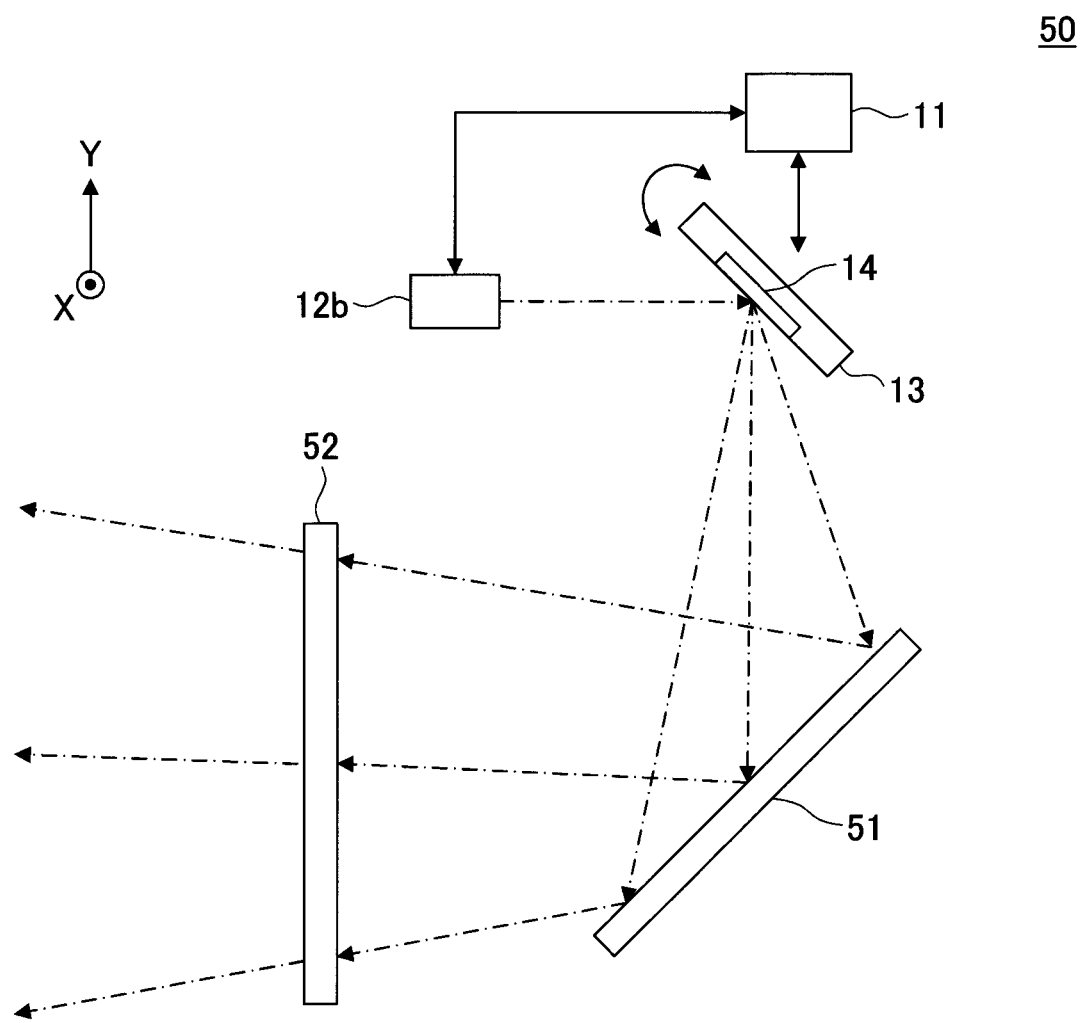

[Fig. 12]
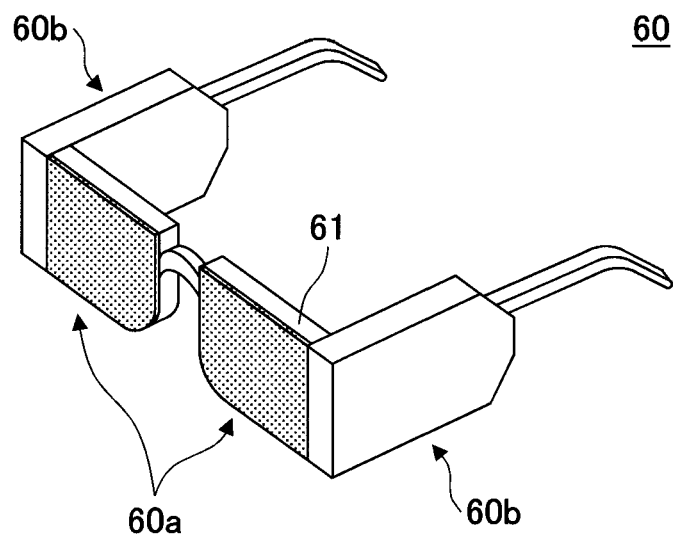
[Fig. 13]
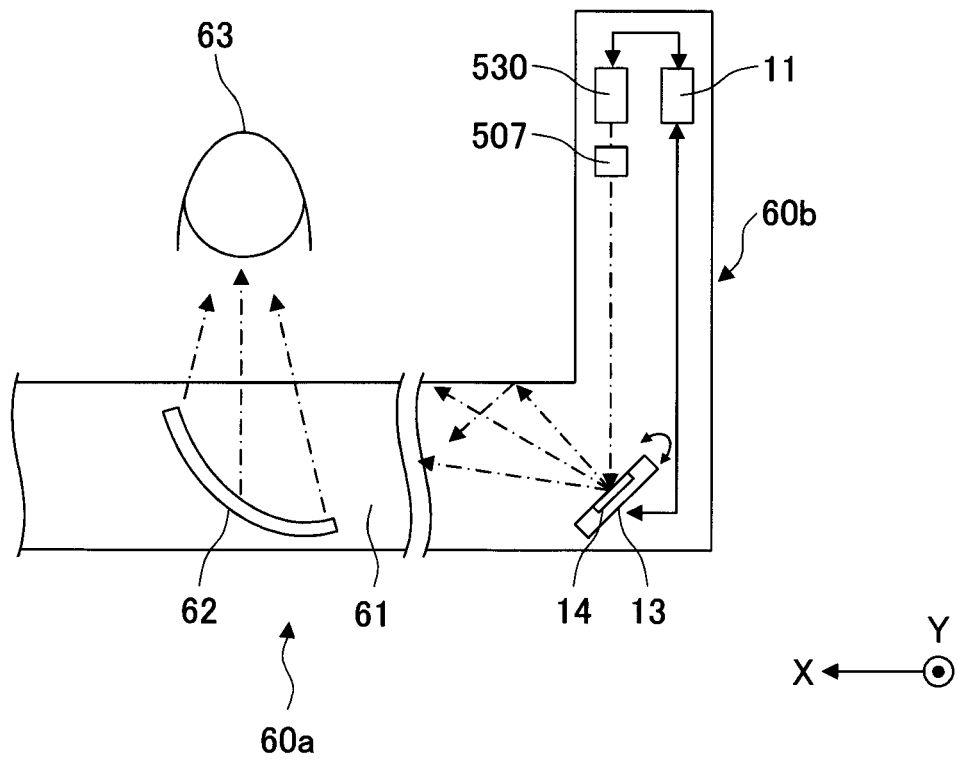

[Fig. 14]
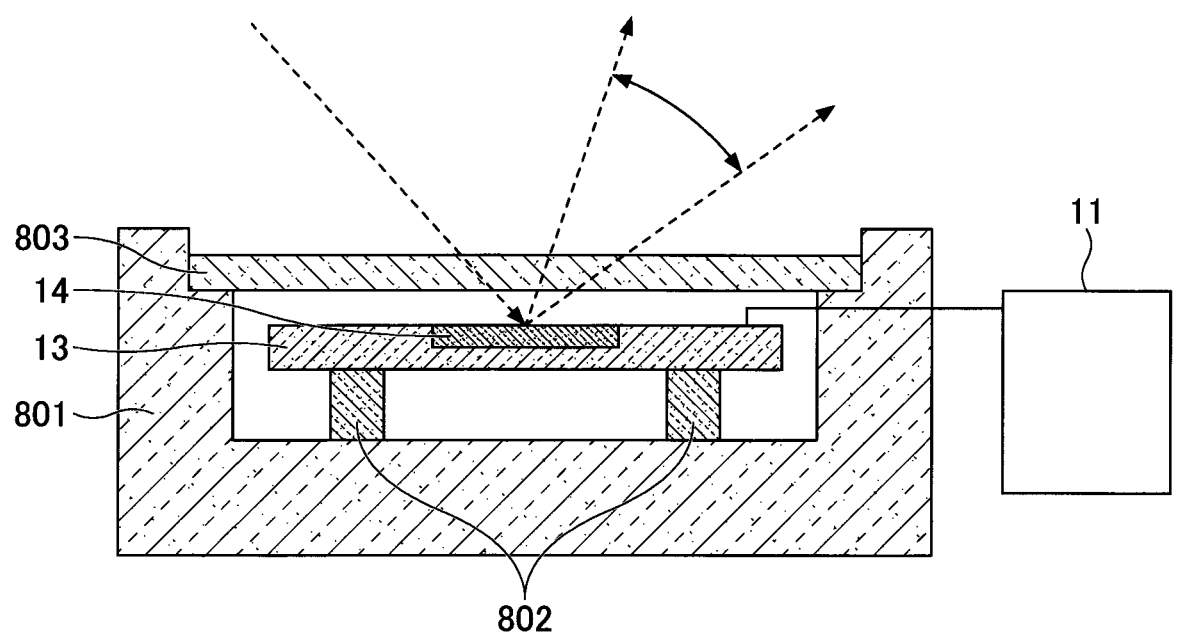

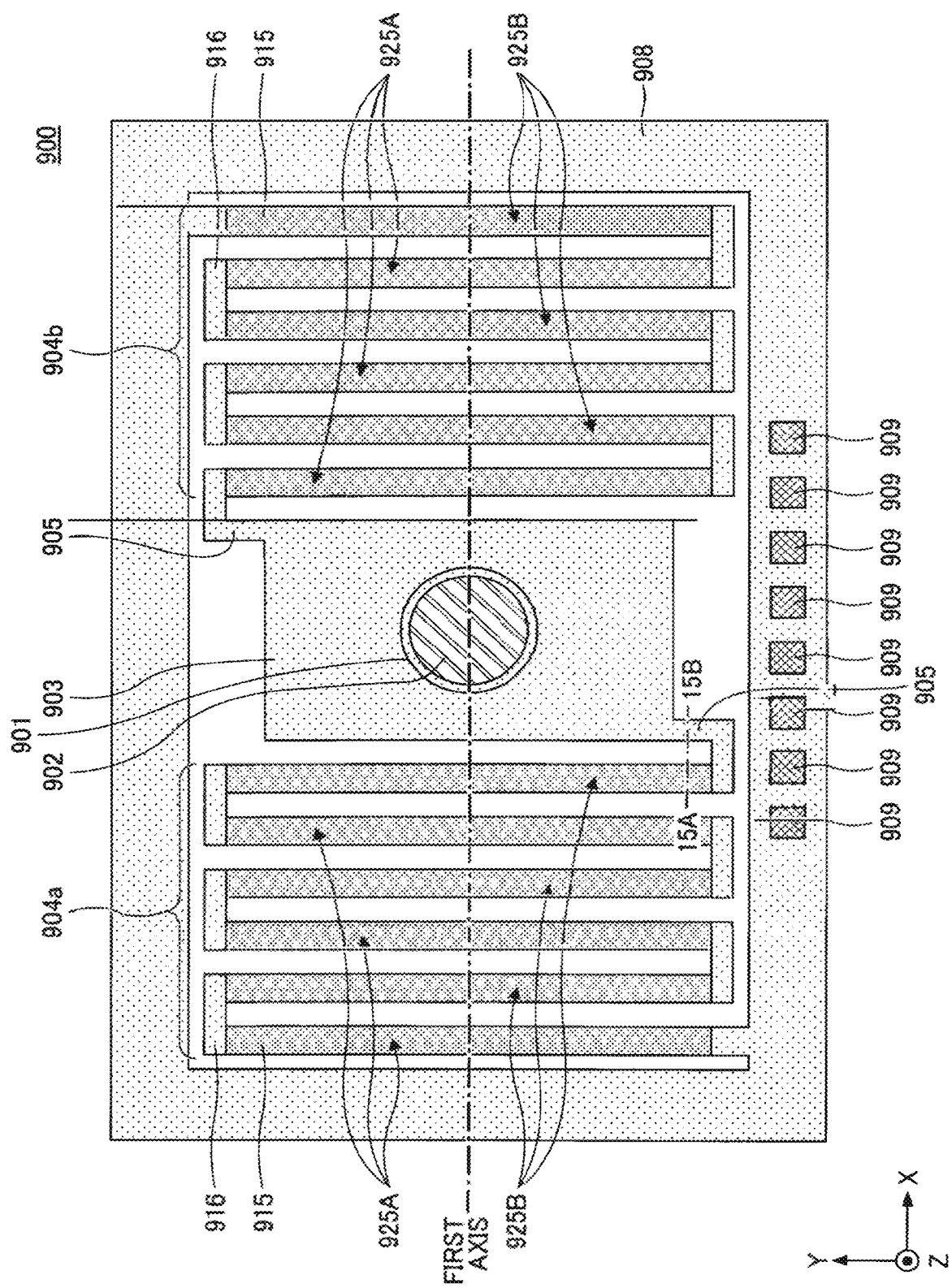
[Fig. 15]

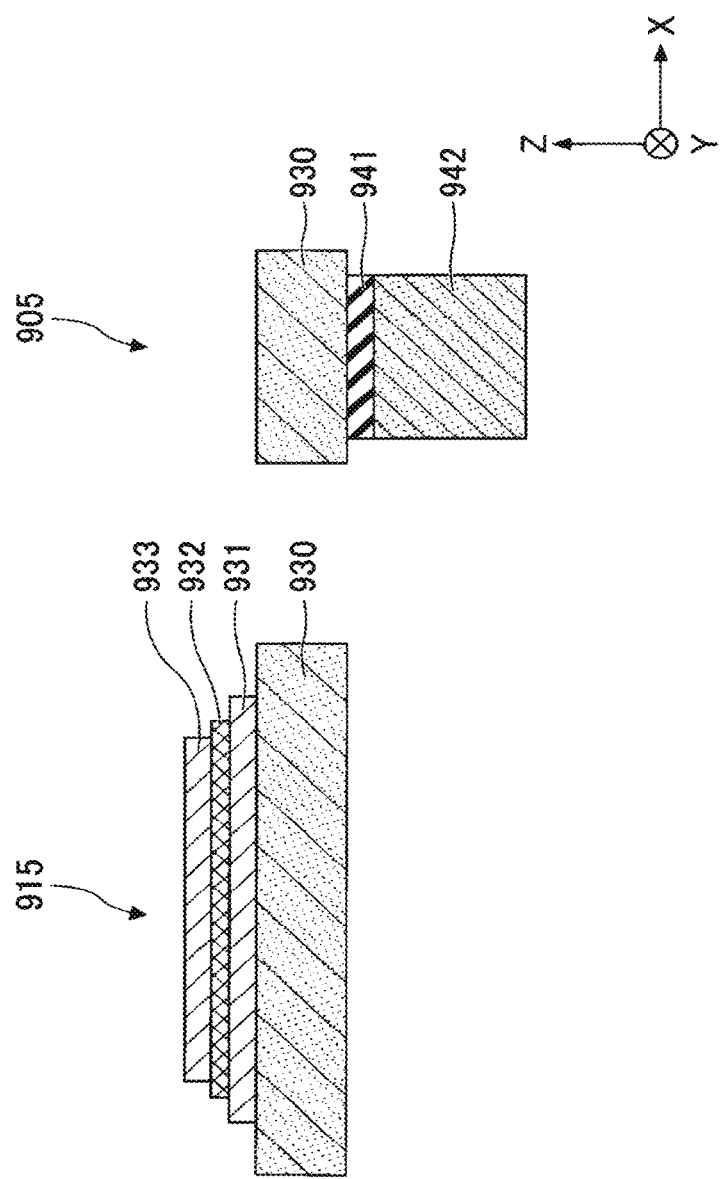
[Fig. 16]

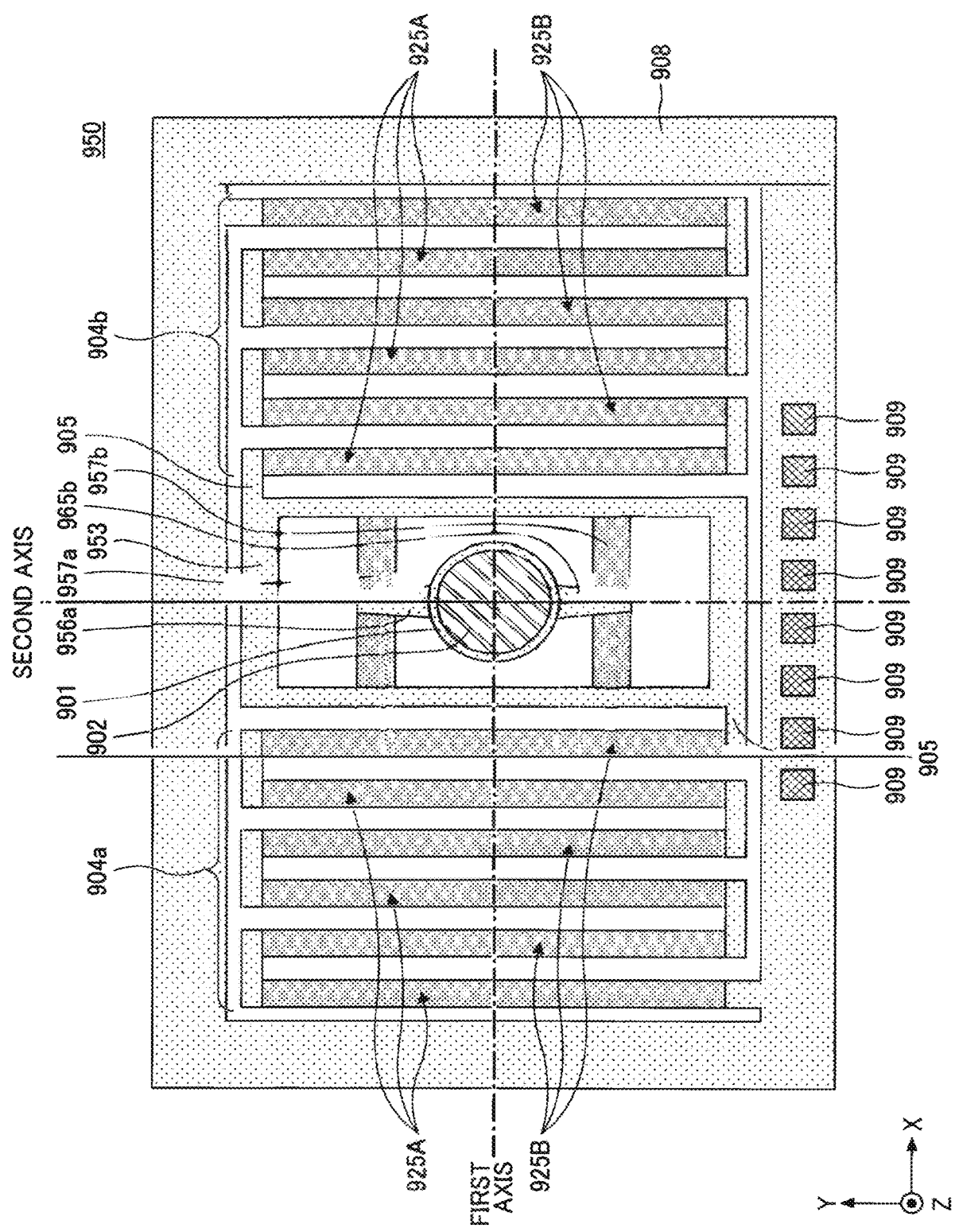
[Fig. 17]

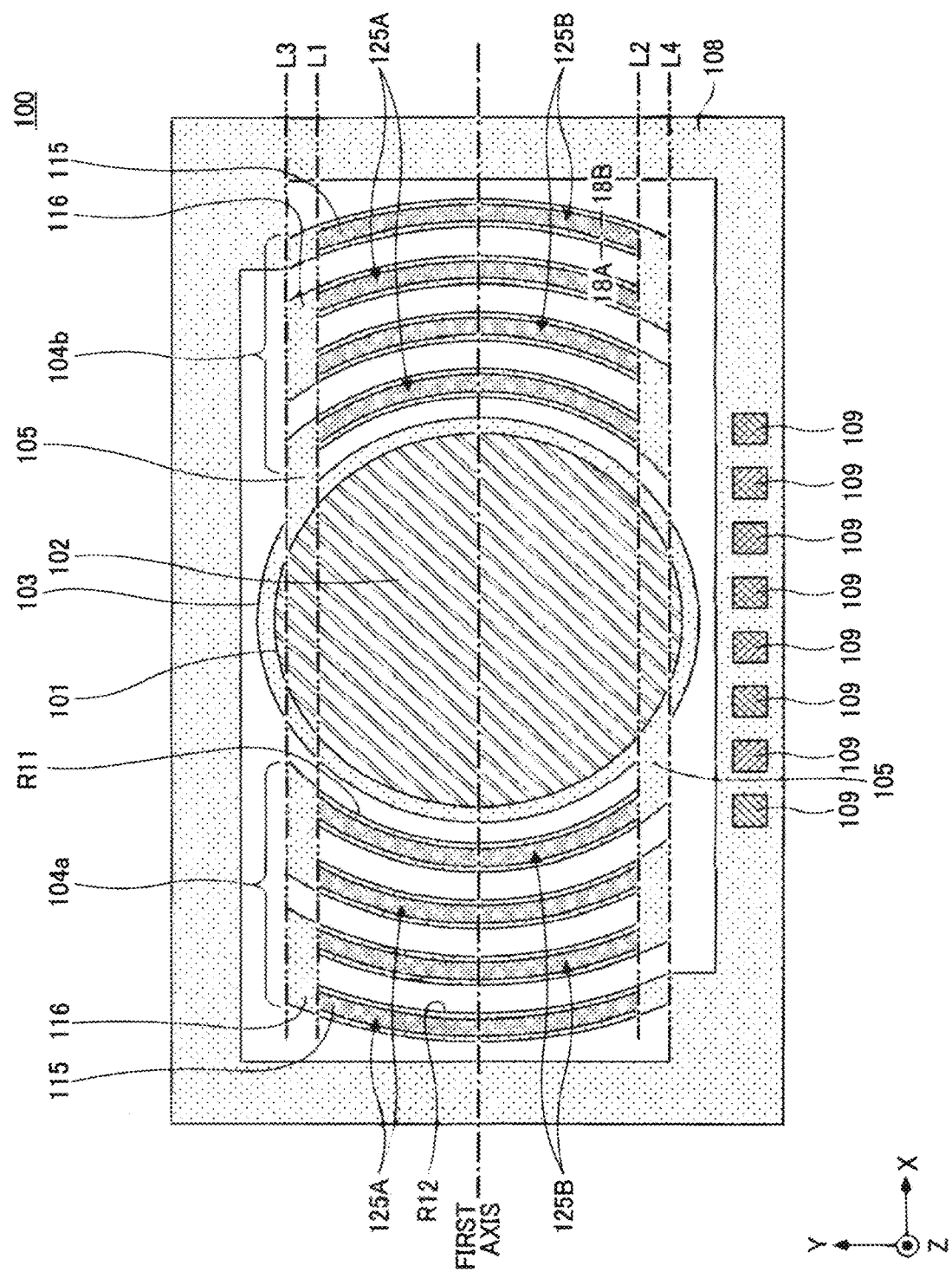
[Fig.18]

[Fig. 19]
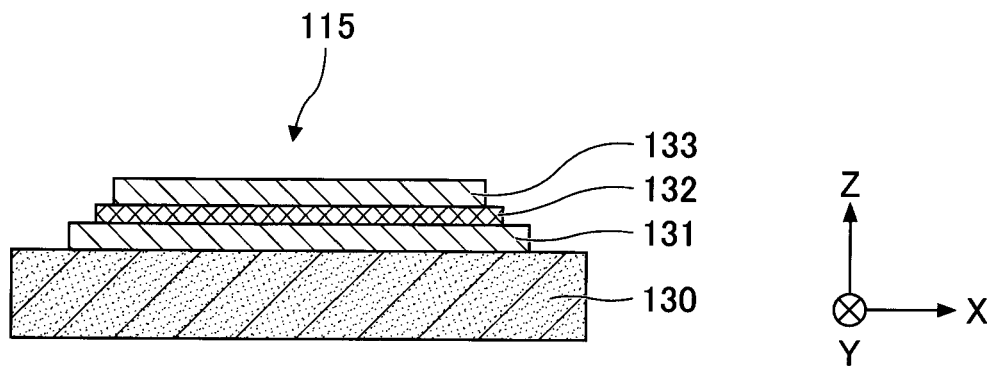
[Fig. 20]
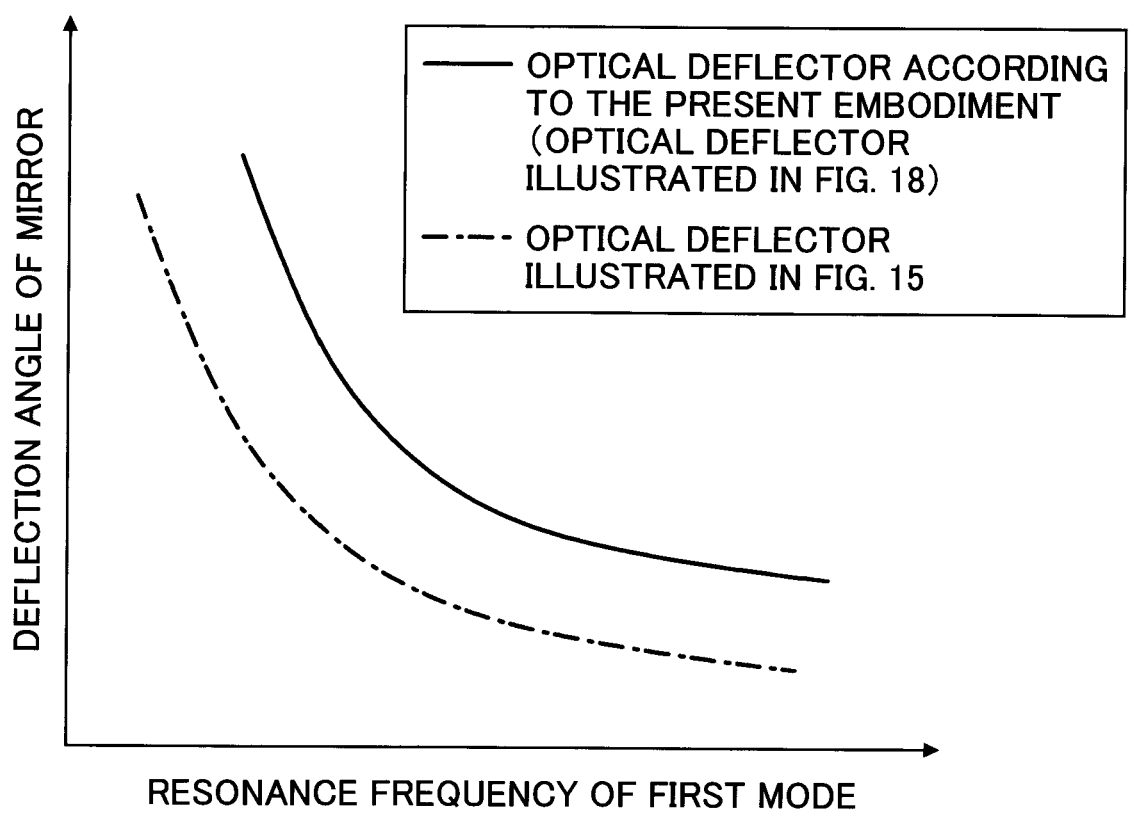

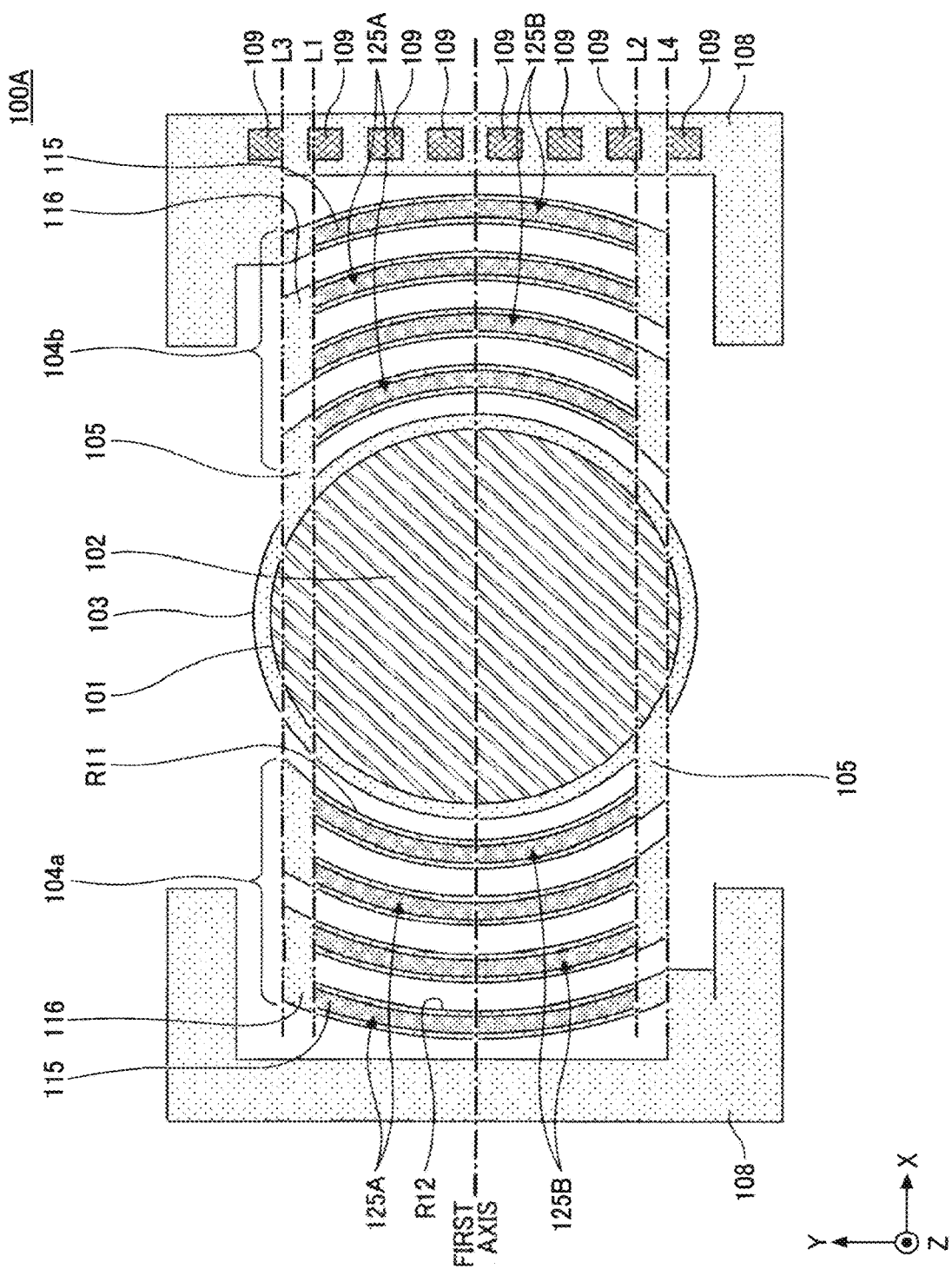
[Fig. 21]

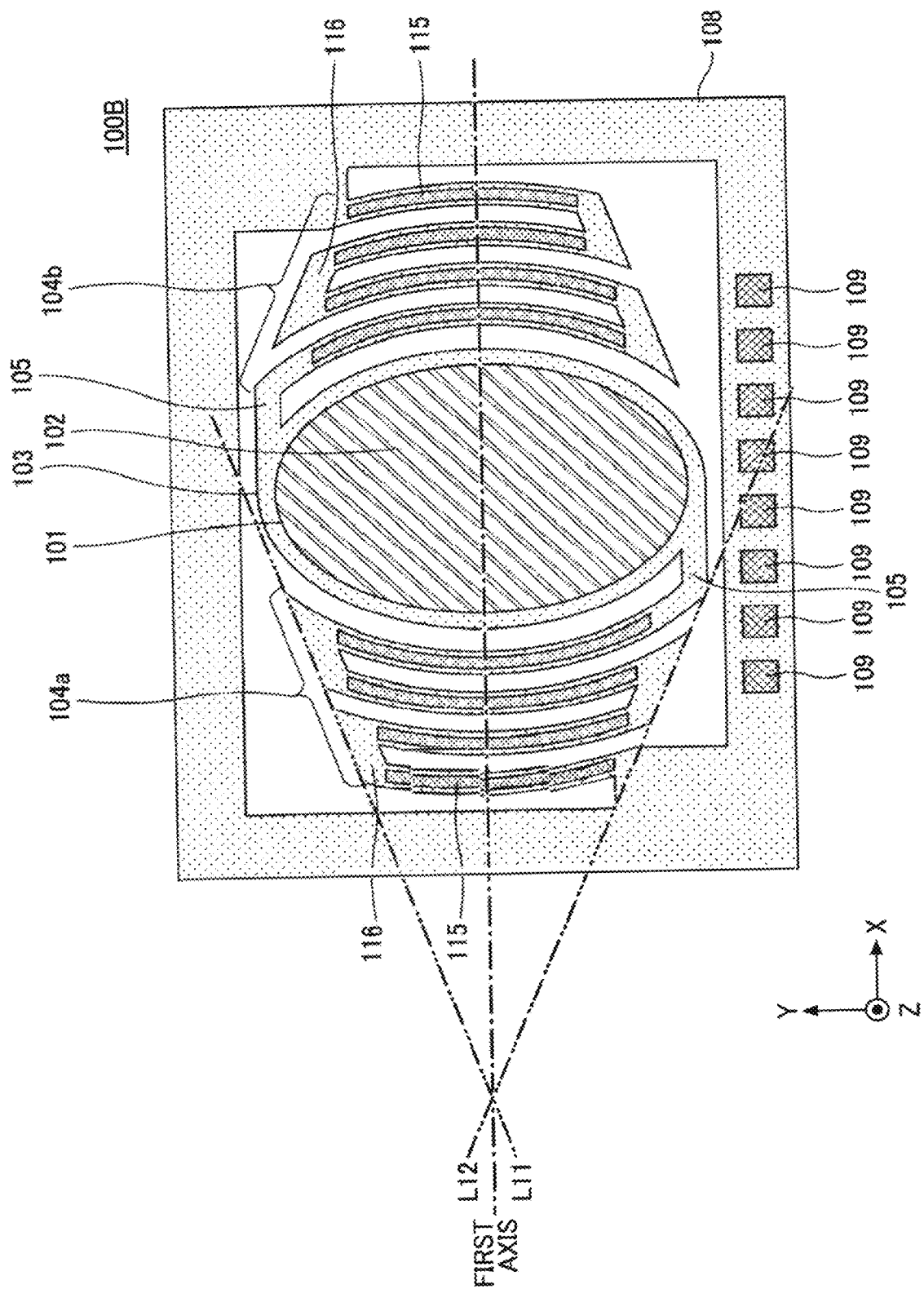
[Fig. 22]

[Fig. 23]
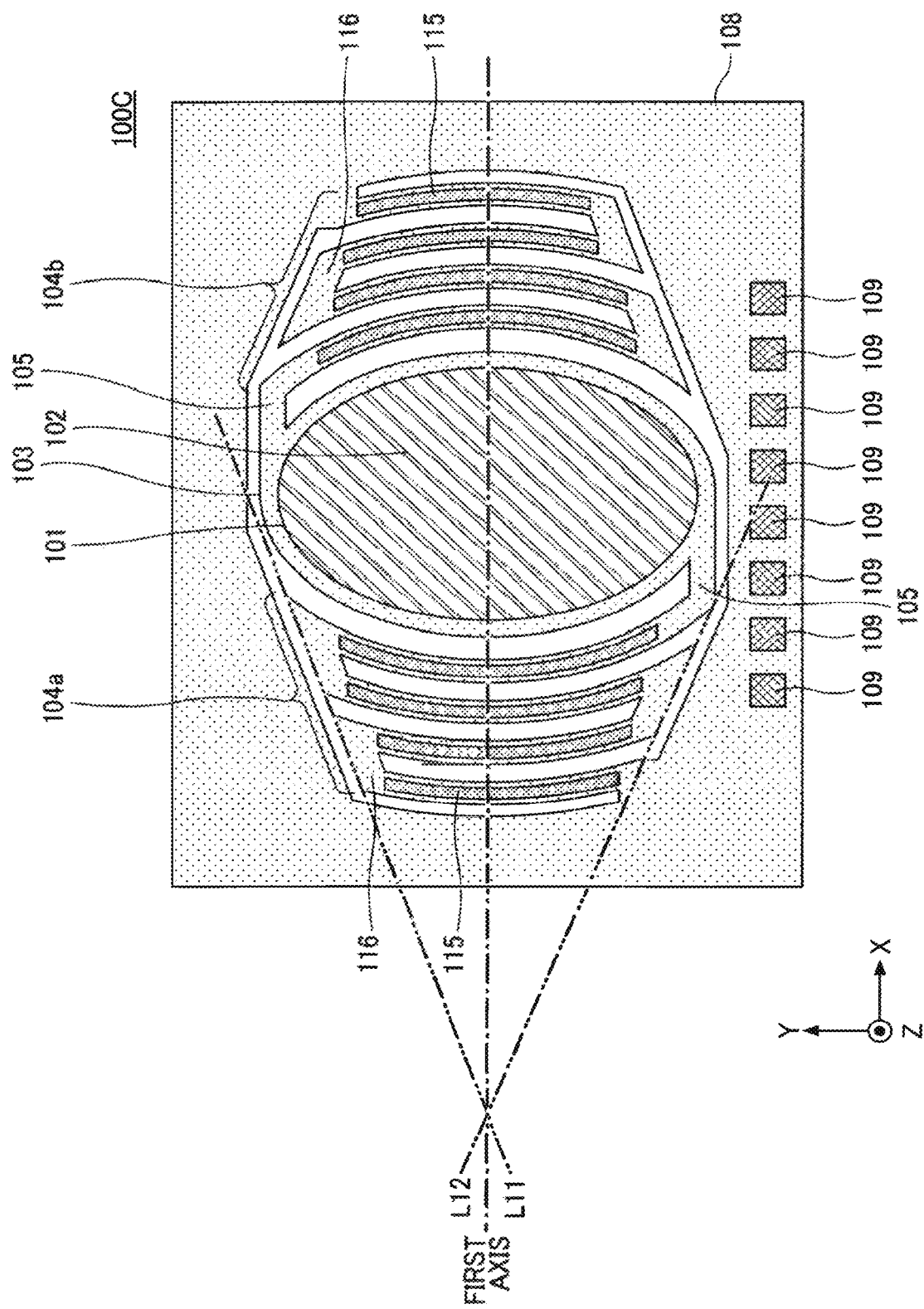

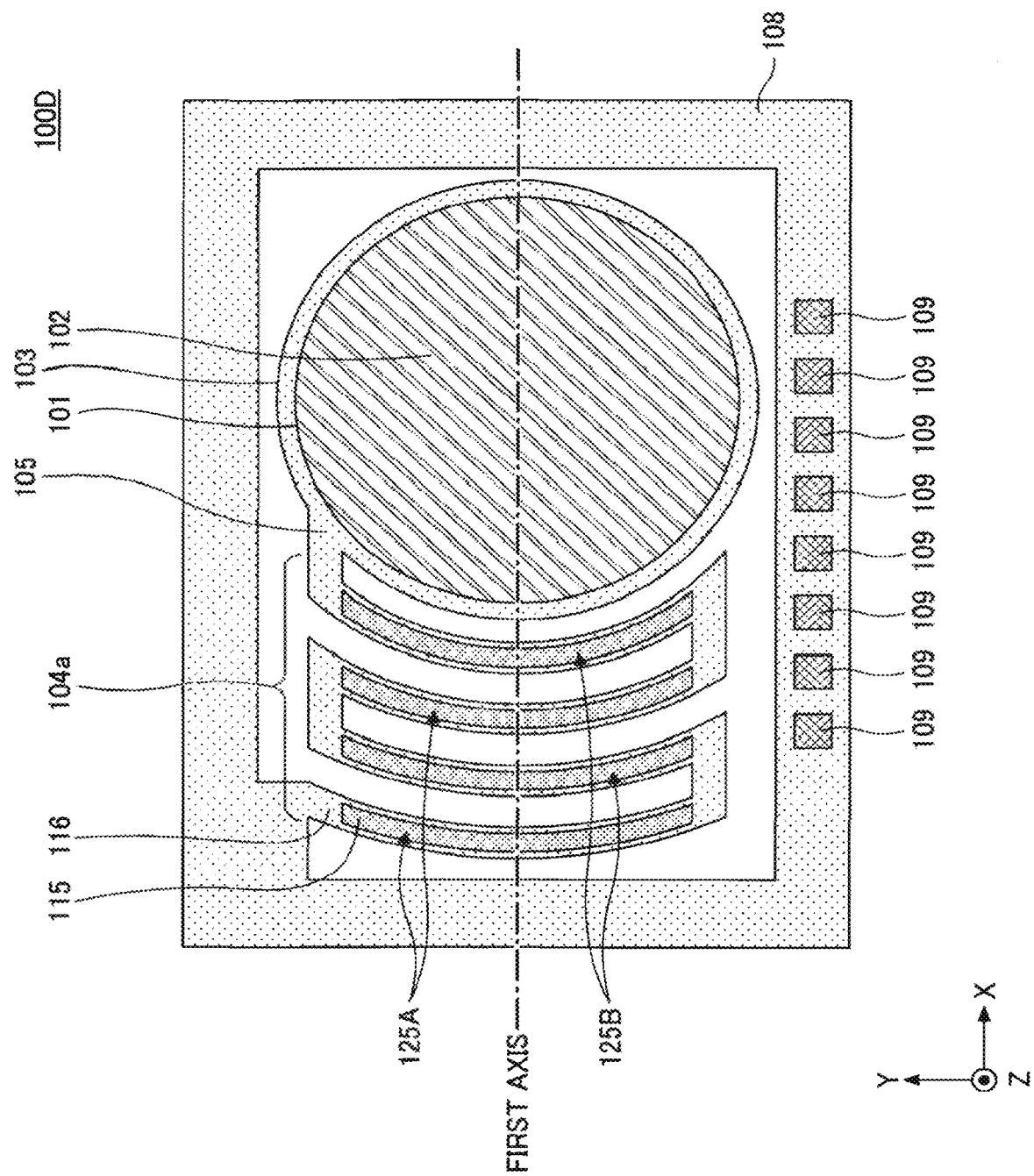
[Fig. 24]

[Fig. 25]
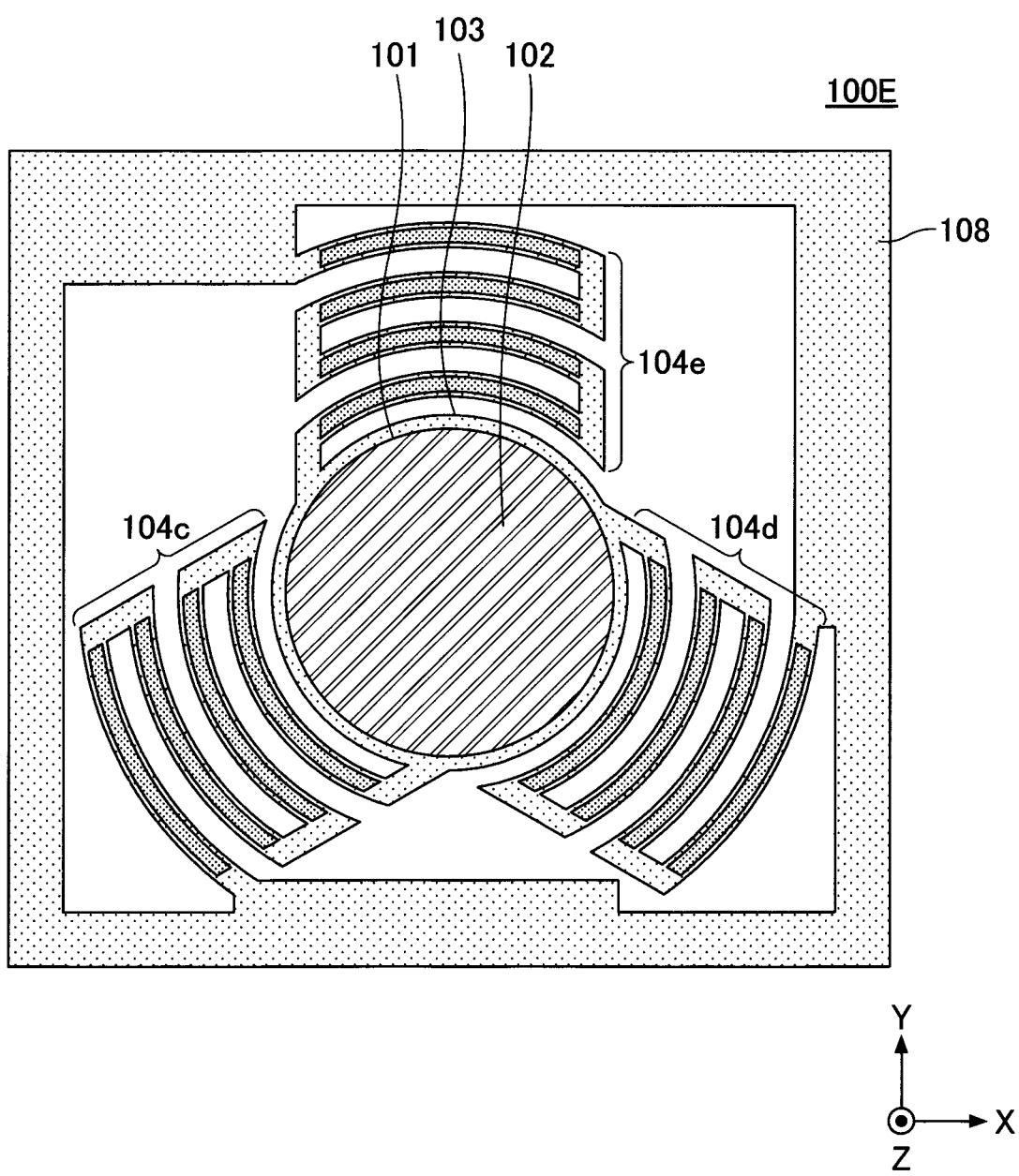

[Fig. 26]
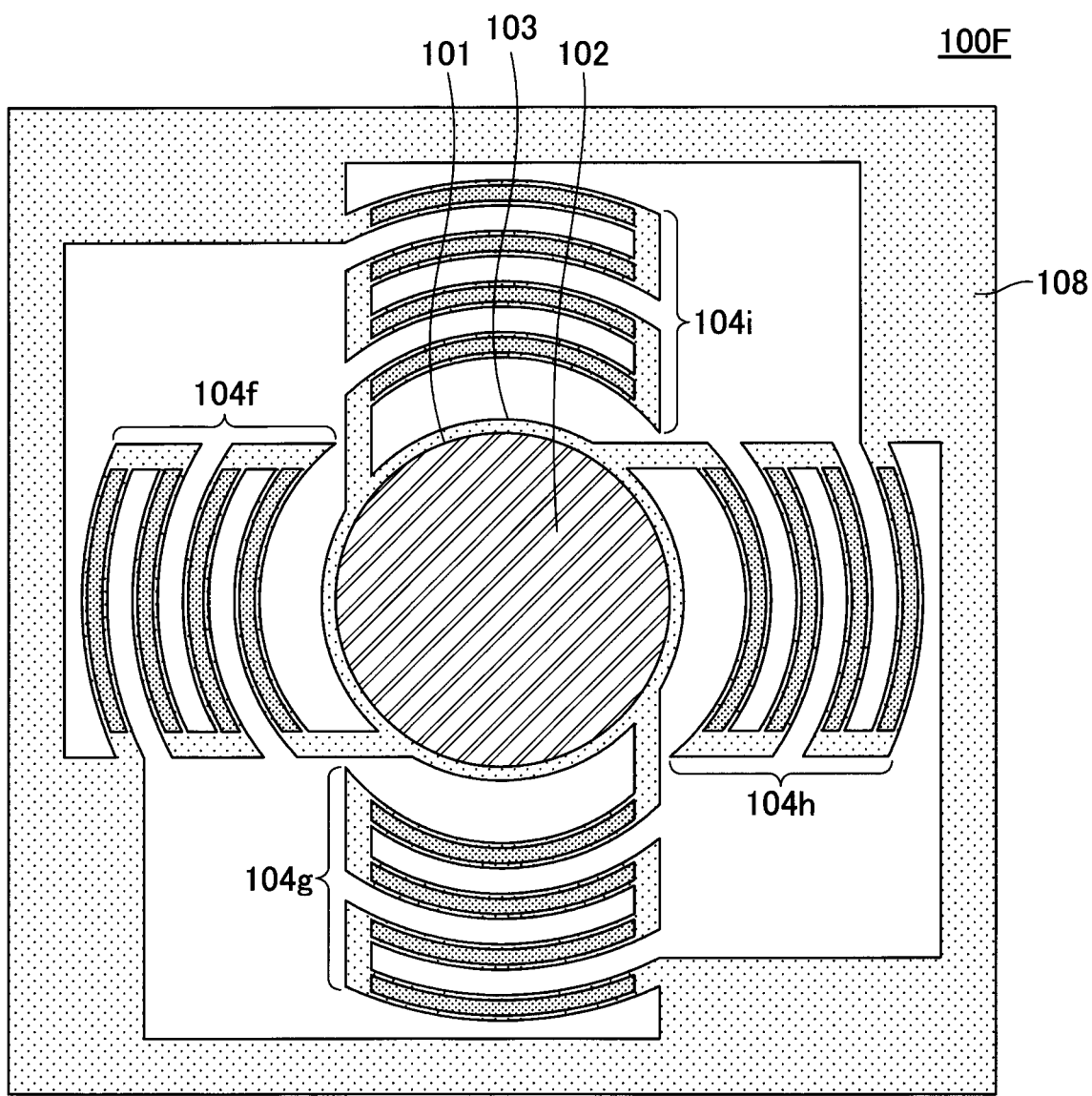

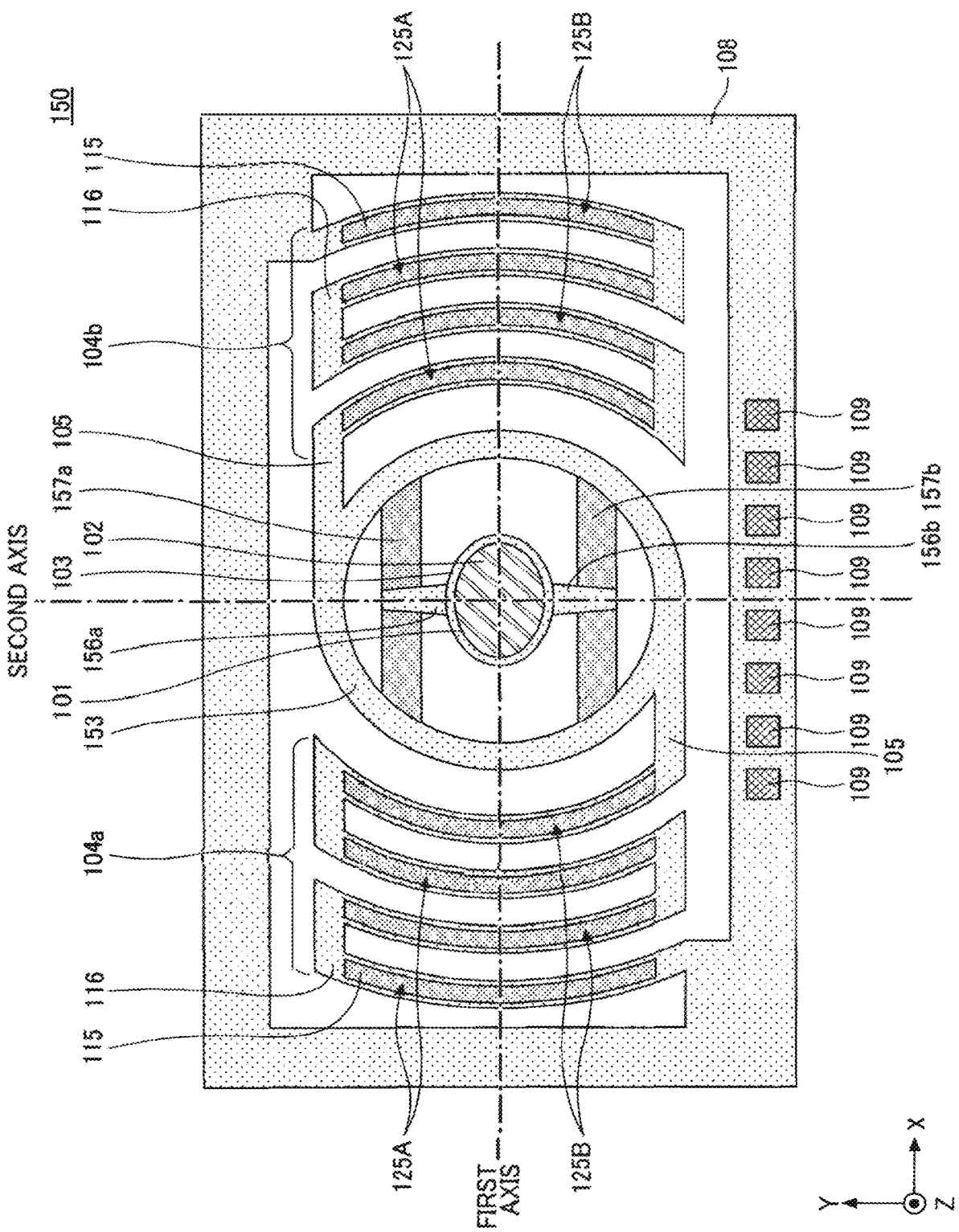

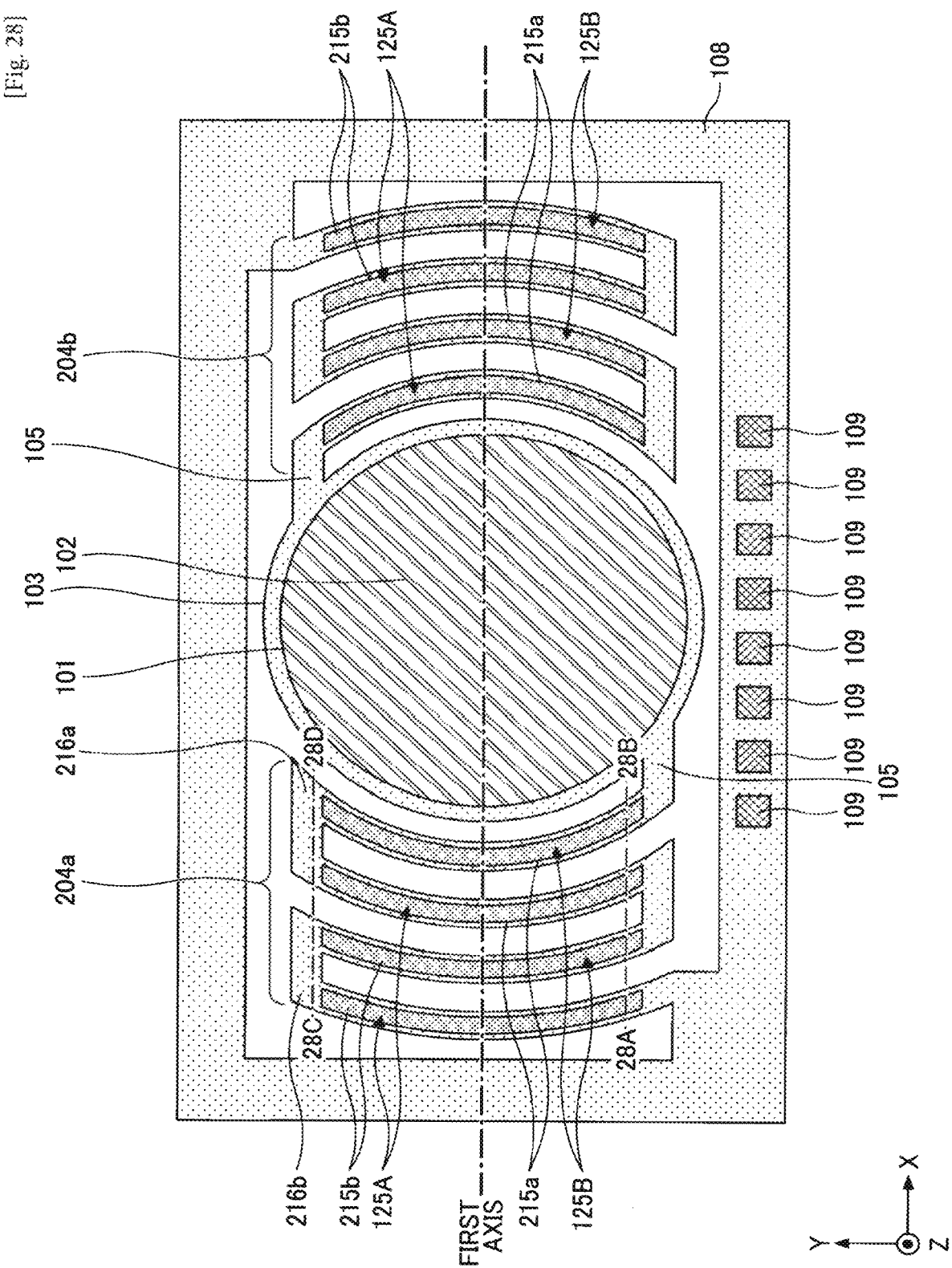

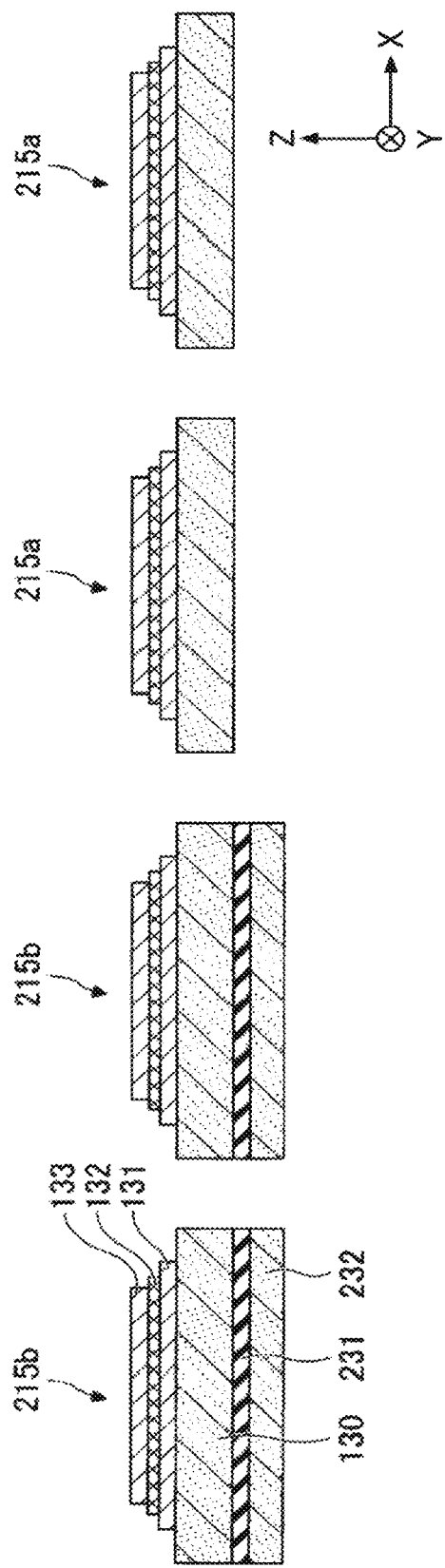

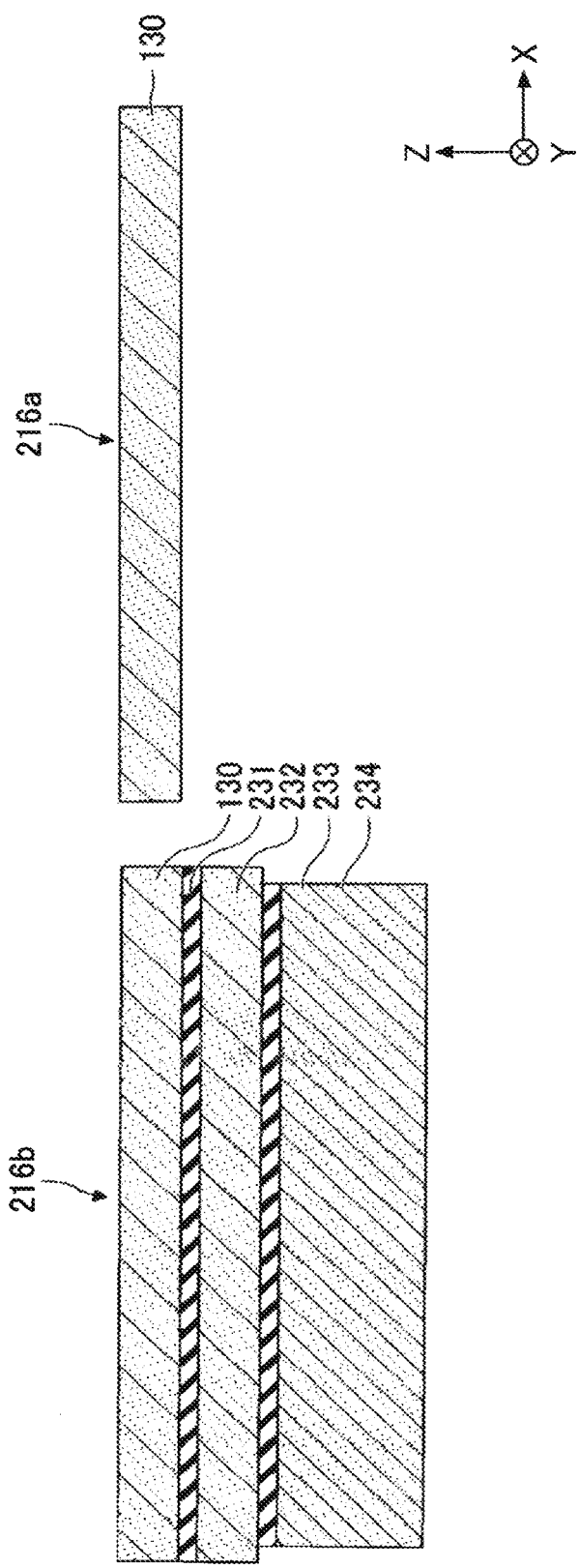
[Fig. 30]

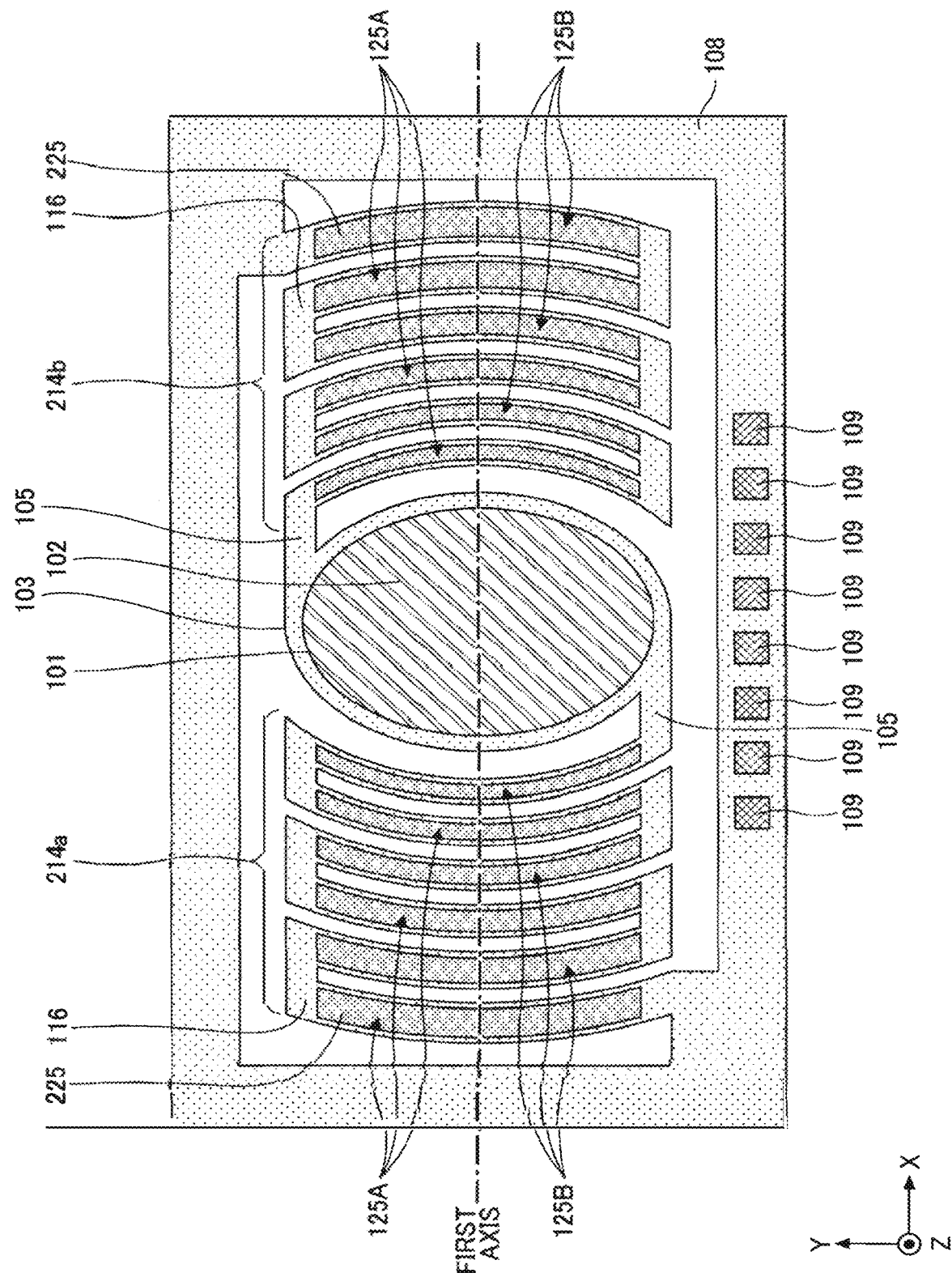
[Fig. 31]

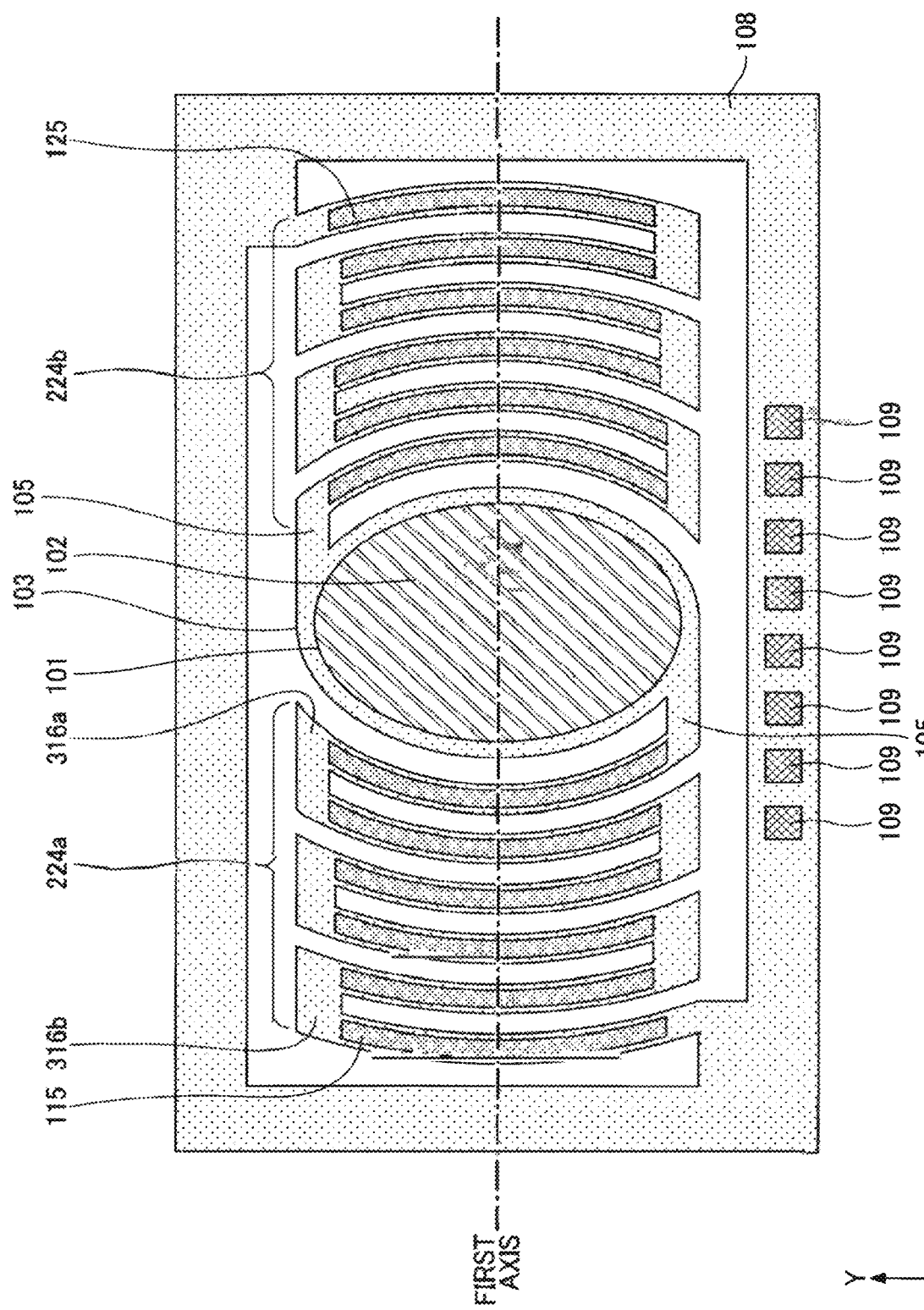
[Fig. 32]

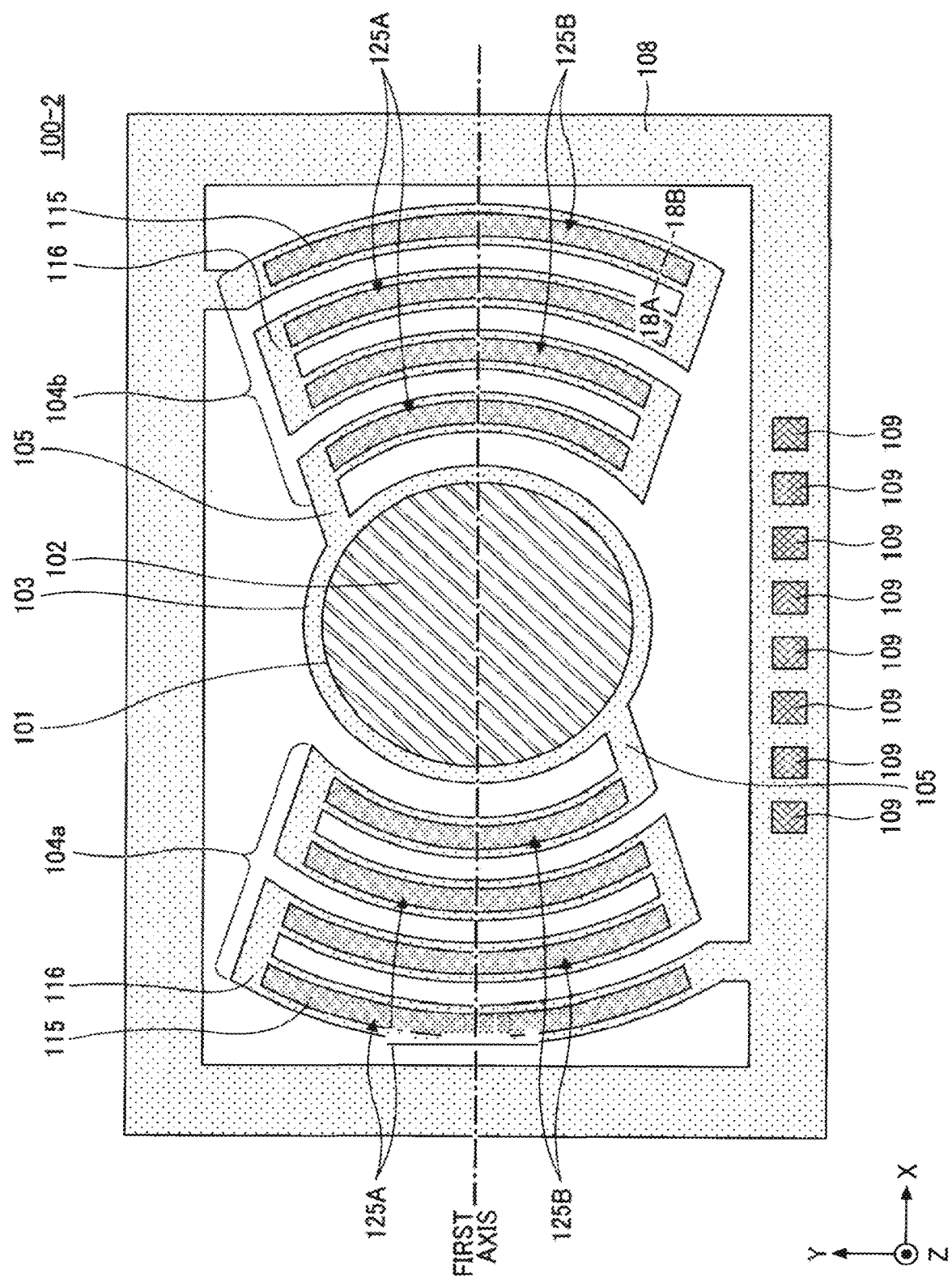
[Fig. 33]

[Fig. 34]
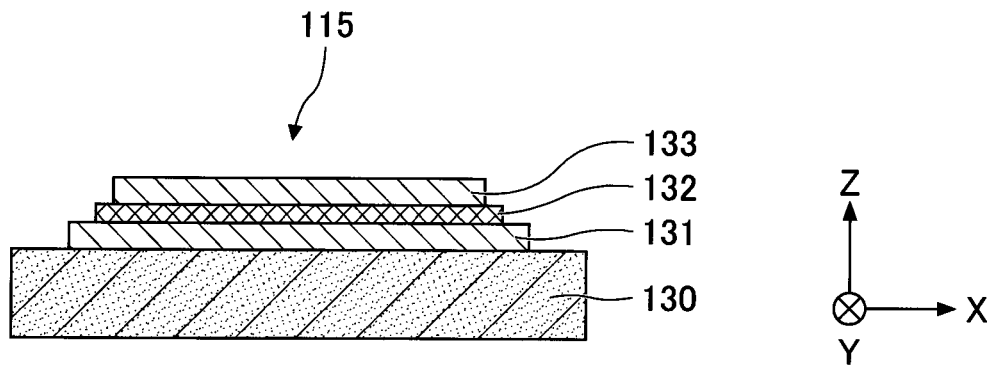
[Fig. 35]
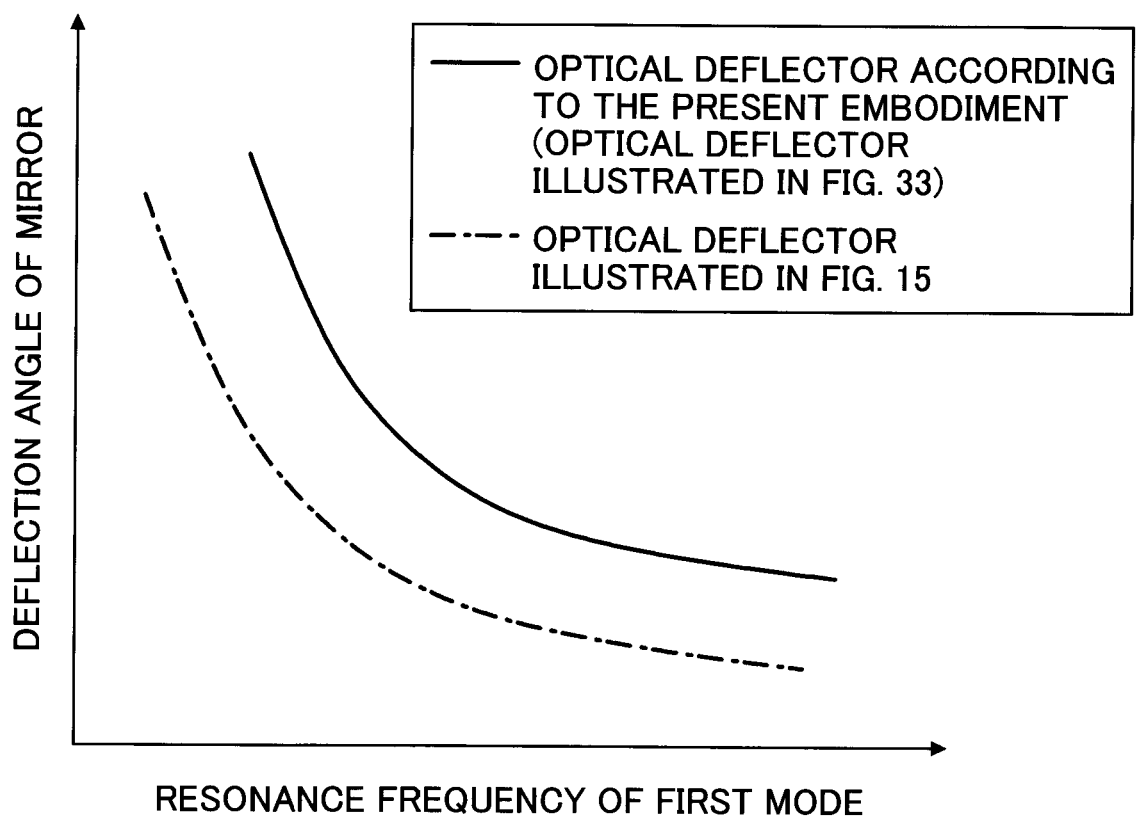

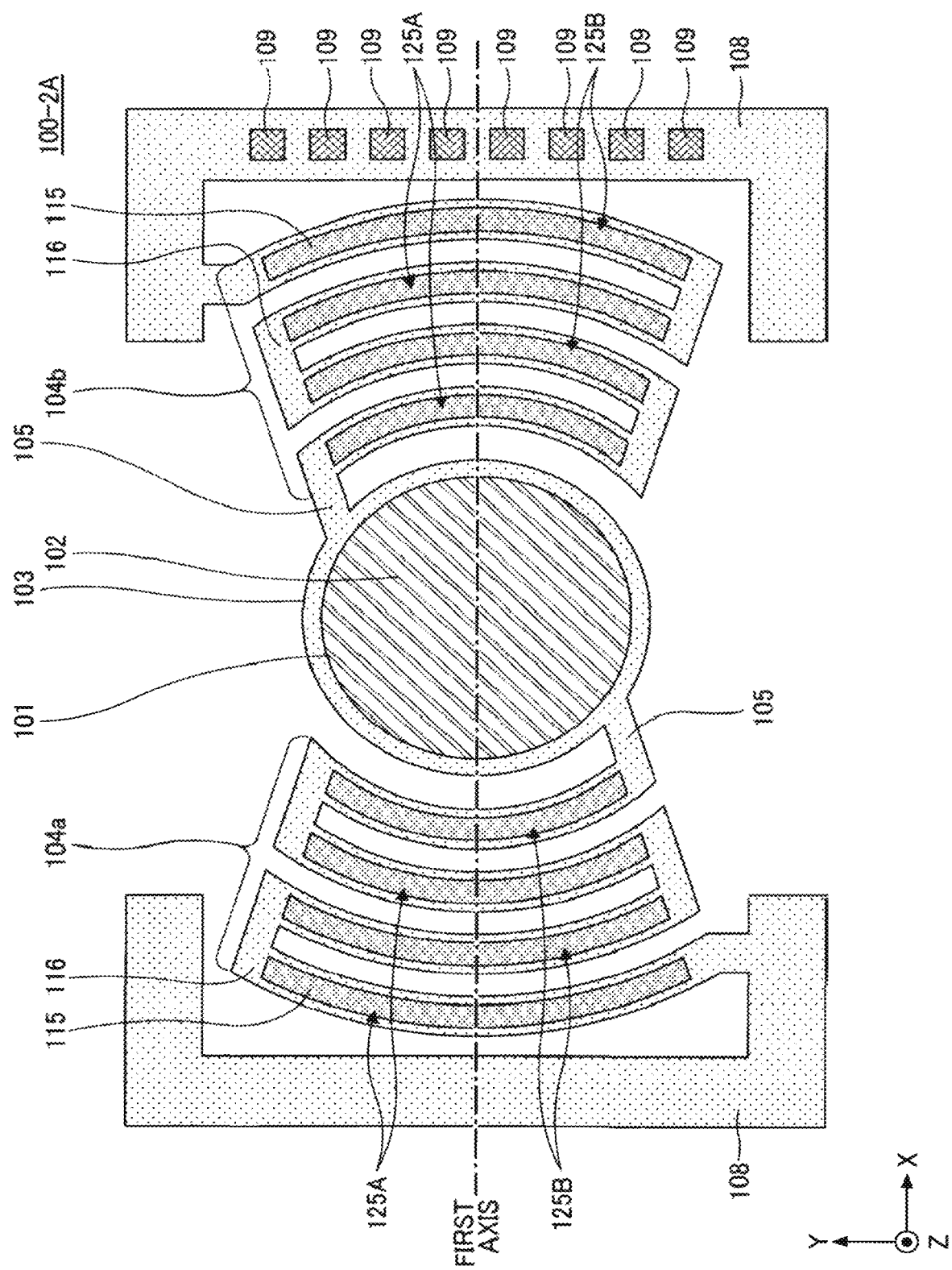
[Fig. 36]

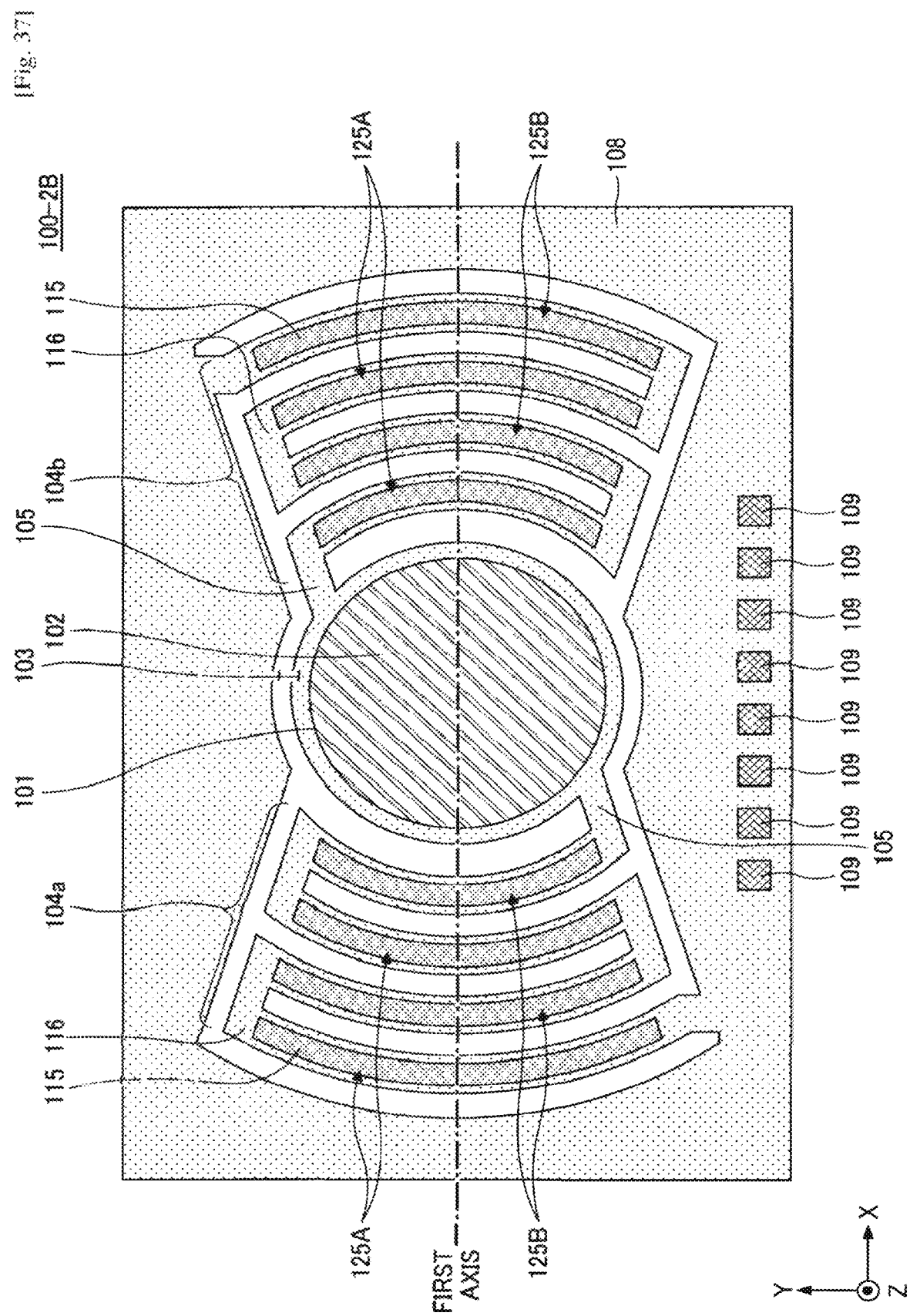
[Fig. 37]

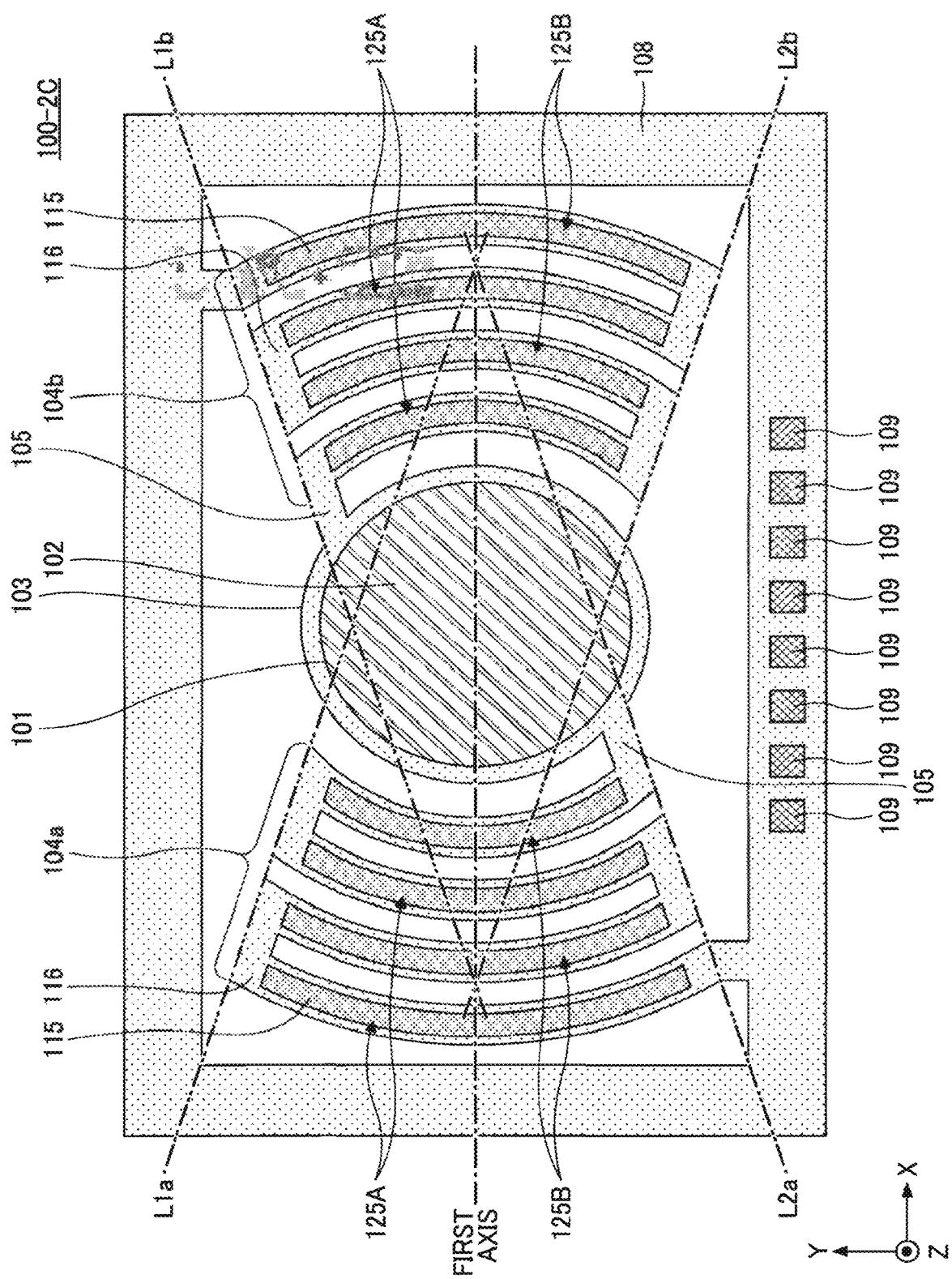
[Fig. 38]

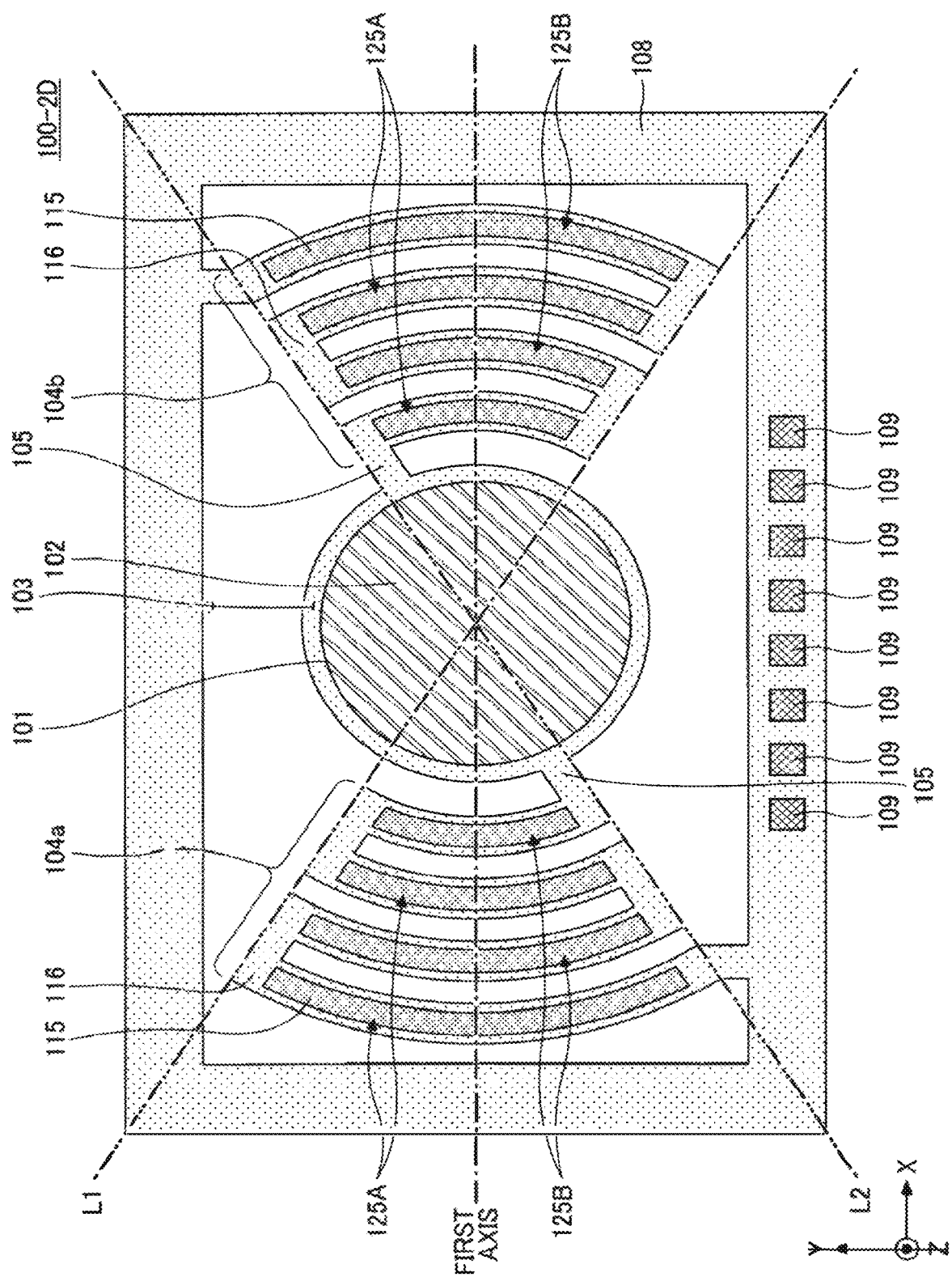

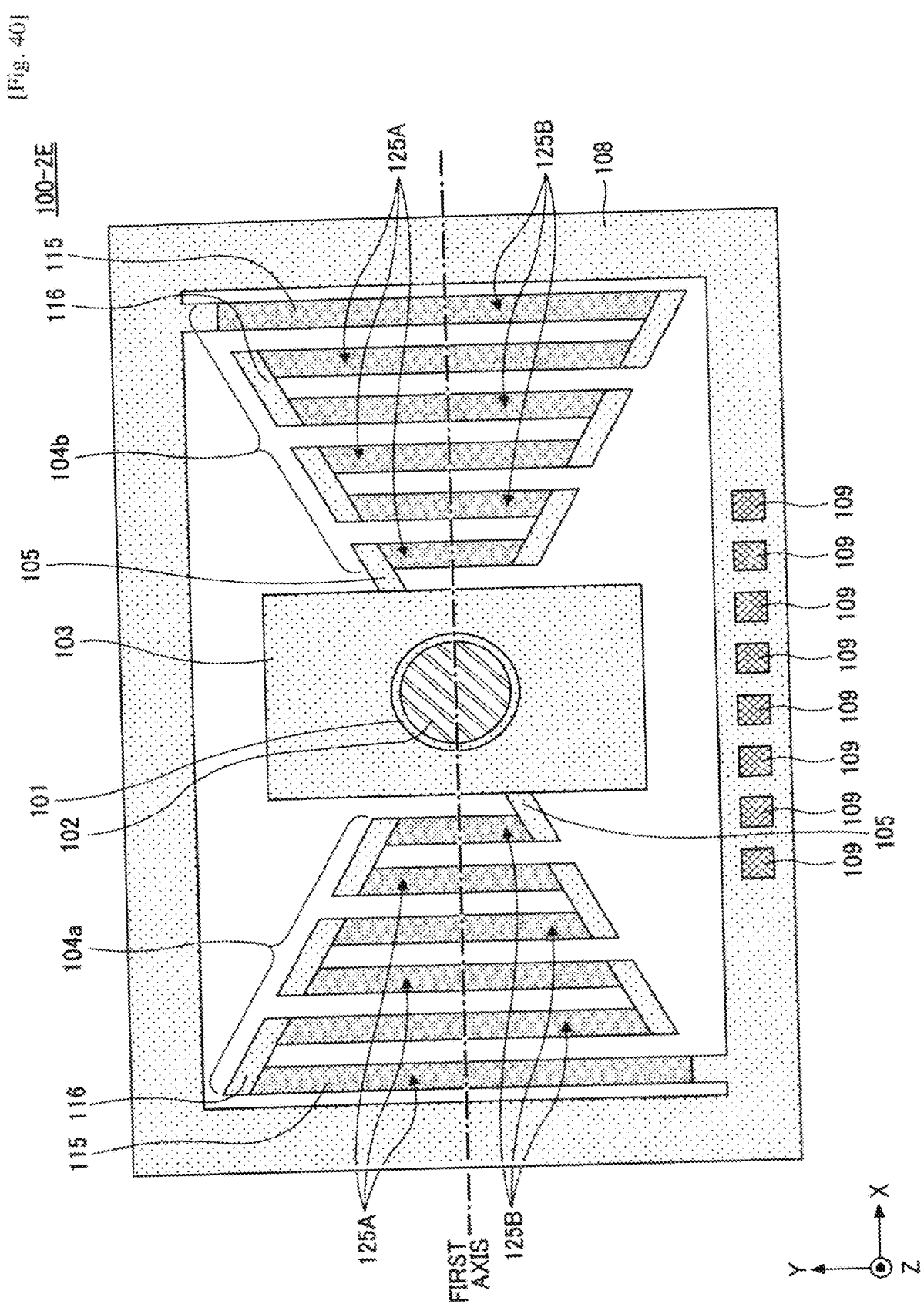

[Fig. 41]
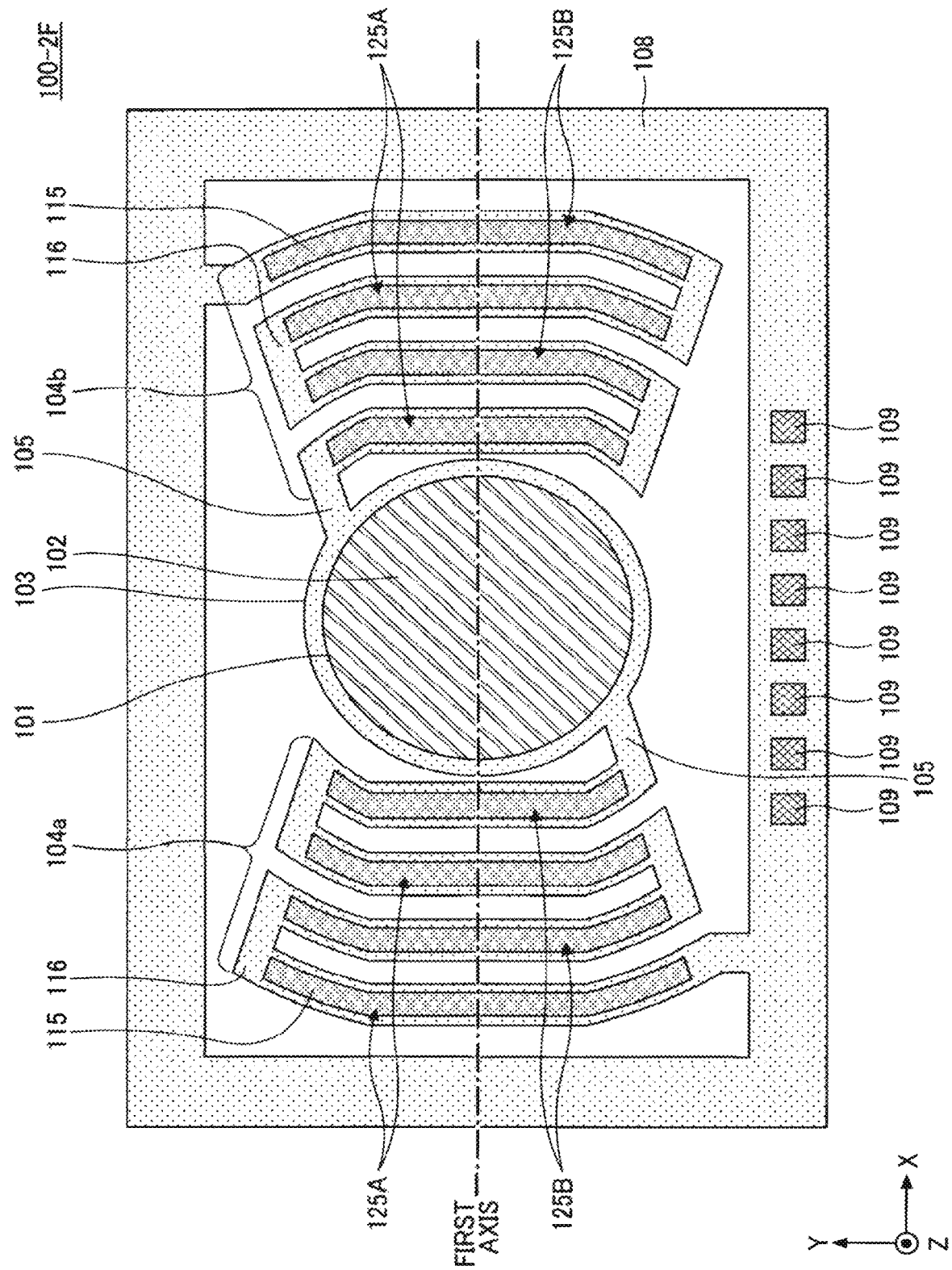

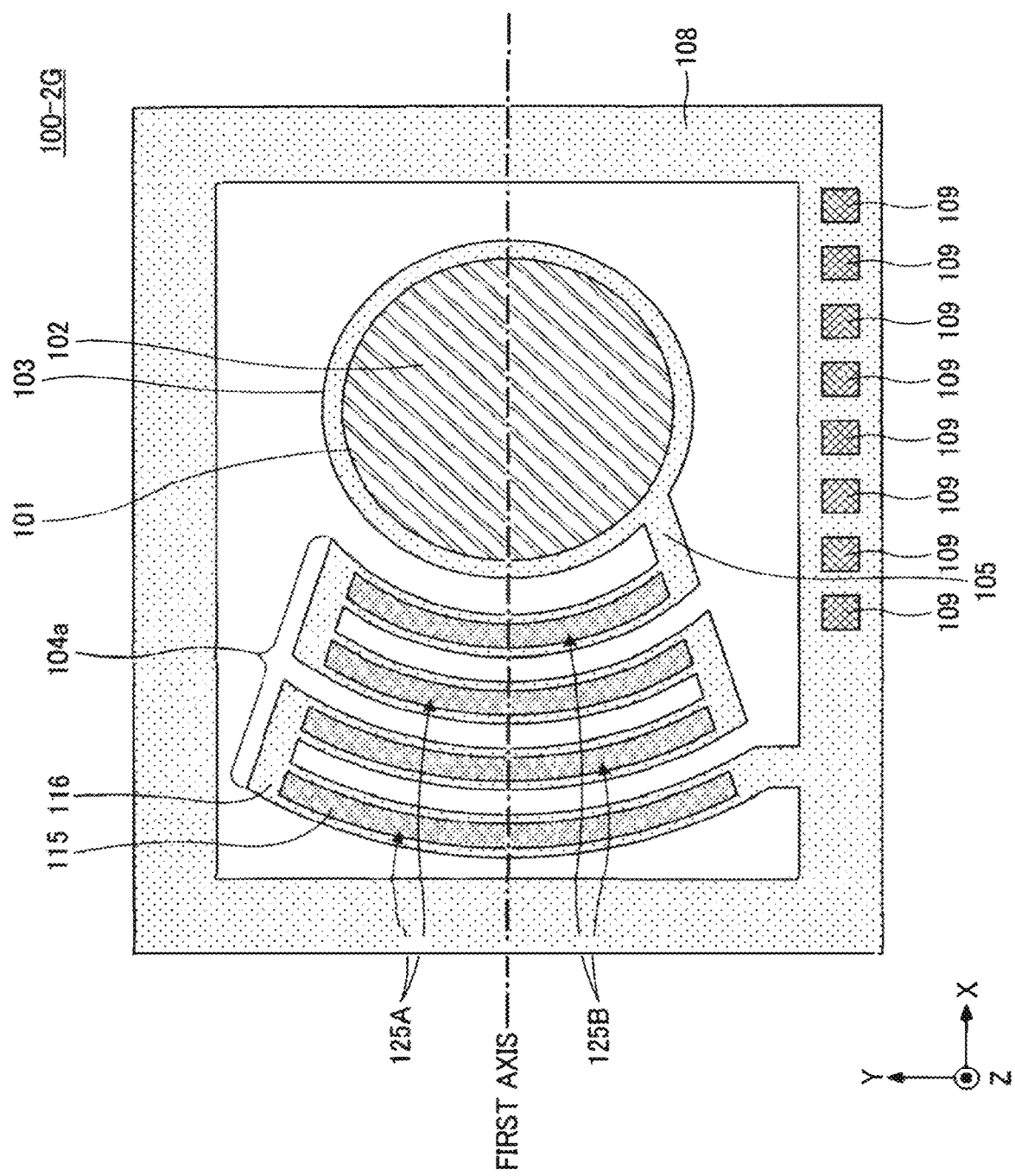
[Fig. 42]

[Fig. 43]
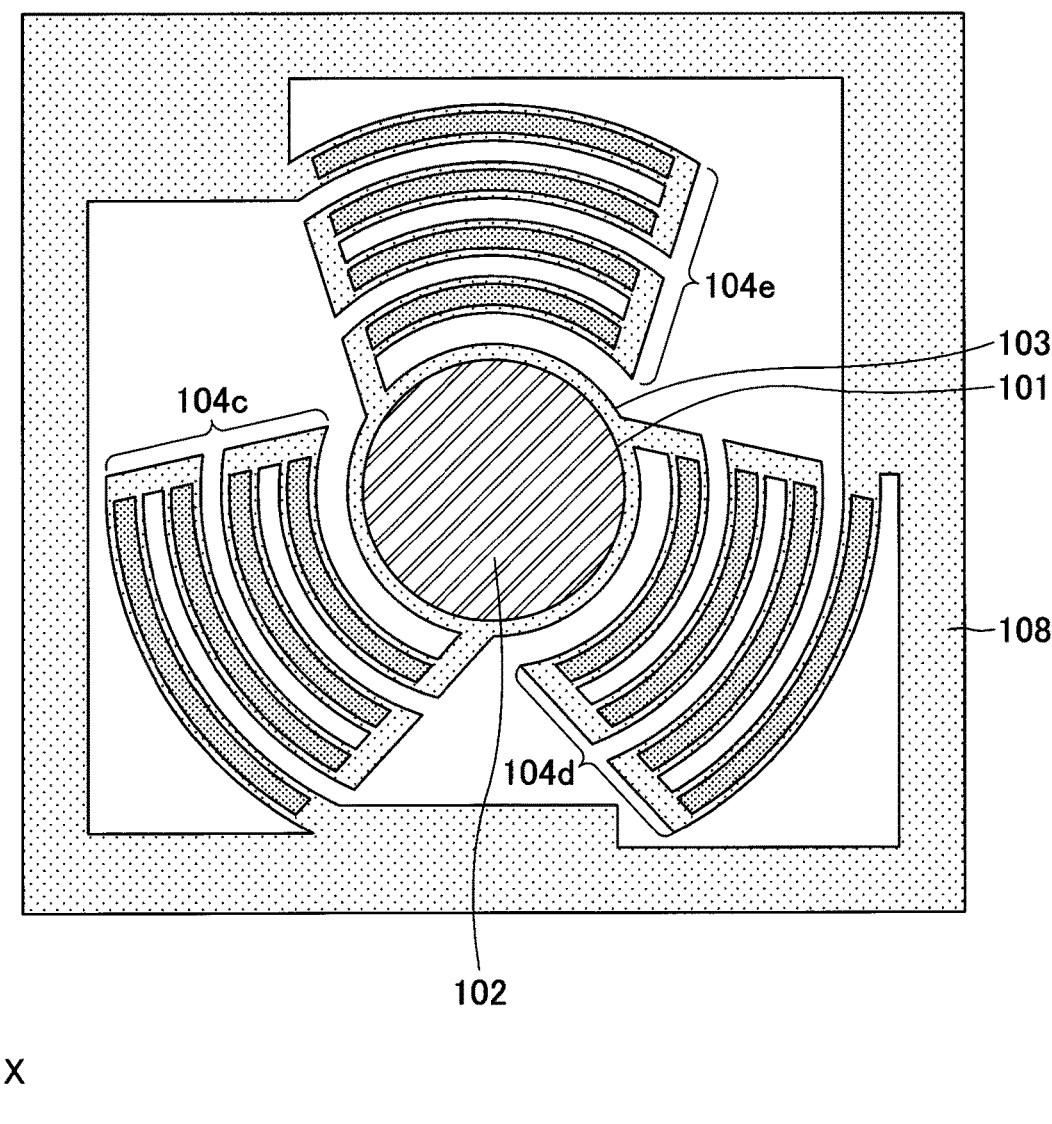

[Fig. 44]
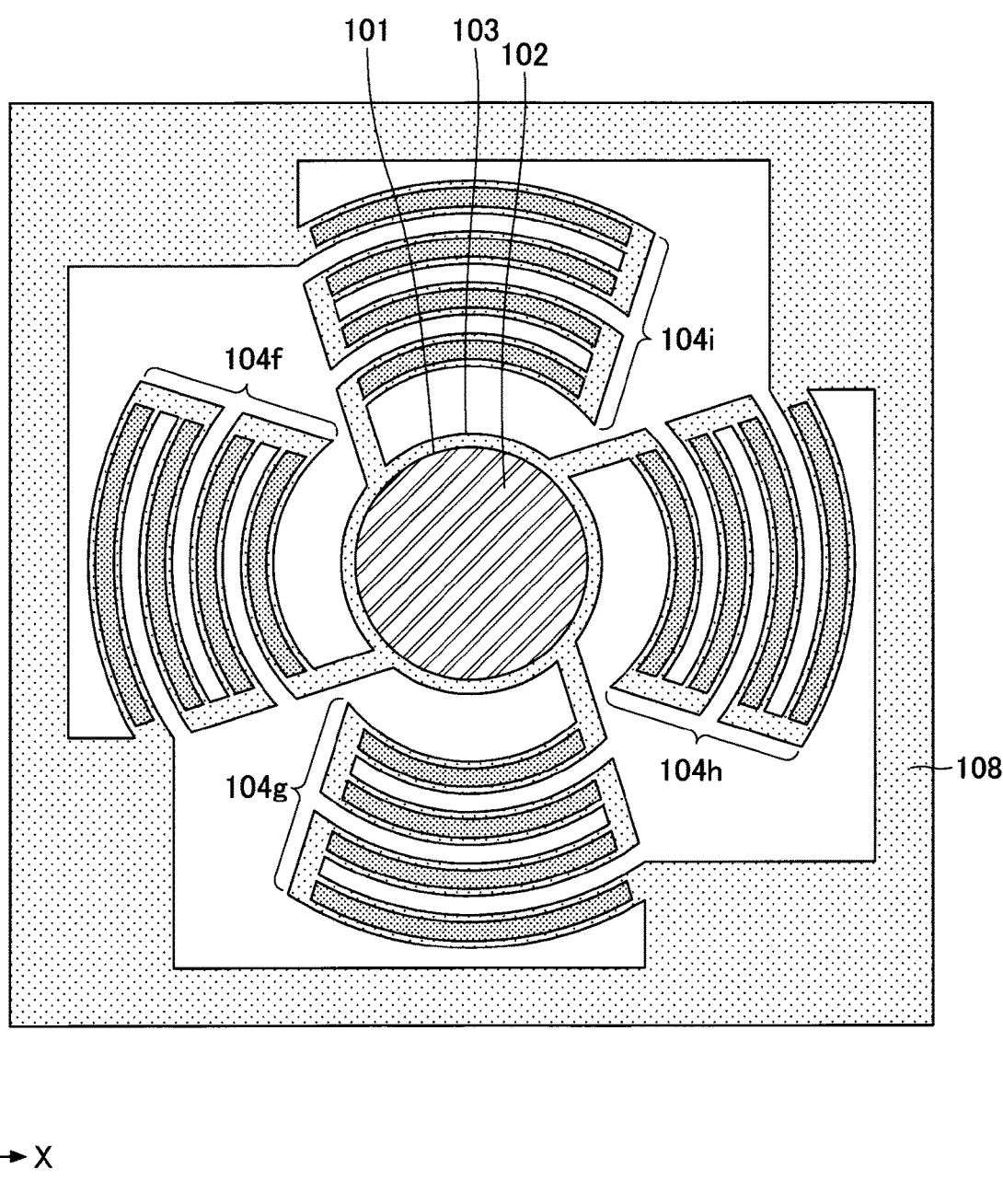

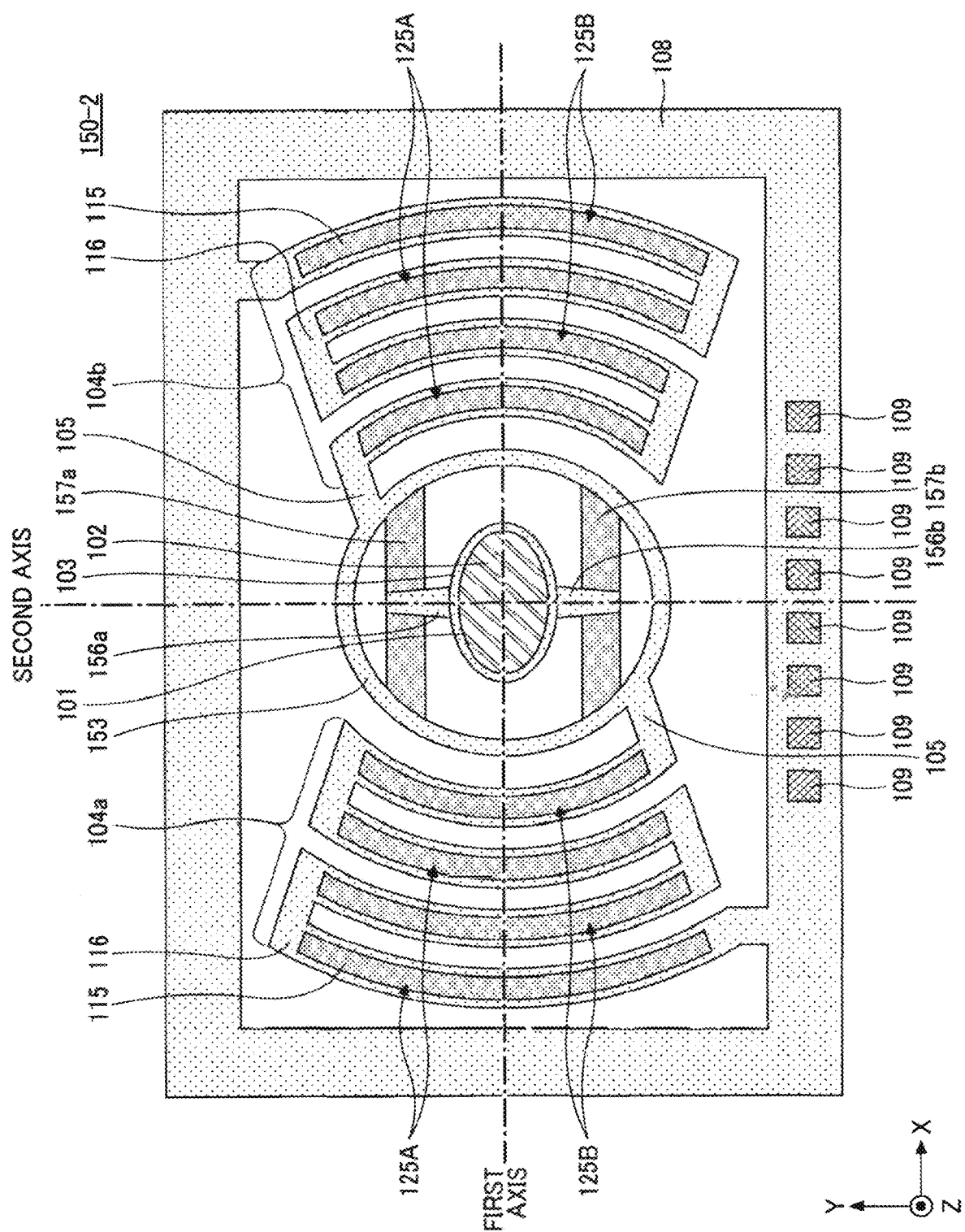
[Fig. 45]

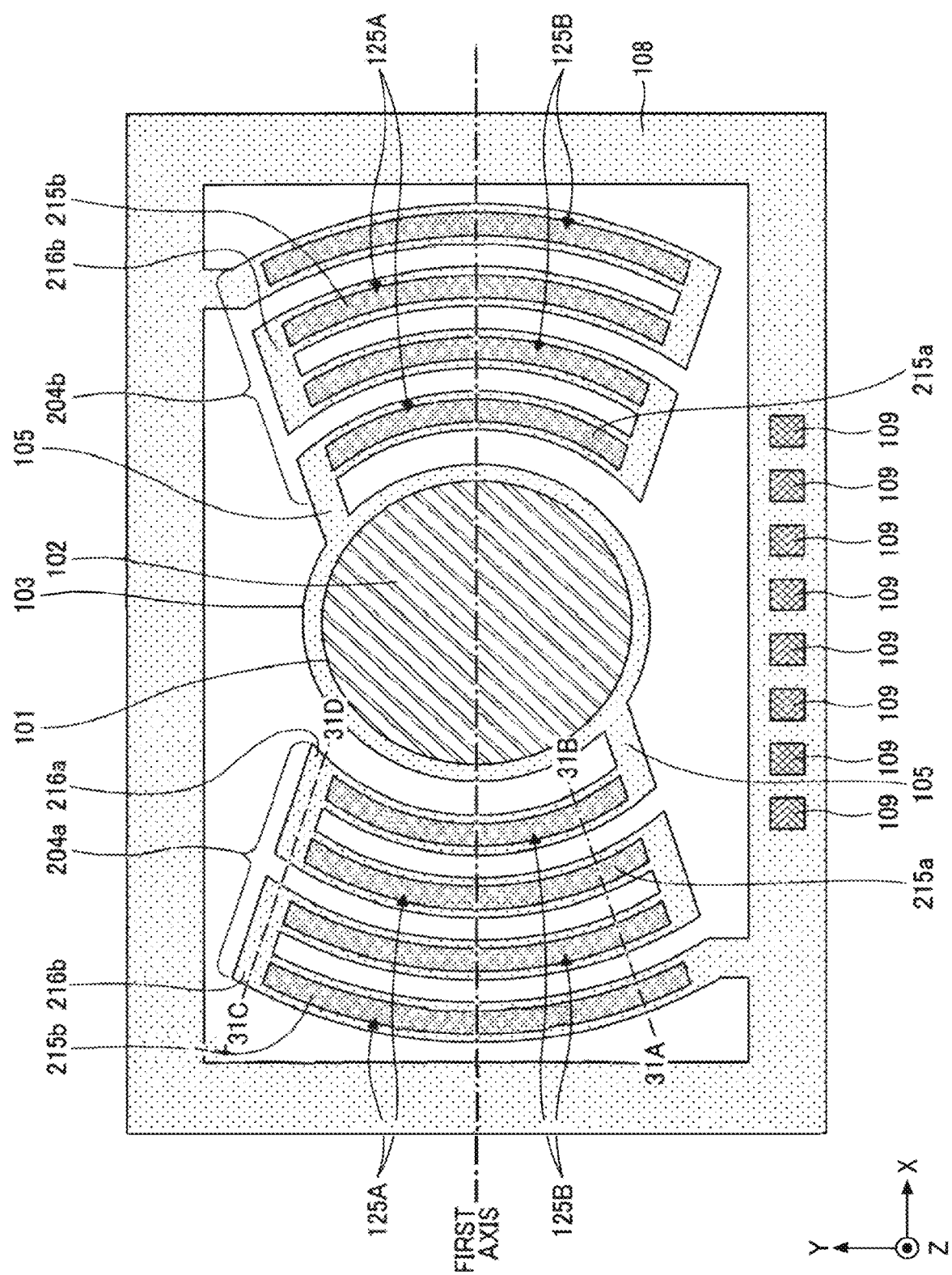
[Fig. 46]

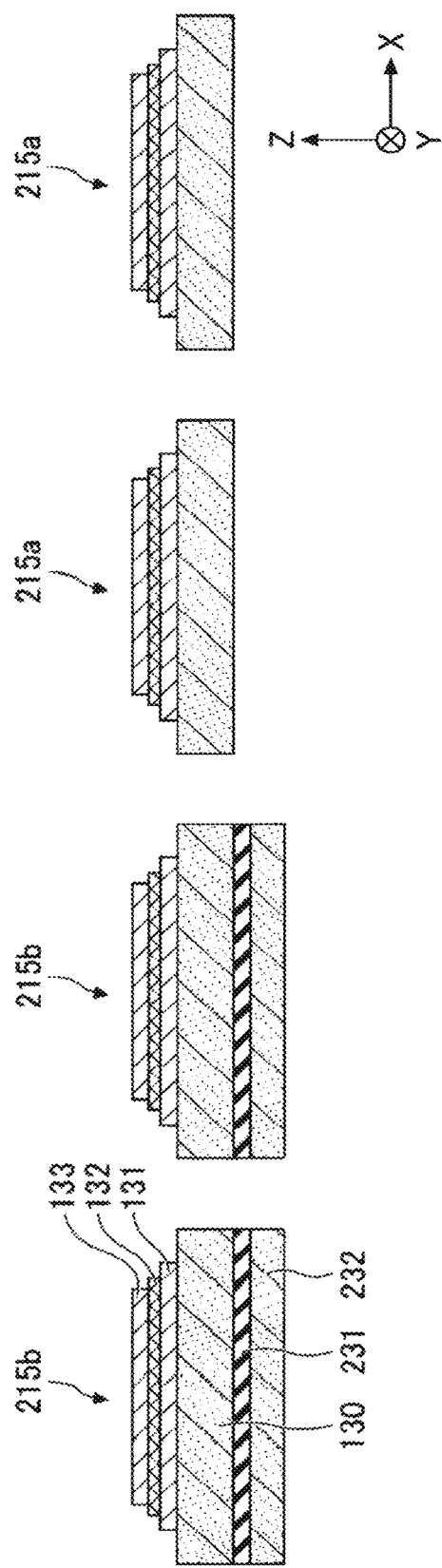

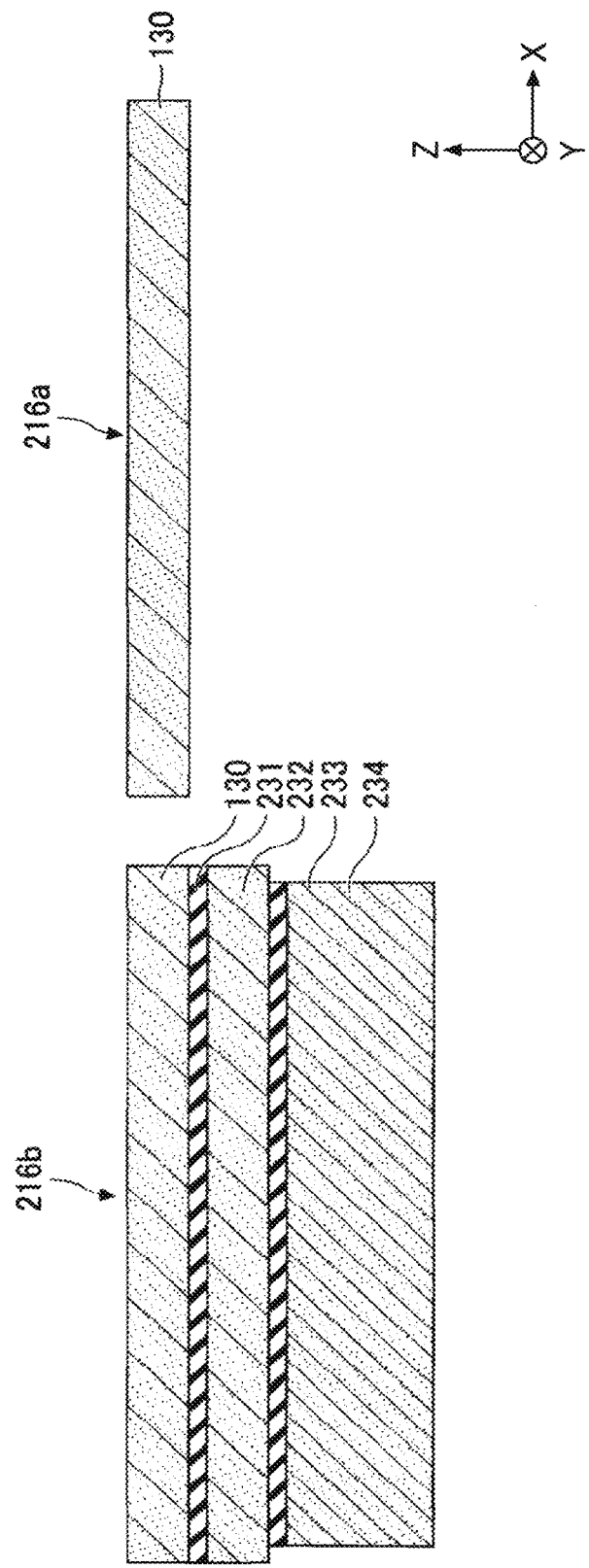

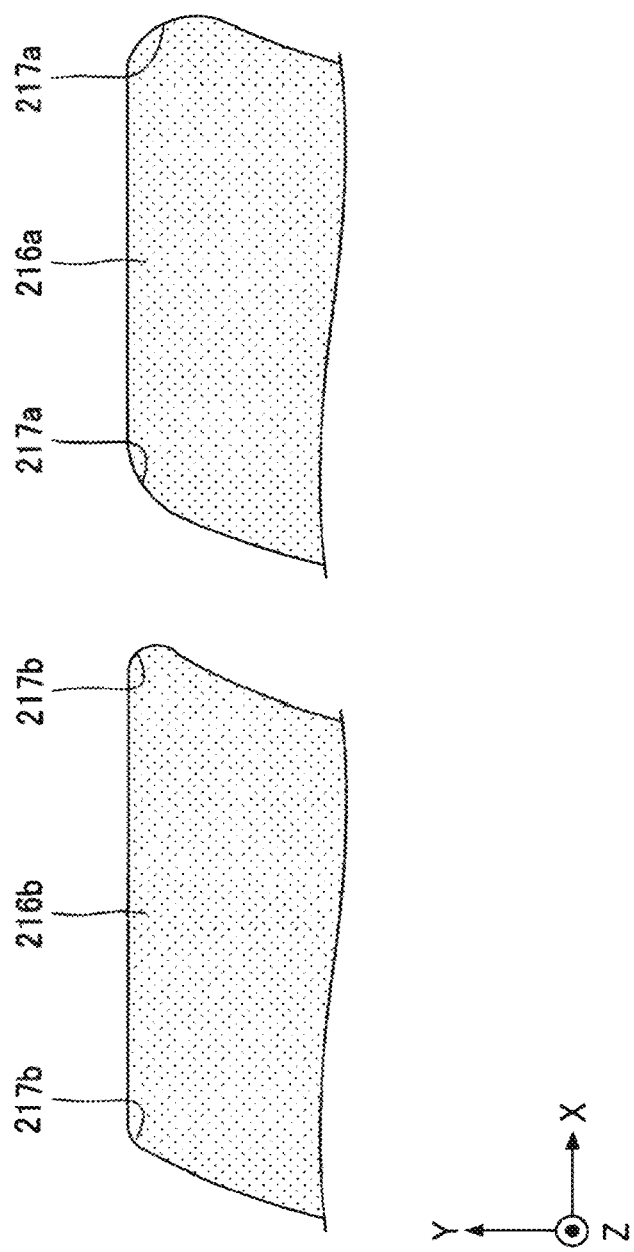
[Fig. 49]

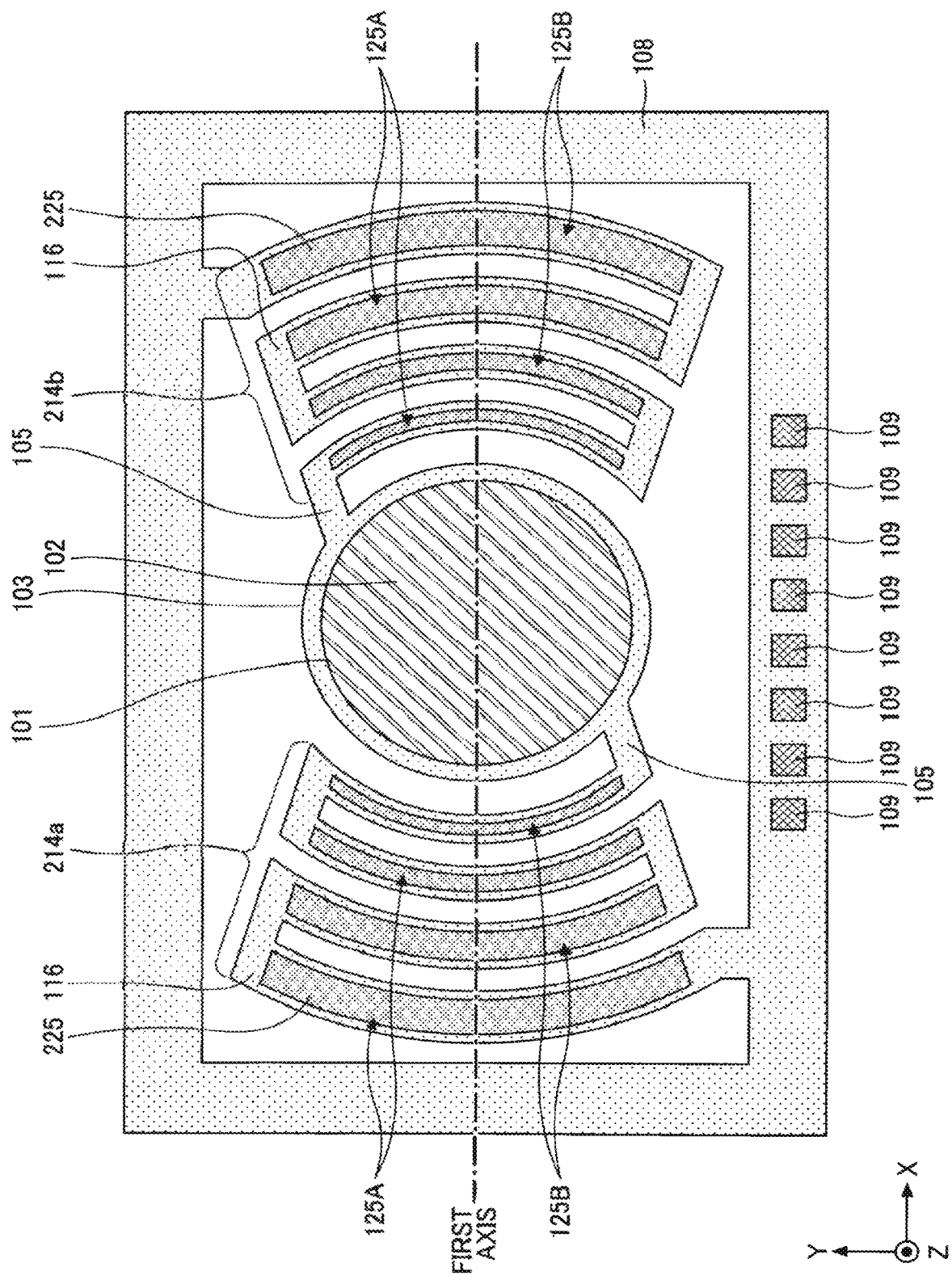
[Fig. 50]

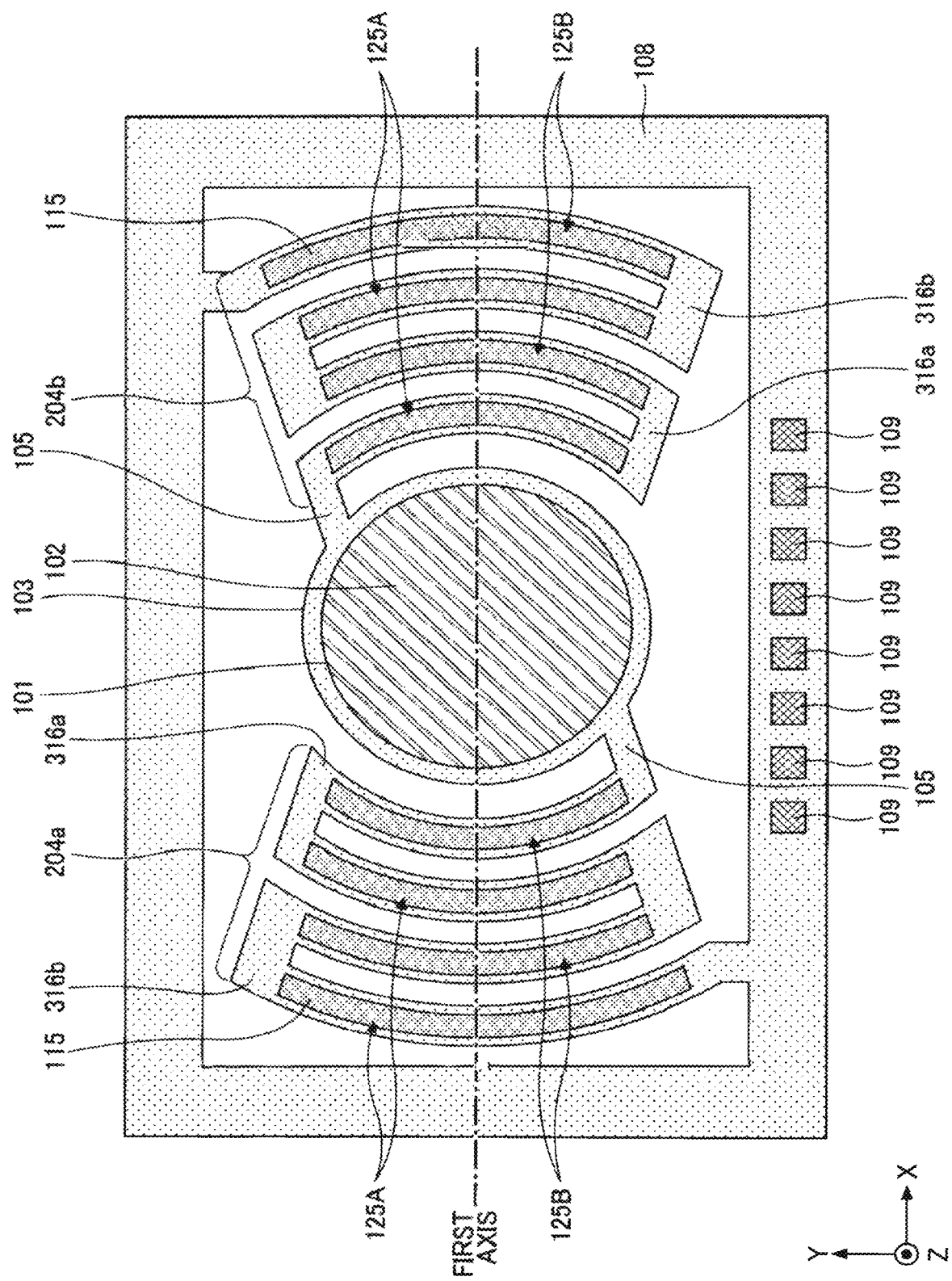
[Fig. 51]

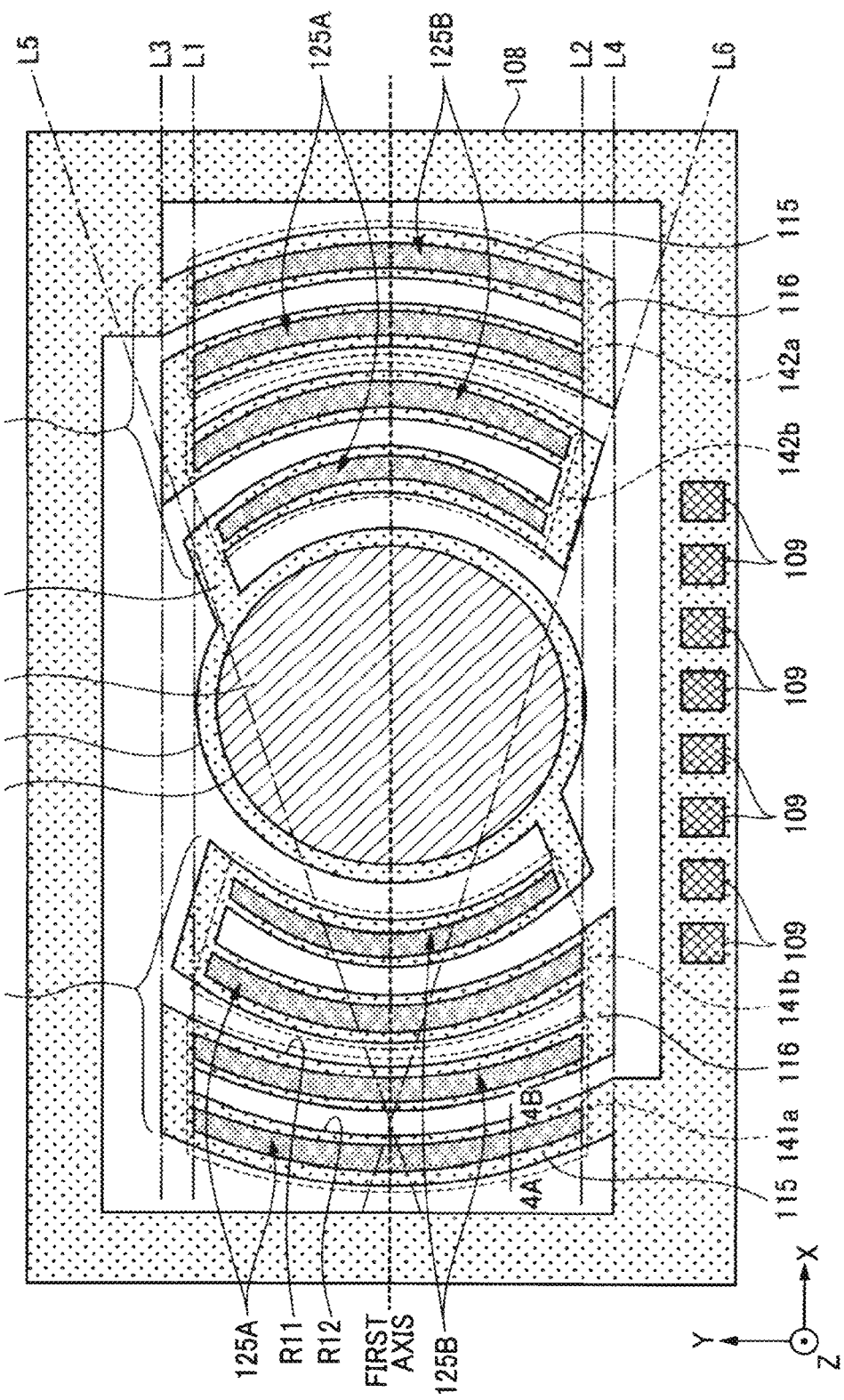
[Fig. 52]

[Fig. 53]
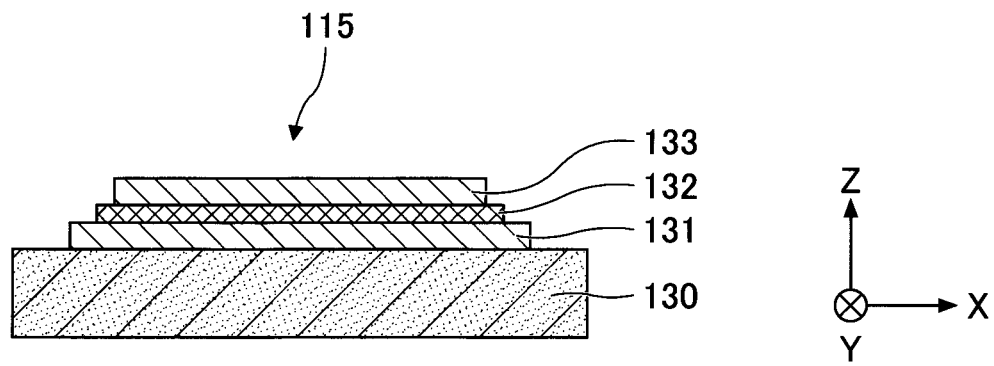
[Fig. 54]
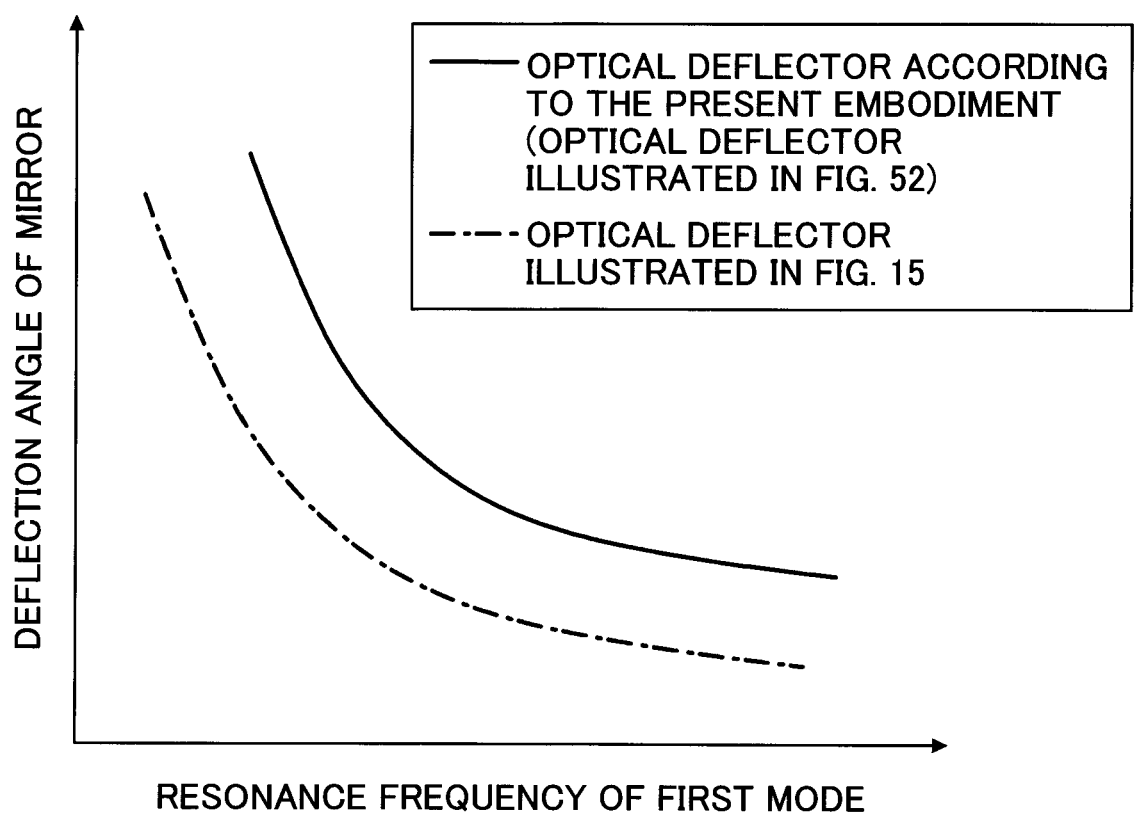

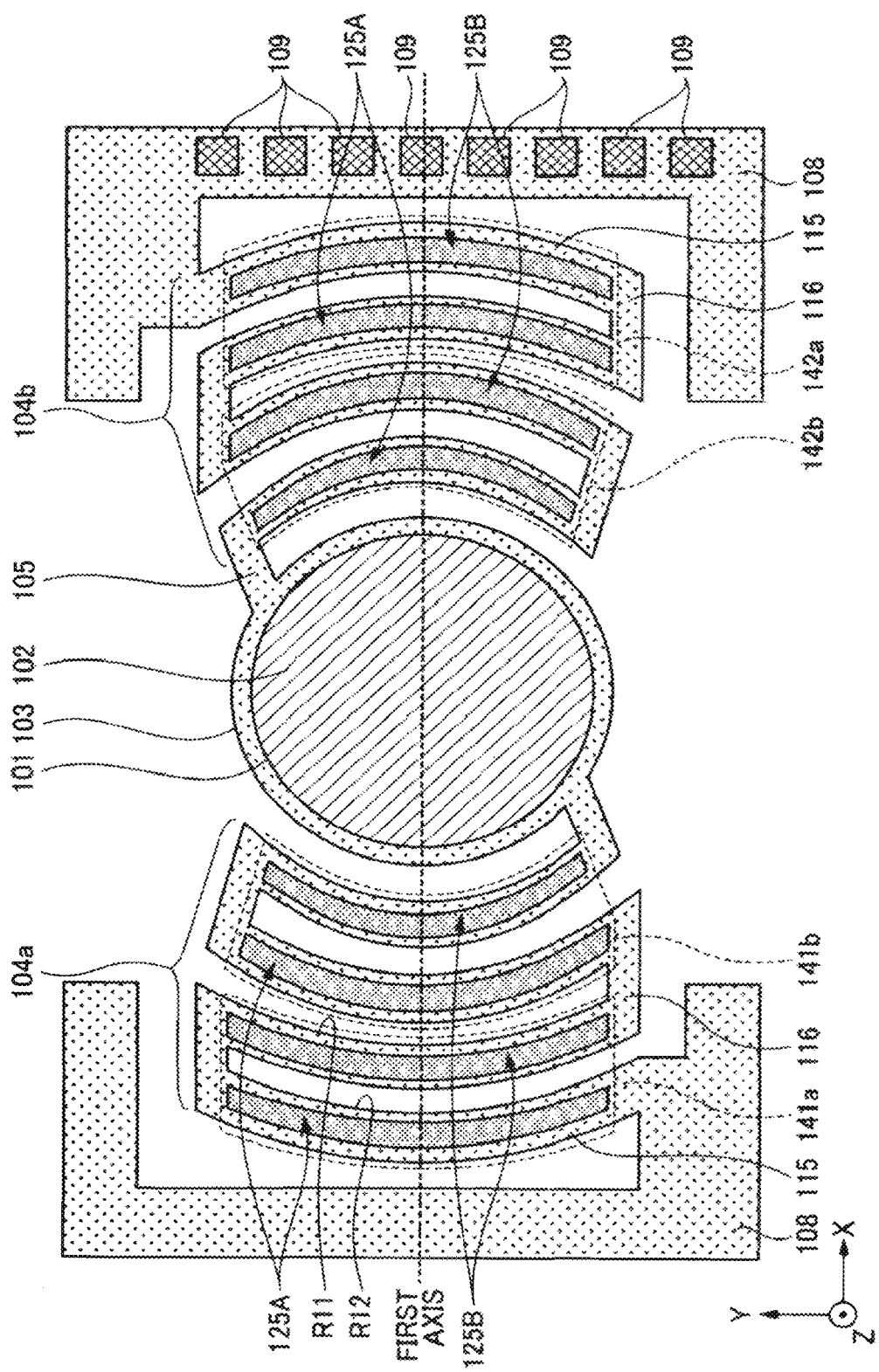
[Fig. 55]

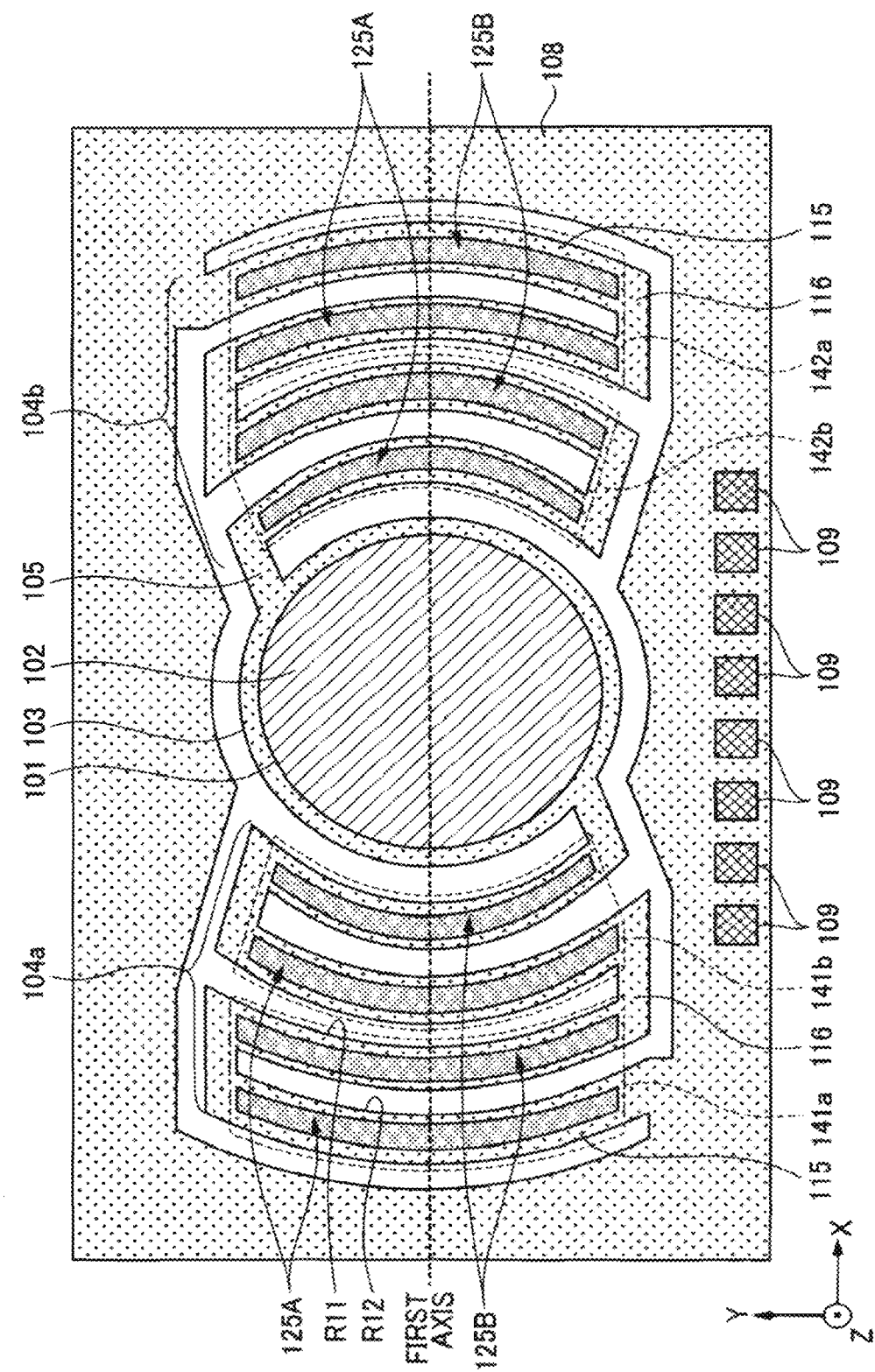
[Fig. 56]

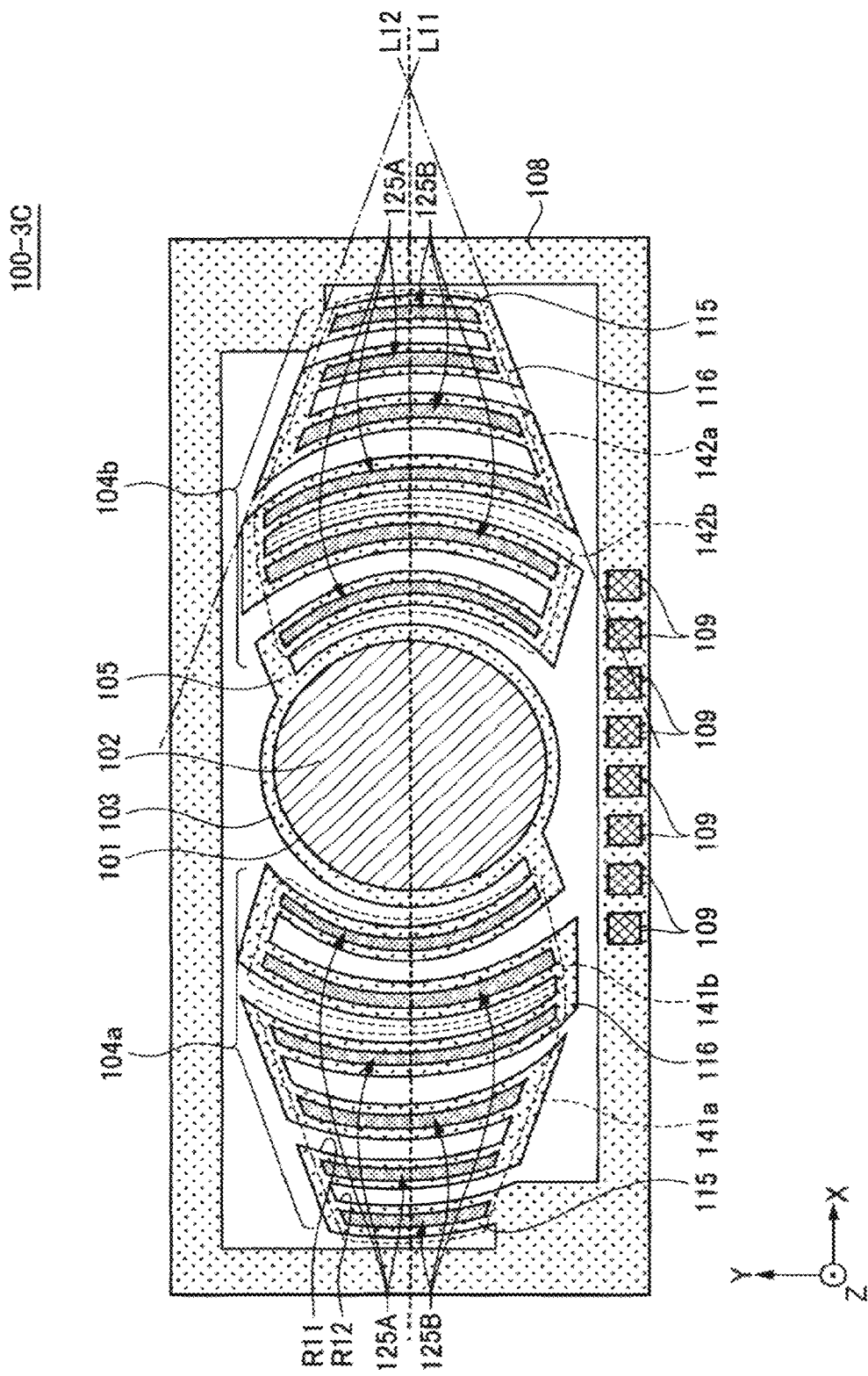
[Fig. 57]

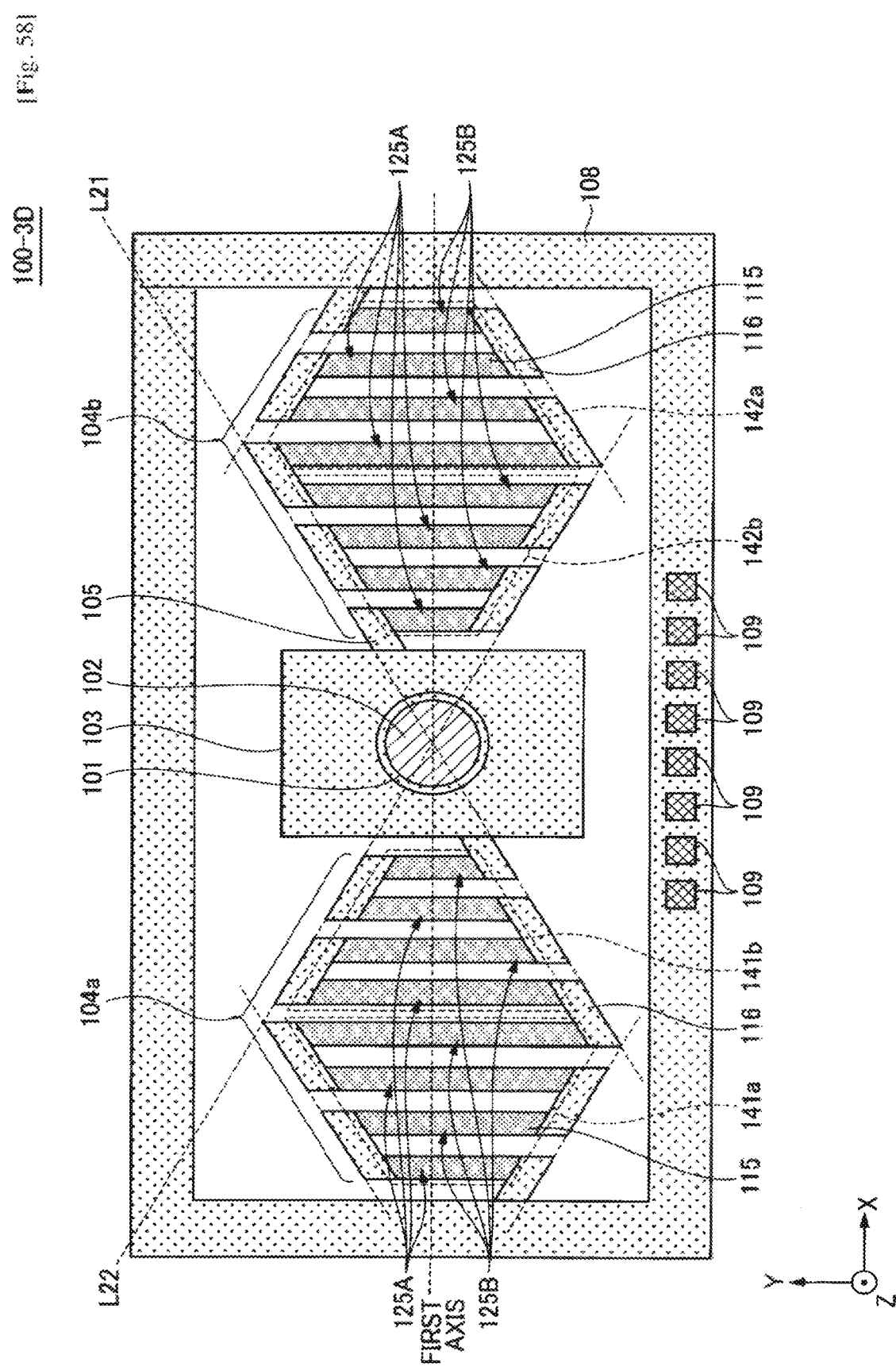
[Fig. 58]

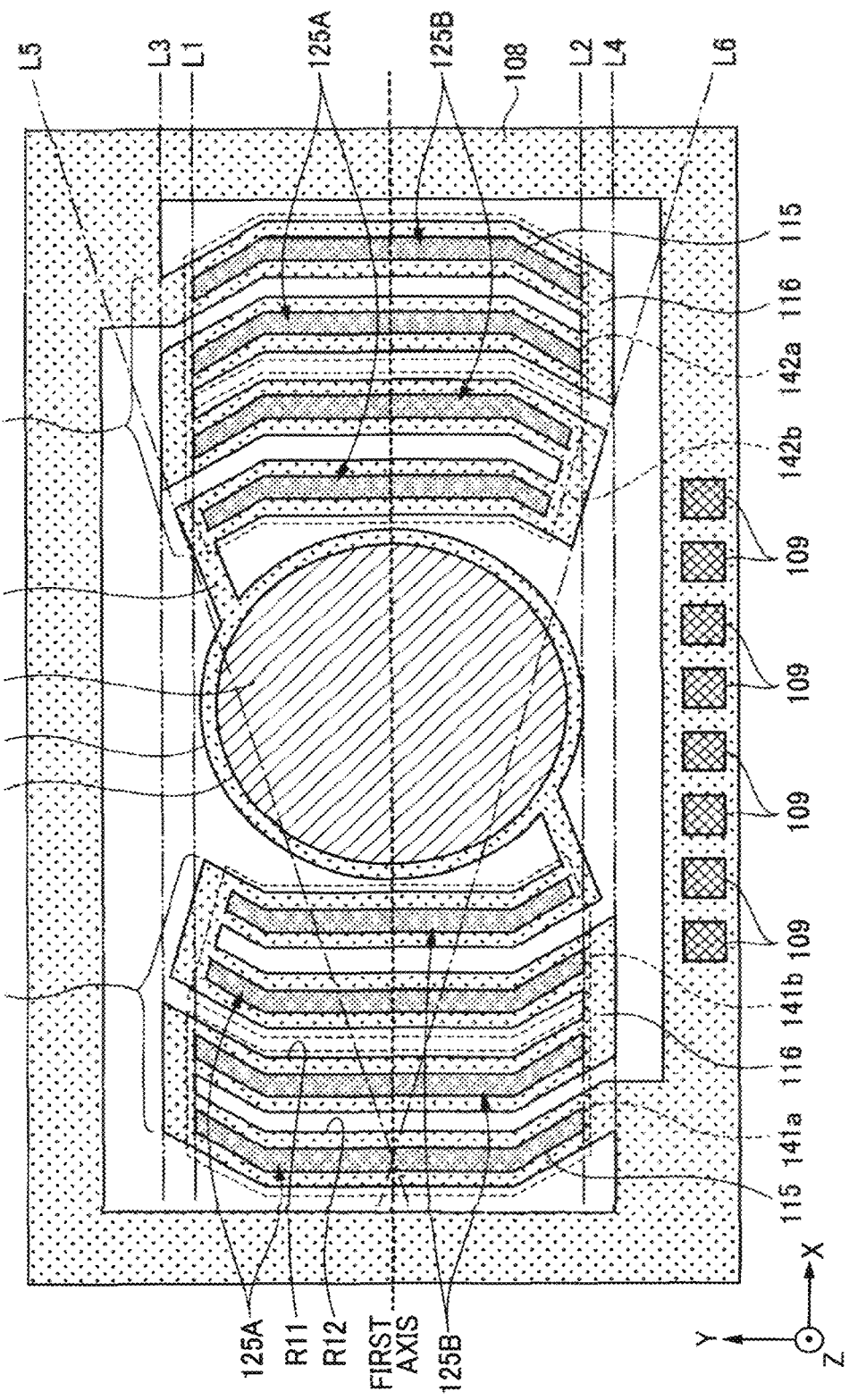
[Fig. 59]

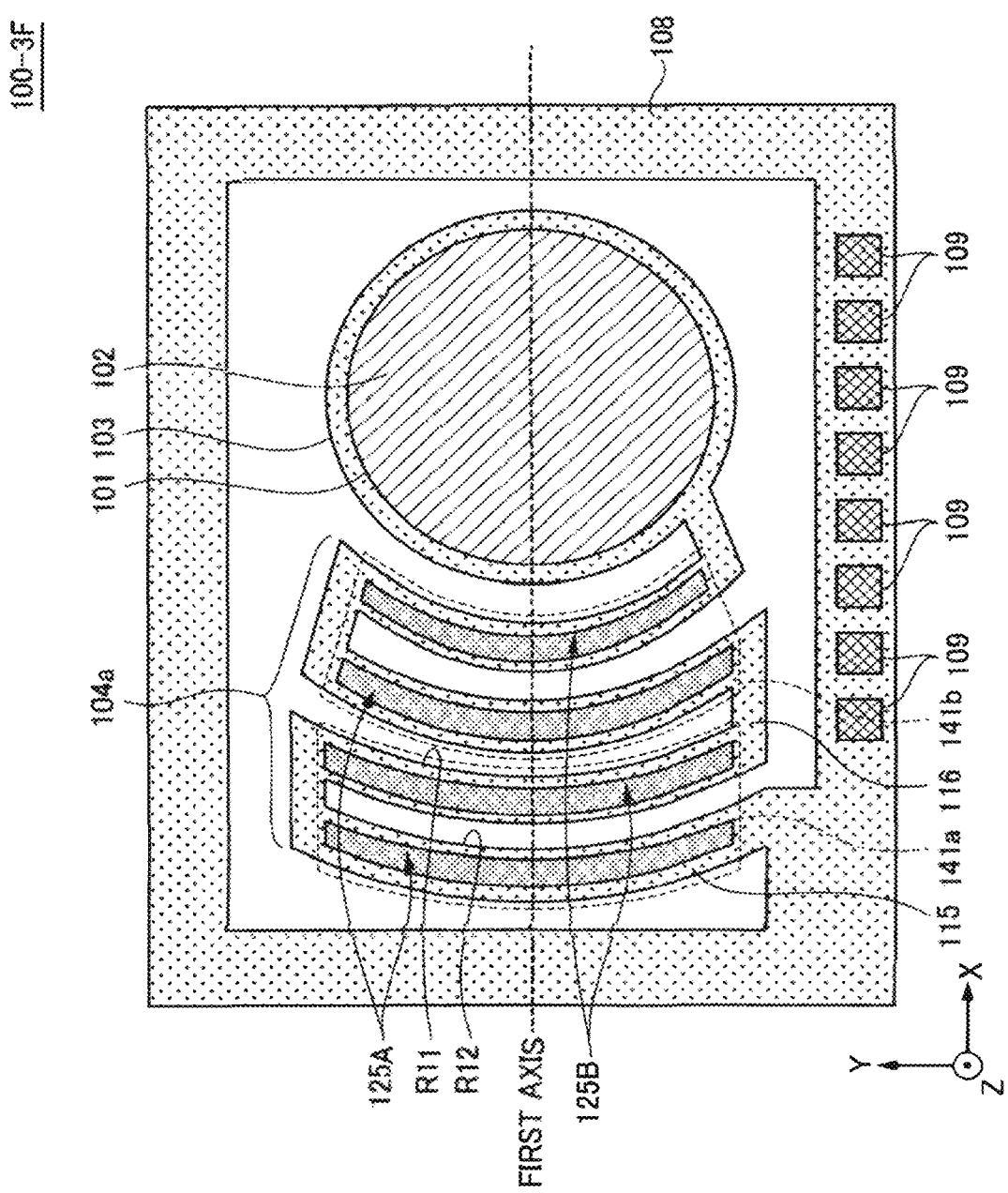

[Fig. 61]
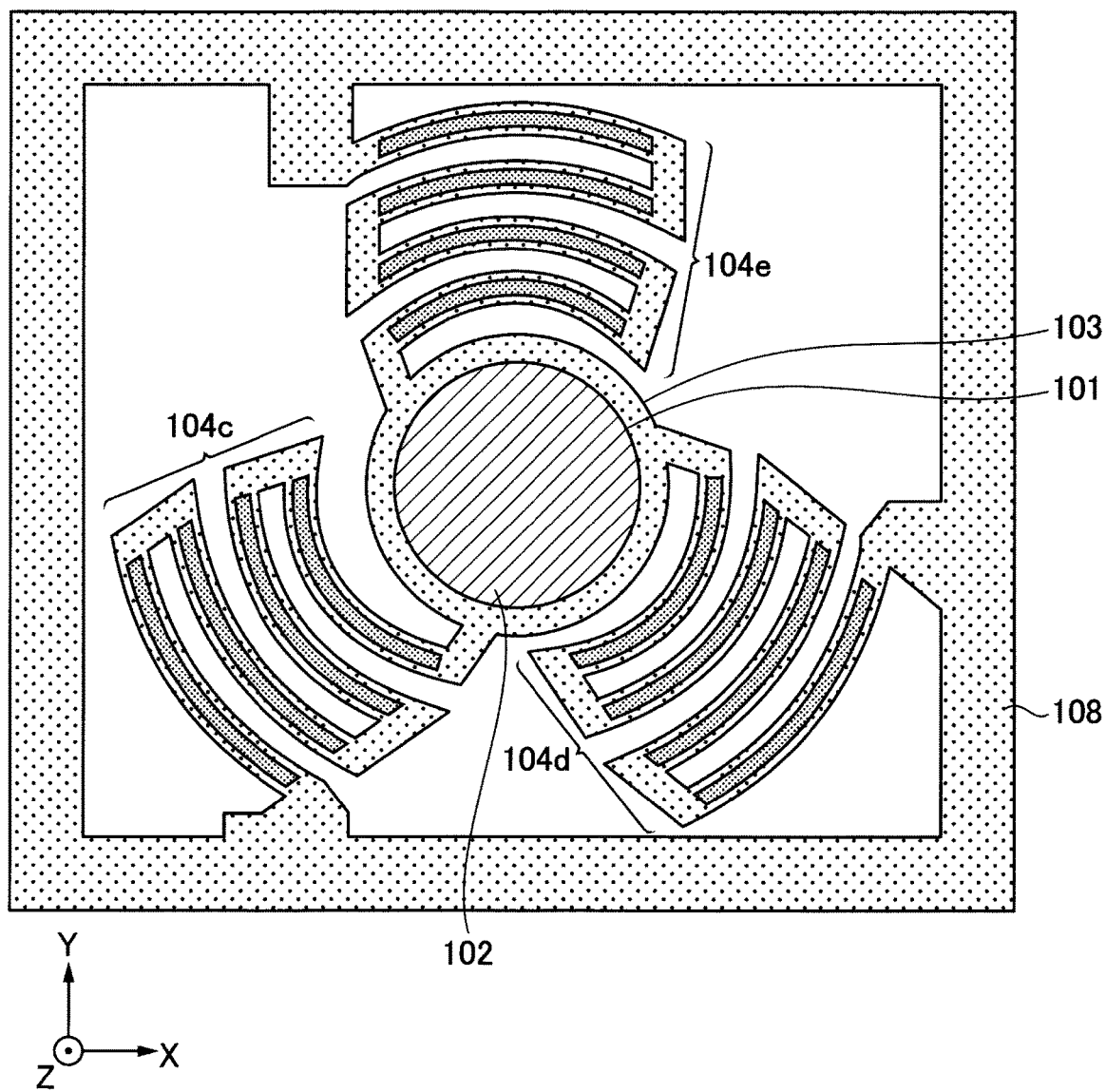

[Fig. 62]
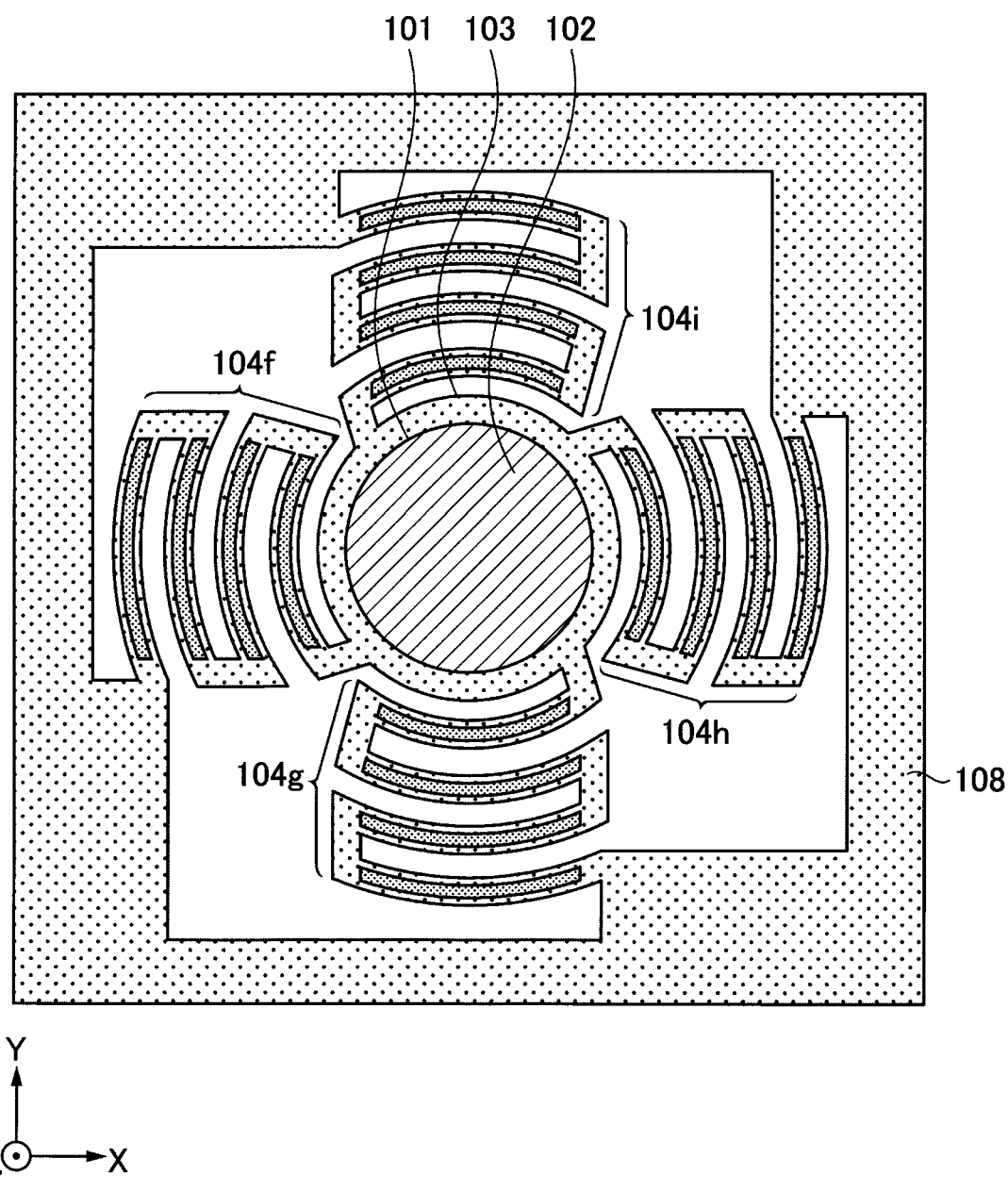

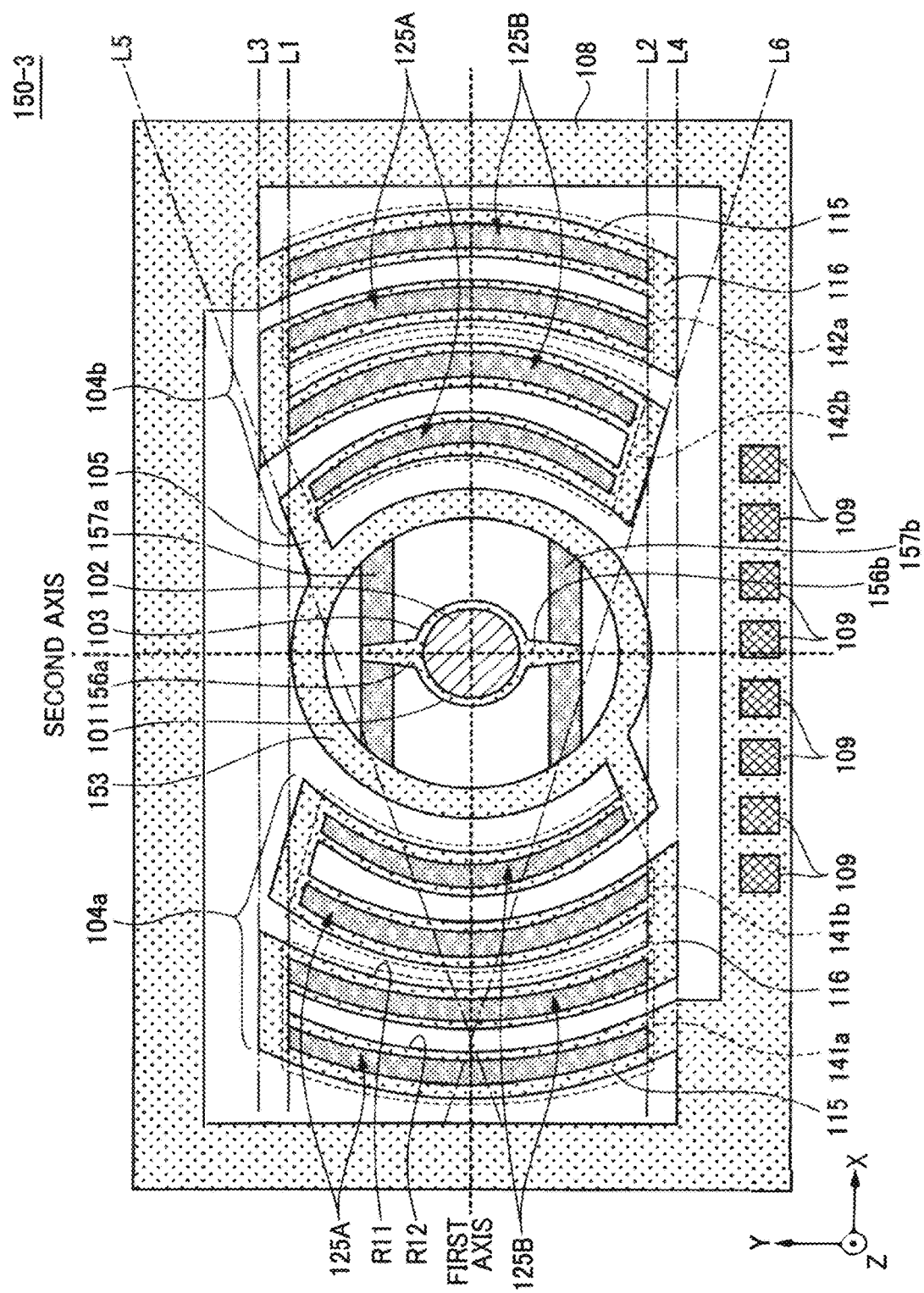
[Fig. 63]

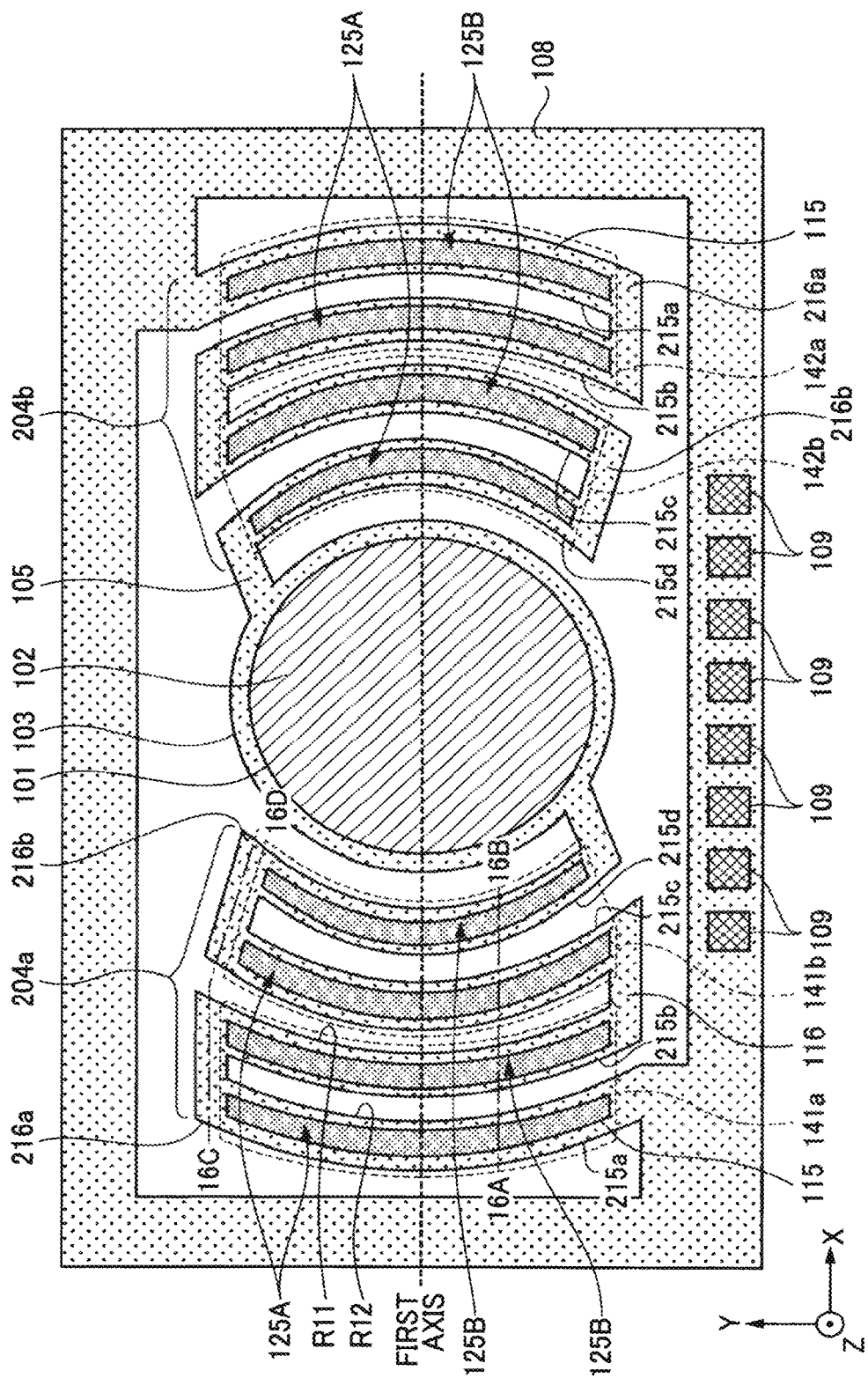

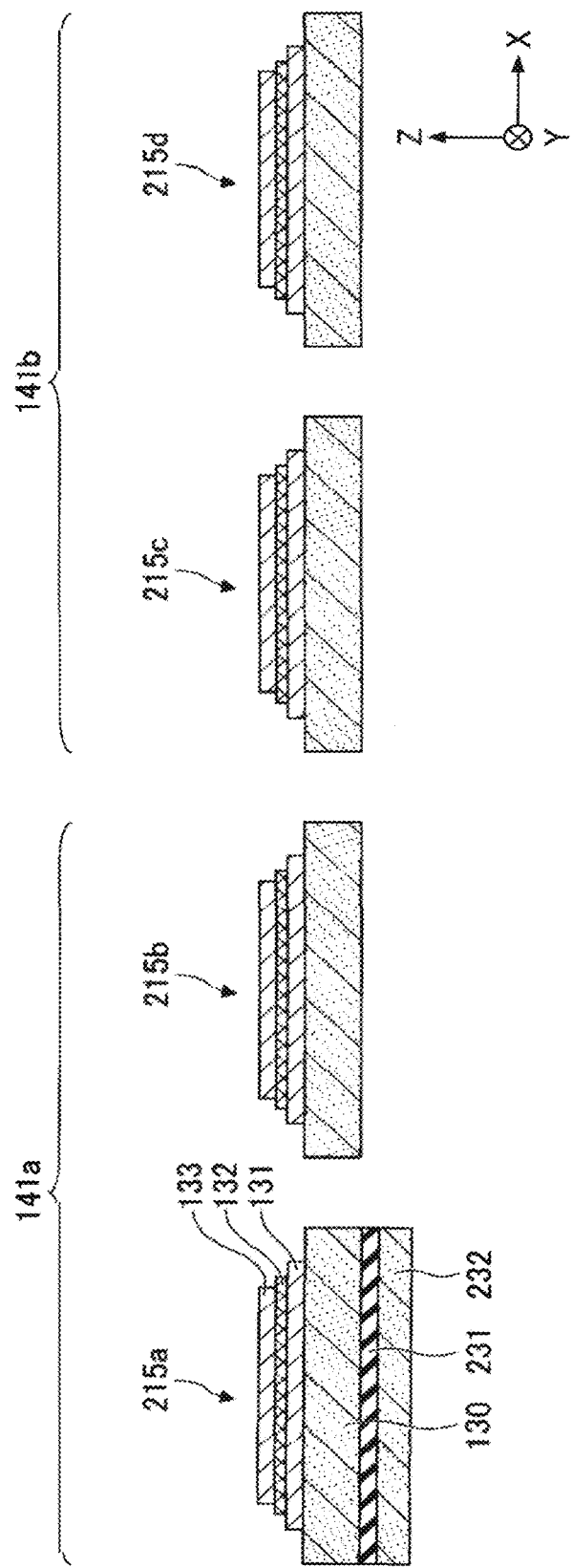

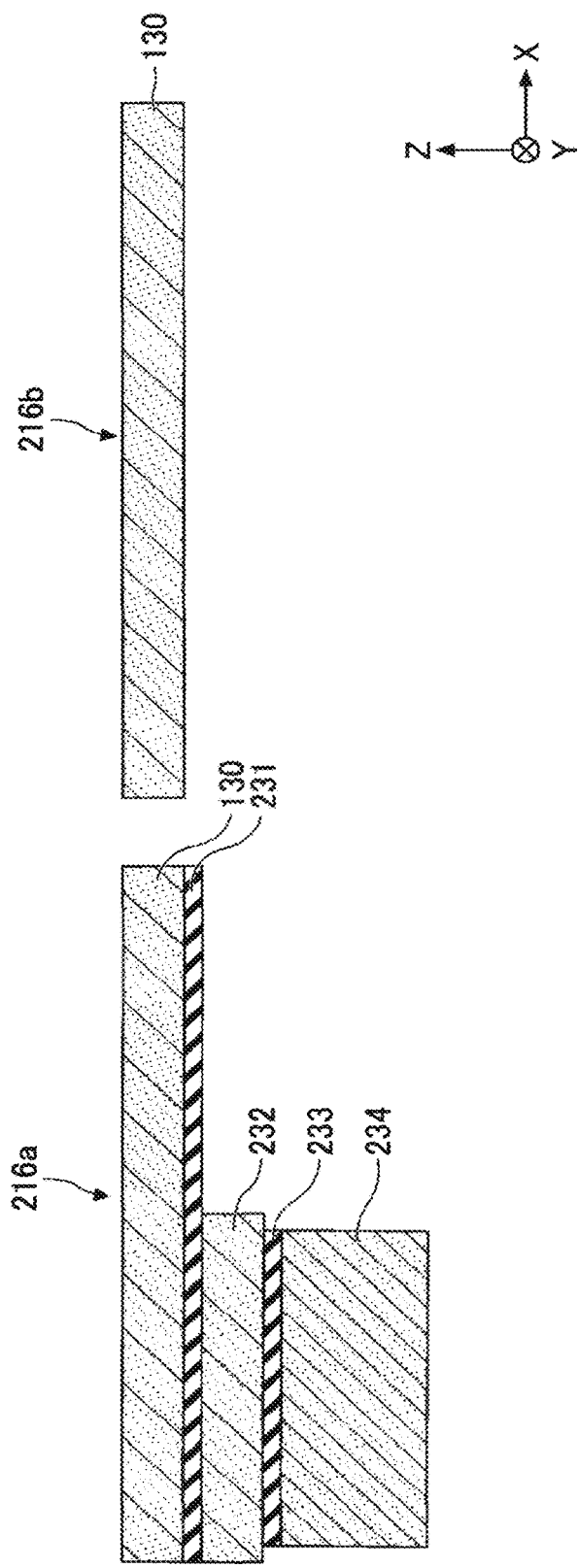
[Fig. 66]

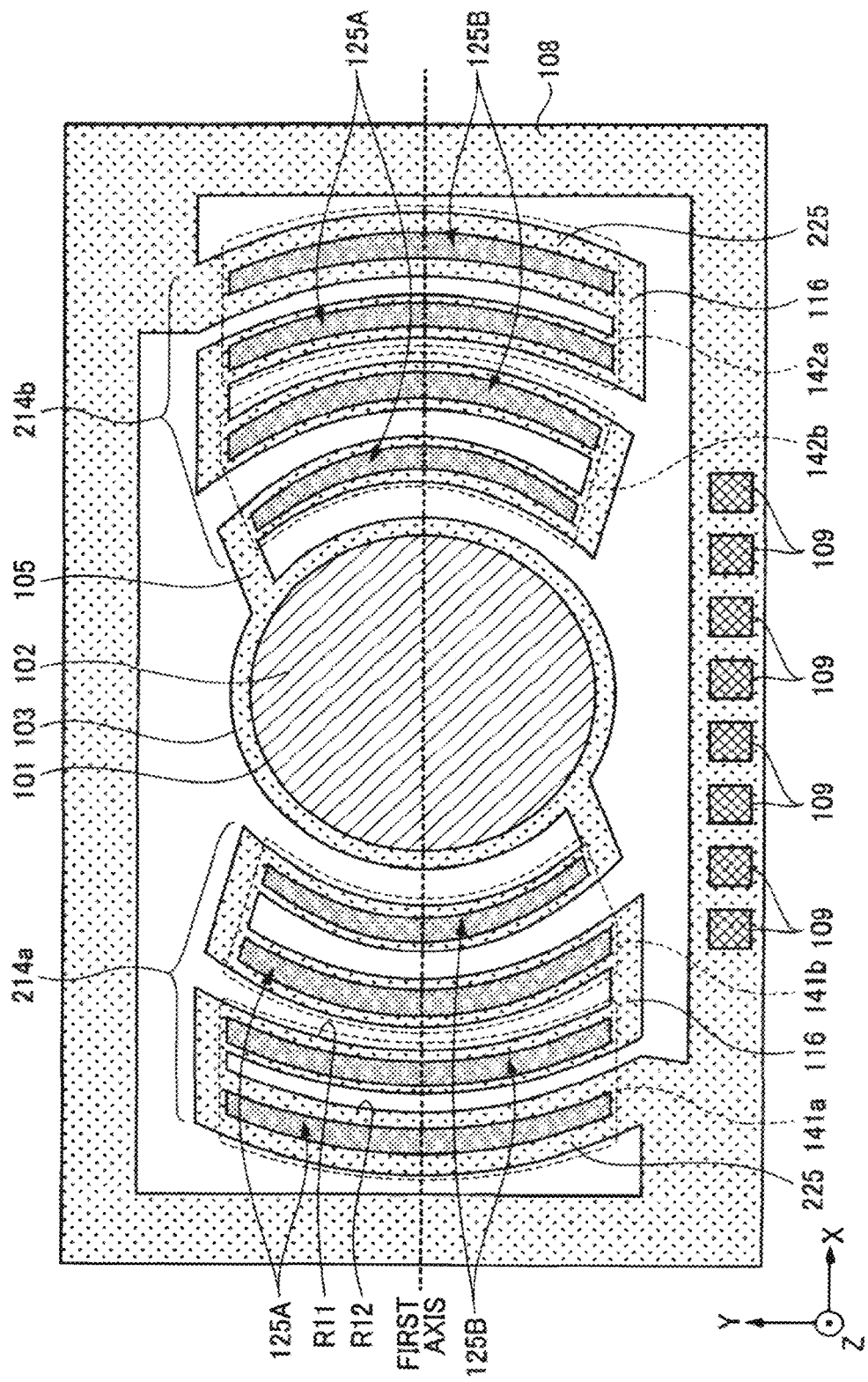

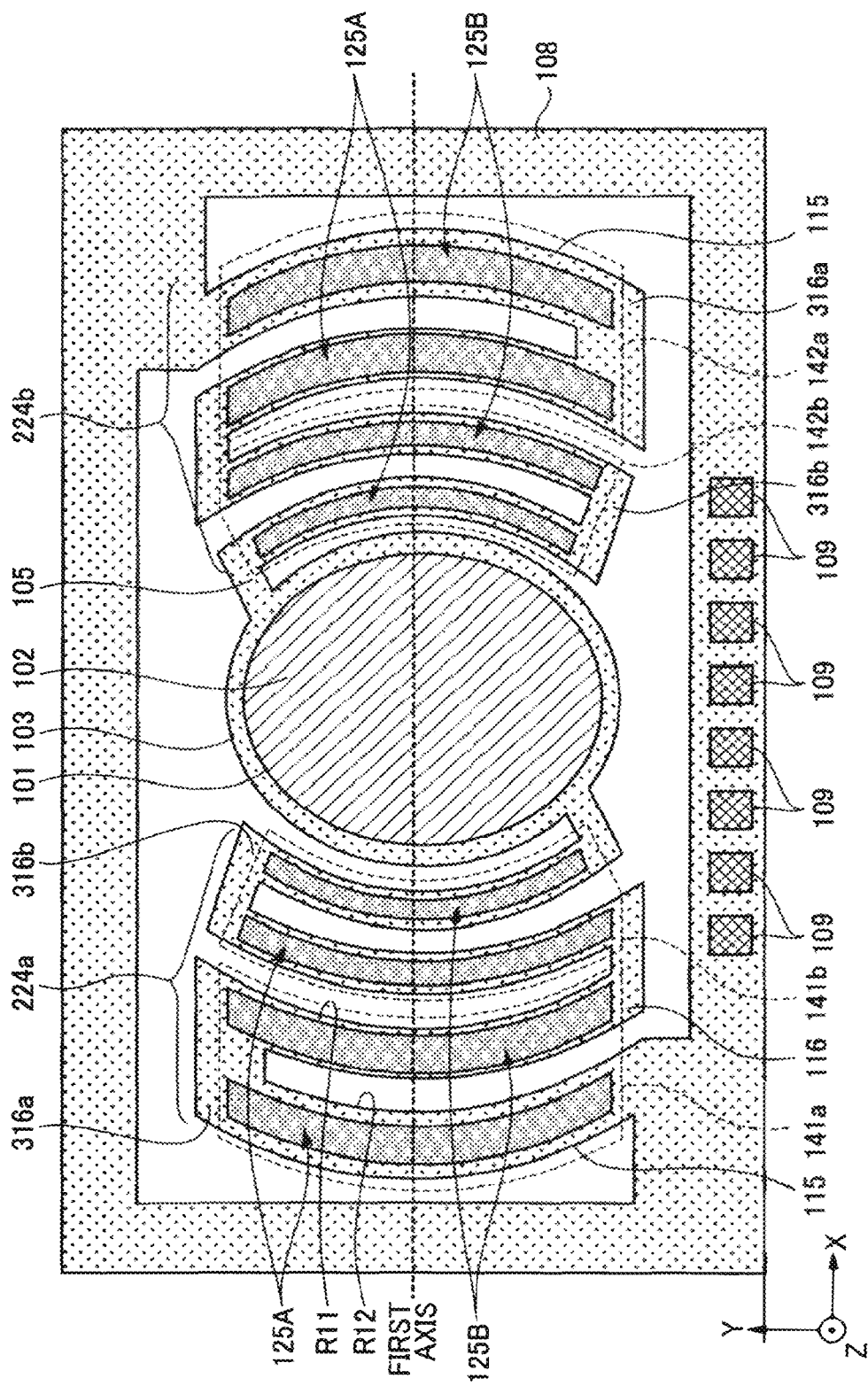

MOVABLE APPARATUS

CROSS-REFERENCE TO RELATED APPLICATIONS

The present application is based on PCT filing PCT/JP2020/038498, filed Oct. 12, 2020, which claims priority to JP 2019-190737, filed Oct. 18, 2019, JP 2019-190738, filed Oct. 18, 2019, and JP 2020-045695, filed Mar. 16, 2020, the entire contents of each are incorporated herein by reference.

TECHNICAL FIELD

The embodiments described herein relate to a movable apparatus.

BACKGROUND ART

In recent years, with the development of micromachining technology to which semiconductor manufacturing technology is applied, progress has been made in the development of Micro Electro Mechanical Systems (MEMS) produced by microfabrication of silicon and glass.

For example, an example of a known MEMS device includes a movable apparatus obtained by forming, on a wafer, a movable unit provided with a reflection surface and an elastic beam, wherein a driving beam constructed by stacking a thin piezoelectric material on the elastic beam is configured to drive (rotate) the movable unit (for example, see PTL 1).

It has already been known that a two-dimensional optical deflection apparatus and an image display apparatus using the two-dimensional optical deflection apparatus are implemented with such a movable apparatus.

SUMMARY OF INVENTION

Technical Problem

In order to increase a mechanical driving sensitivity and obtain a large scan angle with an optical deflector (an example of such a movable apparatus), it is conceivable to increase the lengths of beam units serving as vibration beams included in the meandering structure. However, when the length of the beam unit serving as the vibration beam is increased, there is a problem in that the natural resonance frequency of the entire actuator decreases. Consequently, the mechanical strength decreases and shaking tends to occur.

The present disclosure has been made in view of the above problems, and it is an objective of the present disclosure to provide a movable apparatus capable of alleviating the reduction in the natural resonance frequency and capable of obtaining a large scan angle.

Solution to Problem

A movable apparatus according to an aspect of the present disclosure includes:
- a movable unit including a mirror configured to reflect light;
- a support portion including a first end and a second end, the first end being connected to the movable unit, and the support portion configured to swingably support the movable unit; and
- a fixed unit connected to the second end of the support portion, wherein the support portion includes:
- a plurality of beam units; and
- at least one connection unit connecting adjacent beam units of the plurality of beam units, wherein where the support portion is divided into two parts at a predetermined or given position, the two parts including a first part closer to the fixed unit and a second part closer to the movable unit, among the plurality of beam units, a beam unit in the first part has a higher rigidity than a beam unit in the second part, and the beam unit in the second part is longer than the beam unit in the first part.

Advantageous Effects of Invention

With a movable apparatus according to the disclosed technique, the reduction in the natural resonance frequency can be alleviated, and a large scan angle can be obtained.

BRIEF DESCRIPTION OF DRAWINGS

FIG. 1 is a schematic drawing illustrating an optical scanning system;

FIG. 2 is a hardware configuration diagram of the optical scanning system;

FIG. 3 is a functional block diagram of a control apparatus;

FIG. 4 is a flowchart of an example of processing of an optical scanning system;

FIG. 5 is a schematic drawing of an automobile provided with a head-up display device;

FIG. 6 is a schematic drawing of the head-up display device;

FIG. 7 is a schematic drawing of an image forming apparatus provided with an optical writing apparatus;

FIG. 8 is a schematic drawing of the optical writing apparatus;

FIG. 9 is a schematic drawing of an automobile provided with a LiDAR apparatus;

FIG. 10 is a schematic drawing of the LiDAR apparatus;

FIG. 11 is a schematic diagram of a configuration of a laser headlamp;

FIG. 12 is a schematic drawing illustrating an example of a head mounted display;

FIG. 13 is a drawing illustrating an example of a portion of the configuration of the head mounted display;

FIG. 14 is a schematic drawing of a packaged movable apparatus;

FIG. 15 is a plan view of an optical deflector of a single axis;

FIG. 16 is a cross sectional view taken along the alternate long and short dash line 15A-15B of FIG. 15;

FIG. 17 is a plan view of an optical deflector of both-end supported type;

FIG. 18 is a plan view of an optical deflector according a first embodiment;

FIG. 19 is a cross sectional view of the optical deflector according the first embodiment;

FIG. 20 is a characteristics diagram of the optical deflector according the first embodiment;

FIG. 21 is a plan view of an optical deflector according to a modification of the first embodiment;

FIG. 22 is a plan view of an optical deflector according to a modification of the first embodiment;

FIG. 23 is a plan view of an optical deflector according to a modification of the first embodiment;

FIG. 24 is a plan view of an optical deflector including a single support portion according to a modification of the first embodiment;

FIG. 25 is a plan view of an optical deflector including three support portions according to a modification of the first embodiment;

FIG. 26 is a plan view of an optical deflector including four support portions according to a modification of the first embodiment;

FIG. 27 is a plan view of an optical deflector according to a modification of the first embodiment;

FIG. 28 is a plan view of an optical deflector according to a modified embodiment of the first embodiment;

FIG. 29 is a cross sectional view taken along an alternate long and short dashed line 28A-28B of FIG. 28;

FIG. 30 is a cross sectional view taken along an alternate long and short dashed line 28C-28D of FIG. 28;

FIG. 31 is a plan view of an optical deflector according to a modified embodiment of the first embodiment;

FIG. 32 is a plan view of an optical deflector according to a modified embodiment of the first embodiment;

FIG. 33 is a plan view of an optical deflector according a second embodiment;

FIG. 34 is a cross sectional view taken along the alternate long and short dashed line 18A-18B of FIG. 33;

FIG. 35 is a characteristics diagram of the optical deflector according the second embodiment;

FIG. 36 is a plan view of an optical deflector according to a modification of the second embodiment;

FIG. 37 is a plan view of an optical deflector according to a modification of the second embodiment;

FIG. 38 is a plan view of an optical deflector according to a modification of the second embodiment;

FIG. 39 is a plan view of an optical deflector according to a modification of the second embodiment;

FIG. 40 is a plan view of an optical deflector according to a modification of the second embodiment;

FIG. 41 is a plan view of an optical deflector according to a modification of the second embodiment;

FIG. 42 is a plan view of an optical deflector including a single support portion according to a modification of the second embodiment;

FIG. 43 is a plan view of an optical deflector including three support portions according to a modification of the second embodiment;

FIG. 44 is a plan view of an optical deflector including four support portions according to a modification of the second embodiment;

FIG. 45 is a plan view of an optical deflector according to a modification of the second embodiment;

FIG. 46 is a plan view of an optical deflector according to a modified embodiment of the second embodiment;

FIG. 47 is a cross sectional view taken along an alternate long and short dashed line 31A-31B of FIG. 46;

FIG. 48 is a cross sectional view taken along an alternate long and short dashed line 31C-31D of FIG. 46;

FIG. 49 is a drawing of connection units having different curvature radiuses at corner portions according to a modified embodiment of the second embodiment;

FIG. 50 is a plan view of an optical deflector according to a modified embodiment of the second embodiment;

FIG. 51 is a plan view of an optical deflector according to a modified embodiment of the second embodiment;

FIG. 52 is a plan view of an optical deflector according to a third embodiment;

FIG. 53 is a cross sectional view taken along the alternate long and short dashed line 4A-4B of FIG. 52;

FIG. 54 is a characteristics diagram of the optical deflector according the third embodiment;

FIG. 55 is a plan view of an optical deflector according to a modification of the third embodiment;

FIG. 56 is a plan view of an optical deflector according to a modification of the third embodiment;

FIG. 57 is a plan view of an optical deflector according to a modification of the third embodiment;

FIG. 58 is a plan view of an optical deflector according to a modification of the third embodiment.

FIG. 59 is a plan view of an optical deflector according to a modification of the third embodiment;

FIG. 60 is a plan view of an optical deflector according to a modification of the third embodiment;

FIG. 61 is a plan view of an optical deflector including three support portions according to a modification of the third embodiment;

FIG. 62 is a plan view of an optical deflector including four support portions according to a modification of the third embodiment;

FIG. 63 is a plan view of an optical deflector according to a modification of the third embodiment;

FIG. 64 is a plan view of an optical deflector according to a modified embodiment of the third embodiment;

FIG. 65 is a cross sectional view taken along an alternate long and short dashed line 16A-16B of FIG. 64;

FIG. 66 is a cross sectional view taken along an alternate long and short dashed line 16C-16D of FIG. 64;

FIG. 67 is a plan view of an optical deflector according to a modified embodiment of the third embodiment; and FIG. 68 is a plan view of an optical deflector according to a modified embodiment of the third embodiment.

DESCRIPTION OF EMBODIMENTS

Hereinafter, embodiments of the present disclosure are described in detail.

<Optical Scanning System>

First, an optical scanning system including a movable apparatus according to the present embodiment is described in detail with reference to FIG. 1 to FIG. 4.

FIG. 1 is a schematic drawing illustrating an example of an optical scanning system. As illustrated in FIG. 1, the optical scanning system 10 is a system for optically scanning a scan surface 15 by causing a reflection surface 14 of a movable apparatus 13 to deflect light emitted from a light source apparatus 12 according to control of the control apparatus 11.

The optical scanning system 10 includes the control apparatus 11, the light source apparatus 12, and the movable apparatus 13 including the reflection surface 14.

The control apparatus 11 is an electric circuit unit including, for example, a Central Processing Unit (CPU), an Field-Programmable Gate Array (FPGA), and the like. For example, the movable apparatus 13 includes a reflection surface 14, and is a Micro Electromechanical Systems (MEMS) device capable of moving the reflection surface 14. For example, the light source apparatus 12 is a laser apparatus that emits laser. For example, the scan surface 15 is a screen.

The control apparatus 11 generates control instructions for the light source apparatus 12 and the movable apparatus 13 based on the obtained optical scan information, and outputs drive signals to the light source apparatus 12 and the movable apparatus 13 based on the control instructions.

The light source apparatus 12 emits light on the basis of the received drive signal. The movable apparatus 13 moves the reflection surface 14 in at a single axial direction or two axial directions on the basis of the received drive signal.

Accordingly, for example, with the control of the control apparatus 11 based on image information, i.e., an example of optical scan information, the reflection surface 14 of the movable apparatus 13 is reciprocally moved in two axial directions in a predetermined range, and light emitted from the light source apparatus 12 to be incident on the reflection surface 14 is deflected and optically scanned around a given single axis, so that any given image can be projected onto the scan surface 15. The details of the movable apparatus and the details of control of the control apparatus according to the present embodiment are explained later.

Next, a hardware configuration of an example of the optical scanning system 10 is explained with reference to FIG. 2. FIG. 2 is a hardware configuration diagram of an example of the optical scanning system 10. As illustrated in FIG. 2, the optical scanning system 10 includes the control apparatus 11, the light source apparatus 12, and the movable apparatus 13, which are electrically connected with one another. Among them, the control apparatus 11 includes a CPU 20, a Random Access Memory (RAM) 21, a Read Only Memory (ROM) 22, an FPGA 23, an external interface 24, a light source apparatus driver 25, and a movable apparatus driver 26.

The CPU 20 is an arithmetic processing apparatus implementing the overall control and the functions of the control apparatus 11 by reading programs and data from a storage device such as the ROM 22 and the like to the RAM 21 and executing processing.

The RAM 21 is a volatile storage device that temporarily stores programs and data.

The ROM 22 is a nonvolatile storage device capable of holding programs and data even when the power is turned off, and stores processing programs and data that the CPU 20 executes to control the functions of the optical scanning system 10.

The FPGA 23 is a circuit for outputting a control signal suitable for the light source apparatus driver 25 and the movable apparatus driver 26 according to the processing of the CPU 20.

For example, the external interface 24 is an interface for communicating with an external apparatus, a network, and the like. Examples of external apparatuses include host apparatuses such as a PC (Personal Computer) and storage devices such as USB memory, SD cards, CD, DVD, HDD, SSD, and the like. Examples of networks include CAN (Controller Area Network) of automobiles, LAN (Local Area Network), the Internet, and the like. The external interface 24 may be configured to enable connection or communication with external apparatuses, and a dedicated external interface 24 may be provided for each external apparatus.

The light source apparatus driver 25 is an electric circuit that outputs a drive signal such as a drive voltage to the light source apparatus 12 according to the received control signal.

The movable apparatus driver 26 is an electric circuit that outputs a drive signal such as a drive voltage to the movable apparatus 13 according to the received control signal.

In the control apparatus 11, the CPU 20 obtains optical scan information from the external apparatus or the network via the external interface 24. The control apparatus 11 may be configured so that the CPU 20 obtains optical scan information. For example, the optical scan information may be stored in the ROM 22 and the FPGA 23 in the control apparatus 11. Alternatively, a storage device such as an SSD may be provided in the control apparatus 11, and the optical scan information may be configured to be stored in the storage device.

In this case, the optical scan information is information indicating how the scan surface 15 is optically scanned. For example, in a case where an image is displayed by optical scan, the optical scan information is image data. For example, in a case where optical writing is performed by optical scan, the optical scan information is write data indicating the order of writing and writing positions. For example, in a case where an object recognition is performed by optical scan, the optical scan information is light emission data indicating timing and a light emission range according to which light is emitted to recognize objects.

The control apparatus 11 can achieve the functional configuration explained below with the instructions of the CPU 20 and the hardware configuration illustrated in FIG. 2.

Next, the functional configuration of the control apparatus 11 of the optical scanning system 10 is explained with reference to FIG. 3. FIG. 3 is a functional block diagram of an example of the control apparatus 11 of the optical scanning system 10.

As illustrated in FIG. 3, the control apparatus 11 includes, as functions, a control unit 30 and a drive signal output unit 31.

For example, the control unit 30 is implemented by the CPU 20, the FPGA 23, and the like. The control unit 30 obtains optical scan information from an external apparatus, converts the optical scan information into a control signal, and outputs the converted control signal to the drive signal output unit 31. For example, the control unit 30 obtains image data from an external apparatus and the like, as optical scan information, generates a control signal from the image data by performing predetermined processing, and outputs the generated control signal to the drive signal output unit 31. The drive signal output unit 31 is implemented by the light source apparatus driver 25, the movable apparatus driver 26, and the like. The drive signal output unit 31 outputs a drive signal to the light source apparatus 12 or the movable apparatus 13 on the basis of the received control signal.

The drive signal is a signal for controlling driving of the light source apparatus 12 or the movable apparatus 13. For example, in the light source apparatus 12, the drive signal is a drive voltage for controlling light emission timings and light emission intensity of the light source. For example, in the movable apparatus 13, the drive signal is a drive voltage for controlling the timing and movable range in which the reflection surface 14 of the movable apparatus 13 is moved.

Next, processing in which the optical scanning system 10 optically scans the scan surface 15 is explained with reference to FIG. 4. FIG. 4 is a flowchart of an example of processing of the optical scanning system.

In step S11, the control unit 30 obtains optical scan information from an external apparatus or the like.

In step S12, the control unit 30 generates a control signal from the obtains optical scan information, and outputs the generated control signal to the drive signal output unit 31.

In step S13, the drive signal output unit 31 outputs the drive signal to the light source apparatus 12 and the movable apparatus 13 on the basis of the received control signal.

In step 14, the light source apparatus 12 emits light on the basis of the received drive signal. Also, the movable apparatus 13 moves the reflection surface 14 on the basis of the received drive signal. With the operation of the light source apparatus 12 and the movable apparatus 13, light is deflected in any given direction, and optical scan is performed.

In the optical scanning system 10 according to the present embodiment, the control apparatus 11 has the functions to control both of the light source apparatus 12 and the movable apparatus 13, but a control apparatus for the light source apparatus 12 and a control apparatus for the movable apparatus 13 may be provided separately.

In the above optical scanning system 10, the control apparatus 11 includes the function of the control unit 30 and the function of the drive signal output unit 31 for the light source apparatus 12 and the movable apparatus 13, but these functions may be provided in separate apparatuses. For example, a drive signal output apparatus having the drive signal output unit 31 may be provided separately from the control apparatus 11 having the control unit 30. In the optical scanning system 10, an optical deflection system for deflecting light may be constituted by the control apparatus 11 and the movable apparatus 13 having the reflection surface 14.

<Image Projection Apparatus>

Next, an image projection apparatus including a movable apparatus according to the present embodiment is explained in detail with reference to FIG. 5 and FIG. 6.

FIG. 5 is a schematic drawing of an automobile 400 provided with a head-up display device 500. The head-up display device 500 is an example of an image projection apparatus. FIG. 6 is a schematic drawing of the head-up display device 500.

The image projection apparatus is an apparatus for projecting an image by optical scan, and is, for example, a head-up display device.

As illustrated in FIG. 5, for example, the head-up display device 500 is arranged in proximity to a windshield (e.g., a windshield 401) of the automobile 400. Projection light emitted from the head-up display device 500 is reflected by the windshield 401 and travels to an observer (i.e., a user, a driver 402). Accordingly, the driver 402 can see an image and the like projected by the head-up display device 500 as a virtual image. For example, a combiner may be provided on an inner surface of a windshield to enable a user to visually recognize a virtual image with projection light emitted by the combiner.

As illustrated in FIG. 6, in the head-up display device 500, red, green, and blue laser light sources 501R, 501G, 501B emit laser lights. The emitted laser lights pass through an incident optical system including collimator lenses 502, 503, 504 provided for the respective laser light sources, two dichroic mirrors 505, 506, and a light quantity adjusting unit 507, and are deflected by the movable apparatus 13 including the reflection surface 14. Then, the deflected laser light passes through a projection optical system including a freeform mirror 509, an intermediate screen 510, and a projection mirror 511 to be projected on the screen. In the head-up display device 500, the laser light sources 501R, 501G, 501B, the collimator lenses 502, 503, 504, and the dichroic mirrors 505, 506 are unitized as the light source unit 530 by an optical housing.

The head-up display device 500 projects an intermediate image displayed on the intermediate screen 510 onto the windshield 401 of the automobile 400 to enable the driver 402 to visually recognize the intermediate image as a virtual image.

The laser lights of respective colors emitted from the laser light sources 501R, 501G, 501B are made into substantially parallel rays by the collimator lenses 502, 503, 504, respectively, and are combined by the two dichroic mirrors 505, 506, serving as a combining unit. The light quantity of the combined laser light is adjusted by the light quantity adjusting unit 507, and thereafter, projection light L is made by two-dimensionally moving the combined laser light with the movable apparatus 13 including the reflection surface 14 to perform scanning. The freeform mirror 509 reflects the projection light L to correct the distortion of the projection light L, and the corrected projection light L is condensed on the intermediate screen 510, whereby the intermediate image is displayed. The intermediate screen 510 is constituted by a microlens array in which microlenses are arranged two-dimensionally, and the projection light L incident on the intermediate screen 510 is enlarged in units of microlenses.

The movable apparatus 13 reciprocally moves the reflection surface 14 in two axial directions to two-dimensionally cause the projection light L incident on the reflection surface 14 to perform scanning. Driving control of the movable apparatus 13 is performed in synchronization with light emission timing of the laser light sources 501R, 501G, 501B.

Hereinabove, the head-up display device 500, which is an example of an image projection apparatus, has been explained, but the image projection apparatus may be an apparatus that projects an image by performing optical scanning with the movable apparatus 13 having the reflection surface 14. For example, an image projection apparatus may also be implemented in a similar manner as a projector placed on a desk and the like to project an image onto a display screen, a head mounted display apparatus mounted on a mounting member attached to the head and the like of an observer to project an image onto a transparent reflection screen of the mounting member or onto the retina of the eye as a screen, and the like.

The image projection apparatus may be mounted not only on a vehicle and a mounting member but also on, for example, moving bodies such as aircraft, ships, movable robots, and the like, and non-movable bodies such as a working robot, e.g., a manipulator for manipulating a manipulation target without moving from the spot.

Note that the head-up display device 500 is an example of a "head-up display". The automobile 400 is an example of a "vehicle".

<Optical Writing Apparatus>

Next, an optical writing apparatus including the movable apparatus 13 according to the present embodiment is explained in detail with reference to FIG. 7 and FIG. 8.

FIG. 7 is a schematic drawing of an image forming apparatus provided with an optical writing apparatus 600. FIG. 8 is a schematic drawing of an optical writing apparatus.

As illustrated in FIG. 7, the optical writing apparatus 600 is used as a constituent member of the image forming apparatus. The image forming apparatus may be, for example, a laser printer 650 having a printer function with laser light. In the image forming apparatus, the optical writing apparatus 600 scans a photosensitive drum serving as the scan surface 15 with one or multiple laser beams to optically write an image to the photosensitive drum.

As illustrated in FIG. 8, in the optical writing apparatus 600, laser light emitted from the light source apparatus 12 such as a laser device passes through an image forming optical system 601 such as a collimator lens and the like, and thereafter the laser light is deflected in a single axial direction or two axial directions by the movable apparatus 13 including the reflection surface 14. Thereafter, the laser light deflected by the movable apparatus 13 passes through a scanning optical system 602 including a first lens 602a, a second lens 602b, and a reflection mirror unit 602c to be emitted on the scan surface 15 (for example, a photosensitive drum and photosensitive paper) to perform optical writing. The scanning optical system 602 forms an optical beam in a spot shape on the scan surface 15. The light source apparatus 12 and the movable apparatus 13 including the reflection surface 14 are driven on the basis of control of the control apparatus 11.

In this manner, the optical writing apparatus 600 can be used as a constituent member of the image forming apparatus having the printer function with laser light. Also, the optical writing apparatus 600 can be used as a constituent member of an image forming apparatus such as a laser labeling apparatus that prints on a thermal medium by scanning and heating the thermal medium with laser light by deflecting the laser light not only in a single axial direction but also in two axial directions by controlling the scanning optical system.

The movable apparatus 13 having the reflection surface 14 used for the optical writing apparatus consumes less power to be driven as compared with a rotating polygon mirror, and is therefore advantageous in saving the power consumption of the optical writing apparatus. In addition, wind noise caused by vibration of the movable apparatus 13 is smaller than the rotating polygon mirror, and therefore, the movable apparatus 13 is advantageous in improving the quietness of the optical writing apparatus. Also, the optical writing apparatus occupies a much smaller space than the rotating polygon mirror, and the amount of heat generated by the movable apparatus 13 is negligible and accordingly, the size of the optical writing apparatus can be easily reduced. Therefore, the movable apparatus 13 having the reflection surface 14 used for the optical writing apparatus is advantageous in reducing the size of the image forming apparatus.

<Object Recognition Apparatus>

Next, an object recognition apparatus including the movable apparatus according to the present embodiment is explained in detail with reference to FIG. 9 and FIG. 10.

FIG. 9 is a schematic drawing of an automobile provided with a LiDAR (Laser Imaging Detection and Ranging) apparatus. The LiDAR apparatus is an example of an object recognition apparatus. FIG. 10 is a schematic drawing of the LiDAR apparatus.

The object recognition apparatus is an apparatus for recognizing an object in a target direction, and is, for example, a LiDAR apparatus.

As illustrated in FIG. 9, the LiDAR apparatus 700 is mounted on, for example, an automobile 701 to recognize a target object 702 by optically scanning in the target direction and receiving light reflected by the target object 702 existing in the target direction.

As illustrated in FIG. 10, the laser light emitted from the light source apparatus 12 passes through an incidence optical system including a collimator lens 703 and a plane mirror 704. The collimator lens 703 is for making diverging rays into substantially parallel rays. Then, the laser light is caused to perform scanning with the movable apparatus 13 including the reflection surface 14 in a single axial direction or two axial directions. Then, the laser light passes through a projection laser 705, i.e., a projection optical system, and the like, and the target object 702 in front of the LiDAR apparatus 700 is irradiated with the laser light that passes through the projection laser 705. The control apparatus 11 controls and drives the light source apparatus 12 and the movable apparatus 13. The reflected light reflected by the target object 702 is optically detected by the optical detector 709. Specifically, the reflected light passes through a collimating lens 706, i.e., an incident light detection and reception optical system, and the like to be received by an image-capturing device 707, and the image-capturing device 707 outputs a detection signal to a signal processing circuit 708. The signal processing circuit 708 performs predetermined processing such as binarization, noise processing, and the like on the received detection signal, and outputs the result to a distance measurement circuit 710.

The distance measurement circuit 710 recognizes presence of the target object 702 according to a time difference between a point in time when the light source apparatus 12 emits laser light and a point in time when the optical detector 709 receives the laser light or according to a phase difference in each pixel of the image received by the image-capturing device 707, and further, calculates distance information about the distance to the target object 702.

The movable apparatus 13 including the reflection surface 14 is less likely to be damaged than polygon mirrors and is small in size. Therefore, the movable apparatus 13 including the reflection surface 14 can provide a compact radar apparatus that has a high durability. Such a LiDAR apparatus is mounted on, for example, a vehicle, aircraft, a ship, a robot, and the like, and the LiDAR apparatus can recognize the presence of an obstacle and the distance to the obstacle by optically scanning a predetermined range.

With respect to the object recognition apparatus, the LiDAR apparatus 700 has been explained above as an example, and thus is not limited to the embodiment explained above. The object recognition apparatus may be an apparatus that recognizes the target object 702 by performing optical scan by causing the control apparatus 11 to control the movable apparatus 13 having the reflection surface 14 and causing the optical detector to receive the reflected light.

For example, the object recognition apparatus can also be similarly used in (i) a biometric authentication apparatus that recognizes a target object by calculating object information such as the shape from distance information obtained by optically scanning a hand or face and referring to the record, (ii) a security sensor that recognizes an intruding object by performing optical scanning in a target range, (iii) a three-dimensional scanner that calculates and recognizes object information such as the shape from distance information obtained by performing optical scanning and outputs the object information as three-dimensional data, and the like.

<Laser Headlamp>

Next, a laser headlamp 50 of an automobile, including the movable apparatus according to the present embodiment, is explained with reference to FIG. 11. FIG. 11 is a schematic diagram for explaining an example of a configuration of the laser headlamp 50.

The laser headlamp 50 includes a control apparatus 11, a light source apparatus 12b, the movable apparatus 13 including the reflection surface 14, a mirror 51, and a transparent plate 52.

The light source apparatus 12b is a light source emitting blue laser light. The light emitted from the light source apparatus 12b is incident on the movable apparatus 13 and reflected by the reflection surface 14. The movable apparatus 13 moves the reflection surface in the XY direction on the basis of a signal given by the control apparatus 11, and causes blue laser light emitted from the light source apparatus 12b to perform two-dimensional scanning in the XY direction.

The scanning light from the movable apparatus 13 is reflected by the mirror 51 and incident on the transparent plate 52. The front surface or the back surface of the transparent plate 52 is covered with a yellow fluorescent substance. As the blue laser light reflected by the mirror 51 passes through the coating of the yellow fluorescent substance on the transparent plate 52, the blue laser light changes to white light in a legal range prescribed as the color for headlights. As a result, the area ahead of the automobile is illuminated by the white light having passed through the transparent plate 52.

The scanning light from the movable apparatus 13 is scattered as the scanning light passes through the fluorescent substance of the transparent plate 52. This alleviates glare at the illumination target ahead the automobile.

In a case where the movable apparatus 13 is used for headlights of automobiles, the color of the light source apparatus 12b and the fluorescent substance are not limited to blue and yellow, respectively. For example, the light source apparatus 12 may be configured to emit near-ultraviolet light, and the transparent plate 52 may be covered with a uniform mixture of the fluorescent substances of the three primary colors of light, i.e., blue, green, and red. Even in this case, the light passing through the transparent plate 52 can be converted to white light, and the area ahead of the automobile can be illuminated by white light.

<Head Mount Display>

Next, a head mounted display 60 including the movable apparatus according to the present embodiment is explained with reference to FIGS. 12 and 13. Here, the head mounted display 60 is a head-mounted display that can be worn on the head of a person, and for example, may be configured to be in a shape similar to eyeglasses. The head mounted display is hereinafter abbreviated as HMD.

FIG. 12 is a drawing illustrating an example of the HMD 60. In FIG. 12, the HMD 60 is constituted by a pair of front parts 60a and a pair of temple parts 60b provided substantially symmetrically on the right and left sides. The front part 60a may be constituted by, for example, a light guide plate 61. An optical system, a control apparatus, and the like may be provided in the temple part 60b.

FIG. 13 is a drawing illustrating an example of a portion of the configuration of the HMD 60. Although FIG. 13 illustrates the configuration for the left eye, the HMD 60 also has the same configuration for the right eye.

The HMD 60 includes a control apparatus 11, a light source unit 530, a light quantity adjusting unit 507, the movable apparatus 13 including the reflection surface 14, a light guide plate 61, and a half mirror 62.

As described above, the light source unit 530 is obtained by unitizing, with an optical housing, the laser light sources 501R, 501G, 501B, the collimator lenses 502, 503, 504, and the dichroic mirrors 505, 506. In the light source unit 530, the laser lights in three colors emitted from the laser light sources 501R, 501G, 501B are combined by the dichroic mirrors 505, 506 which are a combining unit. The light source unit 530 emits combined parallel rays.

The light quantity of the light from the light source unit 530 is adjusted by the light quantity adjusting unit 507, and thereafter, the light is incident on the movable apparatus 13. The movable apparatus 13 moves the reflection surface 14 in the XY direction on the basis of a signal given by the control apparatus 11 to cause the light emitted from the light source unit 530 to perform two-dimensional scanning. The movable apparatus 13 is driven and controlled in synchronization with the light emission timing of the laser light sources 501R, 501G, 501B to generate scanning light which forms a color image.

The scanning light emitted from the movable apparatus 13 enters the light guide plate 61. The light guide plate 61 guides the scanning light to the half mirror 62 by reflecting the scanning light on the inner wall surface. The light guide plate 61 is made of resin or the like that is transparent to the wavelength of the scanning light.

The half mirror 62 reflects the light from the light guide plate 61 to the back side of the HMD 60 to emit the light in the direction of the eye of a wearer 63 of the HMD 60. The half mirror 62 has, for example, a free-form surface shape. An image of the scanning light is formed on the retina of the wearer 63 by the reflection at the half mirror 62. Alternatively, an image is formed on the retina of the wearer 63 by the reflection at the half mirror 62 and the lens effect of the crystalline lens in the eyeball. The spatial distortion of the image is corrected by the reflection at the half mirror 62. The wearer 63 can see the image formed by the light scanning in the XY direction.

With the half mirror 62, the wearer 63 can see an image formed by the light from the outside and an image formed by the scanning light in a superimposed manner. Alternatively, a mirror may be provided in place of the half mirror 62 to cut off the light from the outside, so that the HMD 60 is configured to enable the wearer to see only the image formed by the scanning light.

<Packaging>

Next, packaging of a movable apparatus according to the present embodiment is explained with reference to FIG. 14.

FIG. 14 is a schematic drawing of a packaged movable apparatus.

As illustrated in FIG. 14, the movable apparatus 13 is attached to an attachment member 802 provided inside a package member 801, and is packaged by a transparent member 803 that seals and covers a portion of the package member 801. Furthermore, the package is sealed with an inert gas such as nitrogen. This alleviates deterioration of the movable apparatus 13 due to oxidation, and improves the durability against environmental changes such as a change in the temperature.

The details of the movable apparatus according to the present embodiment used in the optical deflection system, the optical scanning system, the image projection apparatus, the optical writing apparatus, the object recognition apparatus, the laser headlamp, and the head mounted display explained above are hereinafter explained with reference to the drawings. In the drawings, similar constituent elements may be denoted by the same reference numerals and redundant description thereabout may be omitted.

In the description of the embodiment, optical scanning with the first axis as the center of rotation is referred to as sub-scanning, and optical scanning with the second axis as the center of rotation is referred to as main scanning. In the embodiments, "rotate", "swing", and "move" are assumed to be synonymous. Furthermore, of the directions indicated by arrows, the X direction is a direction parallel to the first axis, the Y direction is a direction parallel to the second axis, and the Z direction is the direction orthogonal to the XY plane. The Z direction is an example of "stacking direction".

First Embodiment

First, an optical deflector of a single axis (i.e., a movable apparatus) is explained. FIG. 15 is a plan view of an optical deflector 900 of both-end supported type capable of swinging around the first axis. As illustrated in FIG. 15, for example, the optical deflector 900 includes a mirror unit 901 in a circular shape, a mirror reflection surface 902 formed on a +Z surface of the substrate of the mirror unit 901, and the like. For example, the mirror unit 901 is made of a silicon layer. The mirror unit 901 may be made of, for example, an oxidizing material, an inorganic material, or an organic material. The mirror unit 901 may be made of, for example, multiple layers made of multiple materials or the same material. The mirror reflection surface 902 is made of, for example, a metal thin film or a multilayer film containing aluminum, gold, silver, and the like. A rib structure for reinforcement of the mirror unit may be formed on a −Z surface of the substrate of the mirror unit 901. The rib is made of, for example, a silicon support layer and a silicon oxide layer, and reduces the deformation distortion of the mirror unit 901 and the mirror reflection surface 902 caused by movement.

The movable unit 903 including the mirror unit 901 and the mirror reflection surface 902 is rotatably supported by support portions 904a, 904b constituting a pair of actuators. Specifically, one end portion (first end) of each of the support portions 904a, 904b is connected via a movable unit connection unit 905 to the movable unit 903. Opposite from the one end portion, the other end portion (second end) of each of the support portions 904a, 904b is connected to a fixed unit 908.

In FIG. 15, the fixed unit 908 is formed in a frame shape, but the fixed unit 908 does not have to be formed in the frame shape. The fixed unit 908 may have an actuator for applying deformation to the movable unit 903, or may be connected to an actuator for moving the fixed unit 908. The support portions 904a, 904b are provided with multiple beam units 915 extending in the Y direction. Adjacent beam units 915 are connected by connection units 916 alternately on the +Y side and the −Y side to form a meandering structure.

Specifically, the support portions 904a, 904b have a meandering structure (bellow structure) in which the beam units 915 extending in the Y direction are connected by the connection units 916 such that the beam units 915 wrap back. A piezoelectric driving unit group 925A and a piezoelectric driving unit group 925B are provided alternately on the +Z surfaces of the respective beam units 915. The fixed unit 908 is provided with electric contact electrode terminals 909. Electric wires (not illustrated) are provided to connect the electric contact electrode terminals 909 with the piezoelectric driving unit group 925A and the piezoelectric driving unit group 925B. Voltage signals are input to the electric contact electrode terminals 909 to apply voltage signals to the piezoelectric driving unit group 925A and the piezoelectric driving unit group 925B via the electric wires, so that the movable unit 903 including the mirror unit 901 can be rotated around the first axis, i.e., the X-axis of FIG. 1.

In the optical deflector 900, the lengths of the beam units 915 in the Y direction are formed to be substantially the same as one another, and the +Y end portions and the −Y end portions of the beam units 915 are aligned in the X axis direction.

FIG. 16 is a cross sectional view taken along the alternate long and short dashed line 15A-15B of FIG. 15. The substrates of the beam units 915 and the movable unit connection units 905 of the support portion 904a having the meandering structure are made of elastic silicon layers 930. Also, the substrates of the beam units 915 and the movable unit connection units 905 have rigidity, and may be made of any material that can be processed by a semiconductor process, such as inorganic materials, organic materials, metallic glass, and the like. Alternatively, the substrates of the beam units 915 and the movable unit connection units 905 may have a multilayer structure including multiple layers made of multiple materials.

The piezoelectric driving units constituting the piezoelectric driving unit group 925A and the piezoelectric driving unit group 925B are formed by stacking a lower electrode 931, a piezoelectric layer 932, and an upper electrode 933 in this order on the +Z surface of the elastic silicon layer 930. The lower electrode 931 and the upper electrode 933 are made of, for example, gold (Au) or platinum (Pt). The piezoelectric layer 932 is made of, for example, PZT (lead zirconate titanate), i.e., a piezoelectric material. However, the piezoelectric layer 932 may be made of other piezoelectric materials, and is not limited to any particular type. The piezoelectric driving unit may have a structure including multiple stacked piezoelectric layers and including an intermediate electrode. The piezoelectric driving unit is a piezoelectric actuator electrically connected to an external control apparatus and is configured to be driven with an application of a voltage. The piezoelectric driving units in the piezoelectric driving unit group 925A and the piezoelectric driving unit group 925B may be covered with insulating films, not illustrated, made of silicon oxide and the like, and electric wires may be formed on +Z surfaces of the insulating films.

The movable unit connection unit 905 includes a silicon layer 930, an interlayer film 941 stacked on a −Z surface of the silicon layer 930, and a support layer 942. The interlayer film 941 is formed by an insulating film such as silicon oxide. The support layer 942 is made of monocrystalline silicon, but as long as the support layer 942 can support silicon layer 390 and keep the silicon layer 930 fixed in place, the support layer 942 is not limited to silicon. Insulating films and electric wires, not illustrated, may be formed on +Z surfaces of the movable unit 903, the connection units 916, and the movable unit connection units 905.

In the optical deflector with the single axis having the structure as illustrated in FIG. 15, voltages are applied to the piezoelectric driving units in the piezoelectric driving unit group 925A and the piezoelectric driving unit group 925B, so that the movable unit 903 can be rotated around the first axis.

In order to improve the deflection angle of the mirror in the optical deflector with the single axis having the structure as illustrated in FIG. 15, it is conceivable to increase the lengths of the beam units 915 serving as vibration beams constituting the meandering structure. However, when the length of the beam unit 915 serving as the vibration beam is increased, the natural resonance frequency of the entire actuator decreases. Consequently, the mechanical strength decreases and shaking tends to occur.

Therefore, an optical deflector capable of alleviating the reduction in the natural resonance frequency and capable of obtaining a large scan angle is desired.

Next, a 2-axis optical deflector is explained. FIG. 17 is a plan view of an optical deflector 950 that is a dual-end supported type and is capable of swinging around the first axis and the second axis. In the 2-axis optical deflector, it is common to drive the optical deflector 950 to swing around one of the axes with resonant vibration at a mechanical resonant frequency and swing around the other of the axes with non-resonant vibration.

In the optical deflector 950 as illustrated in FIG. 17, a movable unit 953 including a mirror unit 901 and a mirror reflection surface 902 is supported by support portions 904a, 904b constituting a pair of actuators. One end of the movable unit 953 is connected to the mirror unit 901, and the other end of the movable unit 953 is connected to movable unit beams 957a, 957b. The optical deflector 950 includes torsion beams 956a, 956b supporting the mirror unit 901 so that the mirror unit 901 is interposed between the torsion beams 956a, 956b in the second axial direction. Both ends of the movable unit beams 957a, 957b are connected to the inner side of the movable unit 953 in the frame shape so that the torsion beams 956a, 956b are interposed between the movable unit beams 957a, 957b.

For example, in a case where the torsional resonance frequency of the torsion beams 956a, 956b is set to about 20 kHz, drive signals at around the resonance frequency are input to the piezoelectric driving units provided on the +Z surface of the movable unit beams 957a, 957b connected to the torsion beams 956a, 956b. As a result, the movable unit beams 957a, 957b vibrate to cause a torsion of mechanical resonance in the torsion beams 956a, 956b, so that the movable unit 953 can be vibrated around the second axis, i.e., the Y-axis of FIG. 1. Further, Lissajous scan and raster scan can be performed by combining this vibration around the second axis with the swing of the movable unit 953 around the first axis achieved with the support portions 904a, 904b of the meandering structure.

It is also desired that the 2-axis optical deflector 950 as illustrated in FIG. 17 be capable of alleviating the reduction in the natural resonance frequency and obtaining a large scan angle.

(Optical Deflector)

Next, an optical deflector 100 (i.e., a movable apparatus) according to the first embodiment is explained. FIG. 18 is a plan view of the optical deflector 100 that is a dual-end supported type and is capable of swinging the movable unit 103 around the first axis (rotation axis), i.e., the X-axis of FIG. 18. The optical deflector 100 according to the present embodiment is an optical deflector of a single axis as illustrated in FIG. 18.

As illustrated in FIG. 18, for example, the optical deflector 100 includes a mirror unit 101 in a circular shape, a mirror reflection surface 102 formed on a +Z surface of the substrate of the mirror unit 101, and the like. For example, the mirror unit 101 is made of a silicon layer. The mirror unit 101 may be made of, for example, an oxidizing material, an inorganic material, or an organic material. The mirror unit 101 may be made of, for example, multiple layers made of multiple materials or the same material. The mirror reflection surface 102 is made of, for example, a metal thin film or a multilayer film containing aluminum, gold, silver, and the like. A rib structure for reinforcement of the mirror unit may be formed on a −Z surface of the substrate of the mirror unit 101. The rib is made of, for example, a silicon support layer and a silicon oxide layer, and reduces the deformation distortion of the mirror unit 101 and the mirror reflection surface 102 caused by movement.

The movable unit 103, substantially in a circular shape and including the mirror unit 101 and the mirror reflection surface 102, is rotatably supported by support portions 104a, 104b constituting a pair of actuators. Specifically, one end portion (first end) of each of the support portions 104a, 104b is connected via a movable unit connection unit 105 to the movable unit 103. Opposite from the one end portion, the other end portion (second end) of each of the support portions 104a, 104b is connected to a fixed unit 108.

In FIG. 15, the fixed unit 108 is formed in a frame shape, but the fixed unit 108 does not have to be formed in the frame shape. The support portions 104a, 104b are provided with multiple beam units 115. Adjacent beam units 115 are connected by connection units 116 alternately on the +Y side and the −Y side to form a meandering structure. It should be noted that the mirror unit 101 and the movable unit 103 may be formed in an elliptic or polygonal shape.

The beam units 115 in the support portions 104a, 104b are formed to be in arc shapes, the center of which coincides with the center of the movable unit 103 substantially in a circular shape, and are formed to have the same width in the Y direction.

Specifically, as illustrated in FIG. 18, a line L1 connecting the +Y end portions of the multiple beam units 115 is formed to be parallel with the first axis, and a line L2 connecting the −Y end portions of the multiple beam units 115 is formed to be parallel with the first axis. Also, a line L3 connecting the +Y end portions of connection units 116 connecting the beam units 115 is formed to be parallel with the first axis, and a line L4 connecting the −Y end portions of connection units 116 connecting the beam units 115 is formed to be parallel with the first axis.

In the support portions 104a, 104b, the closer a beam unit 115 of the multiple beam units 115 is to the movable unit 103, the smaller the curvature radius of the beam unit 115 is. For example, in the support portion 104a, a curvature radius R12 of the beam unit 115 closest to the fixed unit 108 and farthest from the movable unit 103 is larger than a curvature radius R11 of the beam unit 115 closest to the movable unit 103. Since the widths of the beam units 115 in the Y direction are the same, the length of the beam unit 115 having the small curvature radius R11 and located closest to the movable unit 103 is greater than the length of the beam unit 115 having the large curvature radius R12 and located closest to the fixed unit 108.

A longer beam unit 115 can move more easily, and a shorter beam unit 115 is more rigid and moves less easily. In the present disclosure, the term "rigidity" is used. The term "rigidity" means a degree of resistance to movement caused by a certain force applied to a beam unit. In other words, when a certain force is applied, a more rigid beam unit moves less easily than a less rigid beam unit.

Therefore, in the optical deflector 100 according to the present embodiment, the farther a beam unit 115 of the multiple beam units 115 of the support portions 104a, 104b is to the movable unit 103, the shorter and thus the more rigid the beam unit 115 is. Specifically, if the support portions 104a, 104b are divided into two at a predetermined or given position, the beam units 115 closer to the movable unit 103 are longer than the beam units 115 closer to the fixed unit 108, and the beam units 115 closer to the fixed unit 108 have higher rigidities than the beam units 115 closer to the movable unit 103.

In FIG. 18, the movable unit 103 is supported by the two support portions 104a, 104b provided on the +X side and the −X side of the movable unit 103, but as explained later with reference to FIG. 24, the movable unit 103 may be supported by a single support portion to rotate around the first axis.

In a manner as described above, the support portions 104a, 104b constitute meandering structures in which the beam units 115 in the arc shapes are connected by the connection units 116 such that the beam units 115 wrap back. A piezoelectric driving unit group 125A and a piezoelectric driving unit group 125B are provided alternately on the +Z surfaces of the respective beam units 115. The fixed unit 108 is provided with electric contact electrode terminals 109. Electric wires (not illustrated) are provided to connect the electric contact electrode terminals 109 with the piezoelectric driving unit group 125A and the piezoelectric driving unit group 125B. Voltage signal are input to the electric contact electrode terminals 109 to apply voltage signals to the piezoelectric driving units in the piezoelectric driving unit group 125A and the piezoelectric driving unit group 125B via the electric wires, so that the movable unit 103 including the mirror unit 101 can be rotated around the first axis.

FIG. 19 is a cross sectional view taken along the alternate long and short dashed line 18A-18B of FIG. 18. The substrates of the beam units 115 of the support portion 104a having the meandering structure are made of elastic silicon layers 130. Also, the substrates of the beam units 115 have rigidity, and may be made of any material that can be processed by a semiconductor process, such as inorganic materials, organic materials, metallic glass, and the like. Alternatively, the substrates of the beam units 115 may have a multilayer structure including multiple layers made of multiple materials.

The piezoelectric driving units constituting the piezoelectric driving unit group 125A and the piezoelectric driving unit group 125B are formed by stacking a lower electrode 131, a piezoelectric layer 132, and an upper electrode 133 in this order on the +Z surface of the elastic silicon layer 130. The lower electrode 131 and the upper electrode 133 are made of, for example, gold (Au) or platinum (Pt). The piezoelectric layer 132 is made of, for example, PZT (lead zirconate titanate), i.e., a piezoelectric material. However, the piezoelectric layer 132 may be made of other piezoelectric materials, and is not limited to any particular type. The piezoelectric driving unit may have a structure including multiple stacked piezoelectric layers and including an intermediate electrode. The piezoelectric driving unit is a piezoelectric actuator electrically connected to an external control apparatus and is configured to be driven with an application of a voltage. The piezoelectric driving units in the piezoelectric driving unit group 125A and the piezoelectric driving unit group 125B may be covered with insulating films, not illustrated, made of silicon oxide and the like, and electric wires may be formed on +Z surfaces of the insulating films.

The movable unit connection unit 105 includes, in the following order, a silicon layer 130, an interlayer film stacked on a −Z surface of the silicon layer 130, and a silicon support layer. The interlayer film is formed by an insulating film such as silicon oxide. The support layer is made of monocrystalline silicon, but as long as the support layer can support the silicon layer 130 and keep the silicon layer 130 fixed in place, the support layer is not limited to silicon. Insulating films and electric wires, not illustrated, may be formed on +Z surfaces of the movable unit 103, the connection units 116, and the movable unit connection units 105.

In the optical deflector with the single axis having the structure as illustrated in FIG. 18, voltages are applied to the piezoelectric driving units in the piezoelectric driving unit group 125A and the piezoelectric driving unit group 125B, so that the movable unit 103 can be rotated around the first axis.

In the present embodiment, the beam units 115 closer to the fixed unit 108 are shorter and have higher rigidities than the beam units 115 closer to the movable unit 103. Accordingly, the entire length of the support portions 104a, 104b constituting the actuator is increased, and the rigidities of the beam units 115 closer to the fixed unit 108 are higher. Therefore, a large scan angle can be obtained with greater mechanical strength against resonance is increased. Note that, in a case where the rigidities of the beam units 115 closer to the fixed unit 108 are higher than the rigidities of the beam units 115 closer to the movable unit 103, the mechanical strength against resonance is higher than in a case where the rigidities of the beam units 115 closer to the movable unit 103 are higher than the rigidities of the beam units 115 closer to the fixed unit 108.

FIG. 20 illustrates a relationship between the resonance frequency of the first mode and the deflection angle of the mirror (i.e., the swing angle of the movable unit 103) in the optical deflector as illustrated in FIG. 15 and the optical deflector according to the present embodiment as illustrated in FIG. 18. The resonance frequency of the first mode is the lowest resonance frequency of the resonance frequencies. The deflection angle of the mirror corresponds to the scan angle of the mirror. As illustrated in FIG. 20, both the resonance frequency of the first mode and the deflection angle of the mirror are higher in the optical deflector according to the present embodiment as illustrated in FIG. 18 than in the optical deflector as illustrated in FIG. 15.

As illustrated in FIG. 18, in the optical deflector 100 according to the present embodiment, the line L1 connecting the +Y end portions of the multiple beam units 115 is formed to be parallel with the first axis, and the line L2 connecting the −Y end portions of the multiple beam units 115 is formed to be parallel with the first axis. In this manner, the widths between the first axis and the end portions of the beam units 115 contributing to the rotational moment are constant, so that the rotating force can be efficiently transmitted to the movable unit 103. Specifically, unless the widths between the first axis and the end portions of the beam units 115 are constant, vibrations contributing to the deflection angle become out-of-phase in the respective beam units 115, and these out-of-phase vibrations cause non-linear vibration when the deflection angle is increased, resulting in unstable rotation. Therefore, in order to stably rotate the movable unit 103 around the first axis, the widths between the first axis and the end portions of the beam units 115 are preferably constant.

FIG. 21 is a plan view of an optical deflector 100A according to a modification of the optical deflector 100 of the first embodiment. The optical deflector 100A of FIG. 21 includes divided fixed units 108.

FIG. 22 is a plan view of an optical deflector 100B according to a modification of the optical deflector 100 of the first embodiment. As illustrated in FIG. 22, the support portions 104a, 104b may be formed such that the widths between the end portions in the Y direction of the beam units 115 closer to the movable unit 103 are greater, and the widths between the end portions in the Y direction of the beam units 115 closer to the fixed unit 108 are smaller. In this case, in the support portions 104a, 104b, the lengths of the beam units 115 closer to the movable unit 103 can be increased more greatly than the lengths of the beam units 115 closer to the fixed unit 108.

In this case, as illustrated in FIG. 22, the support portion 104a is preferably in such a shape that an intersection between an extension line L11 connecting the end portions of +Y side connection units 116 and an extension line L12 connecting the end portions of −Y side connection units 116 is located on the first axis. Although not illustrated, the support portion 104b is preferably in a fan shape in which an intersection between an extension line connecting the end portions of +Y side connection units 116 and an extension line connecting the end portions of −Y side connection units 116 is located on the first axis. When the support portions 104a, 104b are formed such that the intersection between an extension line connecting the end portions of +Y side connection units 116 and the extension line connecting the end portions of −Y side connection units 116 is located on the first axis, the movable unit 103 can be swung around the first axis in a stable manner.

FIG. 23 is a plan view of an optical deflector 100C according to a modification of the optical deflector 100 of the first embodiment. As illustrated in FIG. 23, the optical deflector 100C may be formed such that the gap between the fixed unit 108 and support portions 104a, 104b is reduced.

FIG. 24 is a plan view of an optical deflector 100D according to a modification of the optical deflector 100 of the first embodiment. As illustrated in FIG. 24, the optical deflector 100D may include a single support portion 104a provided between the fixed unit 108 and the movable unit 103 to support the movable unit 103.

FIG. 25 is a plan view of an optical deflector 100E according to a modification of the optical deflector 100 of the first embodiment. As illustrated in FIG. 25, the optical deflector 100E may include three support portions, i.e., support portions 104c, 104d, 104e, provided between the fixed unit 108 and the movable unit 103 to support the movable unit 103. FIG. 26 is a plan view of an optical deflector 100F according to a modification of the optical deflector 100 of the first embodiment. As illustrated in FIG. 26, the optical deflector 100F may include four support portions, i.e., support portions 104f, 104g, 104h, 104i provided between the fixed unit 108 and the movable unit 103 to support the movable unit 103. In the optical deflectors 100E, 100F as illustrated in FIG. 25 and FIG. 26, respectively, the deflection direction of light is not limited to a single axis. The light can be deflected in multiple axial directions.

FIG. 27 is a plan view of an optical deflector 150 according to a modification of the optical deflector 100 of the first embodiment. As illustrated in FIG. 27, the optical deflector 150 is a 2-axis optical deflector.

In the optical deflector 150 as illustrated in FIG. 27, the movable unit 153, including the mirror unit 101 and the mirror reflection surface 102, is supported by the support portions 104a, 104b constituting a pair of actuators. One end of the movable unit 153 is connected to the mirror unit 101, and the other end of the movable unit 153 is connected to the movable unit beams 157a, 157b. The optical deflector 150 includes torsion beams 156a, 156b supporting the mirror unit 101 so that the mirror unit 101 is interposed between the torsion beams 156a, 156b in the second axial direction. Both ends of the movable unit beams 157a, 157b are connected to the inner side of the movable unit 153 in the frame shape.

In the present embodiment, the movable unit 153 is supported in such a manner that the movable unit 153 can be resonantly driven by the movable unit beams 157a, 157b. For example, in a case where the torsional resonance frequency of the torsion beams 156a, 156b is set to about 20 kHz, drive signals at around the resonance frequency are input to the piezoelectric driving units provided on the +Z surface of the movable unit beams 157a, 157b connected to the torsion beams 156a, 156b. As a result, the movable unit beams 157a, 157b vibrate to cause a torsion of mechanical resonance in the torsion beams 156a, 156b, so that the mirror unit 101 can be rotated around the second axis by the movable unit beams 157a, 157b.

In this 2-axis optical deflector, since the resonance frequency of vibration generated by the support portions 104a, 104b is high and the deflection angle is large, vibration-mixing with the vibration generated by the movable unit beams 157a, 157b can be alleviated.

In the above explanation, the piezoelectric layers 132 are provided on the support portions 104a, 104b constituting the actuator to achieve piezoelectric driving. Alternatively, in the present embodiment, the support portions 104a, 104b may be deformed by an electromagnetic field to achieve electromagnetic driving, or comb electrodes may be formed in the support portions 104a, 104b. Coils or magnet arrays may be formed on the support portions 104a, 104b constituting beams. The support portions 104a, 104b may be driven by either resonance driving or non-resonance driving.

Modified Embodiments of First Embodiment

Next, optical deflectors, i.e., movable apparatuses, according to the modified embodiments of the first embodiment are explained. In the modified embodiments of the first embodiment, not only the lengths but also the thicknesses and the widths are changed in the beam units of the support portions.

FIG. 28 is a plan view of an optical deflector according to a modified embodiment of the optical deflector 100 of the first embodiment. As illustrated in FIG. 28, the planar shape of the optical deflector according to the present embodiment is the same as the planar shape of the optical deflector illustrated in FIG. 18. Each of support portions 204a, 204b on both sides provided in the X direction of the movable unit 103 includes a beam unit 215a closer to the movable unit 103 and a beam unit 215b closer to the fixed unit 108. The beam unit 215b is thicker than the beam unit 215a.

FIG. 29 is a cross sectional view taken along the alternate long and short dashed line 28A-28B of FIG. 28. As illustrated in FIG. 29, the two beam units 215b closer to the fixed unit 108 are formed by stacking a lower electrode 131, a piezoelectric layer 132, and an upper electrode 133 in this order on the +Z surface of the silicon layer 130. A silicon oxide layer 231 and a silicon layer 232 are stacked in this order on the −Z surface of the silicon layer 130, and the thickness of the stacked silicon layer 232 is, for example, 30 μm to 40 μm. The two beam units 215a closer to the movable unit 103 are formed by stacking a lower electrode 131, a piezoelectric layer 132, and an upper electrode 133 in this order on the +Z surface of the silicon layer 130, but the beam units 215a do not include the silicon oxide layer 231 and the silicon layer 232 on the −Z surface. Therefore, the beam unit 215b is shorter and thicker than the beam unit 215a. As compared with the first embodiment, the beam unit 215b has an even higher rigidity than the beam unit 215a. Although FIG. 28 illustrates a structure in which two layers, i.e., the silicon oxide layer 231 and the silicon layer 232 are stacked in this order, a single layer may be formed on the −Z surface of the silicon layer 130.

FIG. 30 is a cross sectional view taken along the alternate long and short dashed line 28C-28D of FIG. 28. As illustrated in FIG. 30, a connection unit 216b connecting two beam units 215b is formed by stacking a silicon oxide layer 231, a silicon layer 232, a silicon oxide layer 233, and a silicon support layer 234 in this order on the −Z surface of the silicon layer 130. In contrast, in a connection unit 216a connecting two beam units 215a, nothing is provided on the −Z surface of the silicon layer 130. In this manner, on the side of the fixed unit 108, the silicon support layer 234 and the like are formed on the back surface of the connection unit connecting beam units constituting the meandering structure, and this is known to be effective for reducing unnecessary vibration of the natural mode and for improving the deflection efficiency per single beam unit. Therefore, the thickness of the connection unit 216b closer to the fixed unit 108 is greater than the thickness of the connection unit 216a closer to the movable unit 103, so that the effect of the present disclosure can be further enhanced.

Although FIG. 30 illustrates a structure in which multiple layers, i.e., the silicon oxide layer 231, the silicon layer 232, the silicon oxide layer 233, and the silicon support layer 234 formed on the back surface of the connection unit are stacked in this order, a single layer may be formed on the back surface of the connection unit. In this case, when there are many beam units, the thicknesses of layers formed on the back surface of the connection unit may be relatively increased toward the fixed unit 108 and relatively decreased toward the movable unit 103.

FIG. 31 is a plan view of an optical deflector according to a modified embodiment of the optical deflector 100 of the first embodiment. As illustrated in FIG. 31, widths of beam units 225 in support portions 214a, 214b supporting the movable unit 103 from both sides of the movable unit 103 in the X direction increase away from the movable unit 103 toward the fixed unit 108. When the width of the beam unit 225 is increased, the rigidity of the beam unit 225 increases. Specifically, from the movable unit 103 to the fixed unit 108, the lengths of the beam units 225 in the support portions 214a, 214b gradually decrease, and the widths of the beam units 225 in the support portions 214a, 214b in the support portions 214a, 214b gradually increase. In other words, in the support portions 214a, 214b, the lengths of the beam units 225 closer to the movable unit 103 are longer than the lengths of the beam units 225 closer to the fixed unit 108, and the rigidities of the beam units 225 closer to the fixed unit 108 are higher than the rigidities of the beam units 225 closer to the movable unit 103. Therefore, the effect of the present disclosure can be further enhanced.

FIG. 32 is a plan view of an optical deflector according to a modified embodiment of the optical deflector 100 of the first embodiment. As illustrated in FIG. 32, a connection unit 316b connecting the beam units 115 closer to the fixed unit 108 is formed to be wider than a connection unit 316a connecting the beam units 115 closer to the movable unit 103. In this manner, among the connection units connecting the beam units constituting the meandering structure, the width of the connection unit 316b closer to the fixed unit 108 is greater than the width of the connection unit 316a closer to the movable unit 103, so that the effect of the present disclosure can be further enhanced.

Second Embodiment

Next, an optical deflector 100-2 (i.e., a movable apparatus) according to the second embodiment is explained. The optical deflector 100-2 is configured in a manner similar to the optical deflector 100 according to the first embodiment except that the beam units 115 are formed in a shape different from the first embodiment as described below. In the second embodiment, constituent elements corresponding to the first embodiment are denoted with the same reference numerals as the reference numerals of the first embodiment, and repeated explanation thereabout is omitted as appropriate. FIG. 33 is a plan view of the optical deflector 100-2 that is a dual-end supported type and is capable of swinging the movable unit 103 around the first axis (rotation axis), i.e., the X-axis of FIG. 33. The optical deflector 100-2 is an optical deflector of a single axis as illustrated in FIG. 33.

The beam units 115 in the support portions 104a, 104b are formed to be in arc shapes, the center of which coincides with the center of the movable unit 103 substantially in a circular shape, and are formed such that the lengths of the beam units 115 gradually increase away from the movable unit 103 toward the fixed unit 108. Therefore, in the plan view (i.e., a seen in the Z direction), the shapes of the beam units 115 are arc shapes that are convex from the center of the movable unit 103 toward the fixed unit 108. Therefore, the beam units 115 closer to the fixed unit 108 are longer than the beam units 115 closer to the movable unit 103, and the beam units 115 closer to the movable unit 103 are lighter than the beam units 115 closer to the fixed unit 108. Specifically, if the support portions 104a, 104b are divided into two at a predetermined or given position, the beam units 115 closer to the fixed unit 108 are longer than the beam units 115 closer to the movable unit 103, and the beam units 115 closer to the movable unit 103 are lighter than the beam units 115 closer to the fixed unit 108.

In FIG. 33, the movable unit 103 is supported by the two support portions 104a, 104b provided on the +X side and the −X side of the movable unit 103, but as explained later with reference to FIG. 42, the movable unit 103 may be supported by a single support portion to rotate around the first axis.

In a manner as described above, the support portions 104a, 104b constitute meandering structures in which the beam units 115 in the arc shapes are connected by the connection units 116 such that the beam units 115 wrap back. A piezoelectric driving unit group 125A and a piezoelectric driving unit group 125B are provided alternately on the +Z surfaces of the respective beam units 115. The fixed unit 108 is provided with electric contact electrode terminals 109. Electric wires (not illustrated) are provided to connect the electric contact electrode terminals 109 with the piezoelectric driving unit group 125A and the piezoelectric driving unit group 125B. Voltage signal are input to the electric contact electrode terminals 109 to apply voltage signals to the piezoelectric driving unit group 125A and the piezoelectric driving unit group 125B via the electric wires, so that the movable unit 103 including the mirror unit 101 can be rotated around the first axis.

FIG. 34 is a cross sectional view taken along the alternate long and short dashed line 18A-18B of FIG. 33. The substrates of the beam units 115 of the support portion 104a having the meandering structure are made of elastic silicon layers 130. Also, the substrates of the beam units 115 have rigidity, and may be made of any material that can be processed by a semiconductor process, such as inorganic materials, organic materials, metallic glass, and the like. Alternatively, the substrates of the beam units 115 may have a multilayer structure including multiple layers made of multiple materials.

The piezoelectric driving units constituting the piezoelectric driving unit group 125A and the piezoelectric driving unit group 125B are formed by stacking a lower electrode 131, a piezoelectric layer 132, and an upper electrode 133 on the +Z surface of the elastic silicon layer 130. The lower electrode 131 and the upper electrode 133 are made of, for example, gold (Au) or platinum (Pt). The piezoelectric layer 132 is made of, for example, PZT (lead zirconate titanate), i.e., a piezoelectric material. However, the piezoelectric layer 132 may be made of other piezoelectric materials, and is not limited to any particular type. The piezoelectric driving unit may have a structure including multiple stacked piezoelectric layers and including an intermediate electrode. The piezoelectric driving unit is a piezoelectric actuator electrically connected to an external control apparatus and is configured to be driven with an application of a voltage. The +Z side of the piezoelectric driving units on the piezoelectric driving unit group 125A and the piezoelectric driving unit group 125B may be covered with insulating films, not illustrated, made of silicon oxide and the like, and electric wires may be formed on +Z surfaces of the insulating films.

The movable unit connection unit 105 includes a silicon layer 130, an interlayer film stacked on a −Z surface of the silicon layer 130, and a silicon support layer. The interlayer film is formed by an insulating film such as silicon oxide. The support layer is made of monocrystalline silicon, but as long as the support layer can support the silicon layer 130 and keep the silicon layer 130 fixed in place, the support layer is not limited to silicon. Insulating films and electric wires, not illustrated, may be formed on +Z surfaces of the movable unit 103, the connection units 116, and the movable unit connection units 105.

In the optical deflector with the single axis having the structure as illustrated in FIG. 33, voltages are applied to the piezoelectric driving units in the piezoelectric driving unit group 125A and the piezoelectric driving unit group 125B, so that the movable unit 103 can be rotated around the first axis.

In the present embodiment, the beam units 115 closer to the fixed unit 108 are longer than the beam units 115 closer to the movable unit 103, and the beam units 115 closer to the movable unit 103 are lighter than the beam units 115 closer to the fixed unit 108. Accordingly, the entire length of the support portions 104a, 104b constituting the actuator is increased, and the weights of the beam units 115 closer to the movable unit 103 are lower. Therefore, a large scan angle can be obtained while mechanical strength against resonance is increased.

FIG. 35 illustrates a relationship between the resonance frequency of the first mode and the deflection angle of the mirror (i.e., the swing angle of the movable unit 103) in the optical deflector as illustrated in FIG. 15 and in the optical deflector according to the present embodiment as illustrated in FIG. 33. The resonance frequency of the first mode is the lowest resonance frequency of the resonance frequencies. The deflection angle of the mirror corresponds to the scan angle of the mirror. As illustrated in FIG. 35, both the resonance frequency of the first mode and the deflection angle of the mirror are higher in the optical deflector according to the present embodiment as illustrated in FIG. 33 than in the optical deflector as illustrated in FIG. 15.

FIG. 36 is a plan view of an optical deflector 100-2A according to a modification of the optical deflector 100-2 of the second embodiment. The optical deflector 100-2A of FIG. 36 includes divided fixed units 108. FIG. 37 is a plan view of an optical deflector 100-2B according to a modification of the optical deflector 100-2 of the first embodiment. As illustrated in FIG. 37, the optical deflector 100-2B is formed such that the gap between the fixed unit 108 and support portions 104a, 104b is reduced.

FIG. 38 is a plan view of an optical deflector 100-2C according to a modification of the optical deflector 100 of the first embodiment. As illustrated in FIG. 38, the support portion 104a is preferably in a fan shape in which an intersection between an extension line L1a connecting the end portions of +Y side connection units 116 and an extension line L2a connecting the end portions of −Y side connection units 116 is located on the first axis. Likewise, the support portion 104b is preferably in a fan shape in which an intersection between an extension line L1b connecting the end portions of +Y side connection units 116 and an extension line L2b connecting the end portions of −Y side connection units 116 is located on the first axis. When the support portions 104a, 104b are formed such that an intersection between the extension line connecting the end portions of +Y side connection units 116 and the extension line connecting the end portions of −Y side connection units 116 is located on the first axis, the movable unit 103 can be stably swung around the first axis.

FIG. 39 is a plan view of an optical deflector 100-2D according to a modification of the optical deflector 100 of the first embodiment. As illustrated in FIG. 38, the optical deflector 100-2D is formed such that, in the support portions 104a, 104b, an intersection between an extension line L1 connecting the end portions of the connection unit 116 at one side and an extension line L2 connecting the end portions of the connection unit 116 at the other side coincides with the center of the movable unit 103. Therefore, the movable unit 103 can be swung around the first axis in a more stable manner.

FIG. 40 is a plan view of an optical deflector 100-2E according to a modification of the optical deflector 100 of the first embodiment. FIG. 41 is a plan view of an optical deflector 100-2F according to a modification of the optical deflector 100 of the first embodiment. As illustrated in FIG. 40, in the present embodiment, the movable unit 103 is formed in a substantially rectangular shape, and the beam units 115 are formed in a straight-line shape extending in the Y direction. FIG. 41 is a plan view of an optical deflector 100-2F according to a modification of the optical deflector 100 of the first embodiment. As illustrated in FIG. 41, parts of the beam units 115 are formed in a straight-line shape extending in the Y direction, and other portions of the beam units 115 are formed in arc shapes, the center of which coincides with the center of the movable unit 103. Even with such structure, the beam units 115 closer to the fixed unit 108 are longer than the beam units 115 closer to the movable unit 103, and the beam units 115 closer to the movable unit 103 are lighter than the beam units 115 closer to the fixed unit 108. Accordingly, the entire length of the support portions 104a, 104b constituting the actuator is increased, and the weights of the beam units 115 closer to the movable unit 103 are lower. Therefore, a large scan angle can be obtained while mechanical strength against resonance is increased.

FIG. 42 is a plan view of an optical deflector 100-2G according to a modification of the optical deflector 100-2 of the second embodiment. As illustrated in FIG. 42, the optical deflector 100-2G may include a single support portion 104a provided between the fixed unit 108 and the movable unit 103 to support the movable unit 103.

FIG. 43 is a plan view of an optical deflector according to a modification of the optical deflector 100-2 of the second embodiment. As illustrated in FIG. 43, the optical deflector includes three support portions, i.e., support portions 104c, 104d, 104e, provided between the fixed unit 108 and the movable unit 103 to support the movable unit 103. FIG. 44 is a plan view of an optical deflector according to a modification of the optical deflector 100-2 of the second embodiment. As illustrated in FIG. 44, the optical deflector may include four support portions, i.e., support portions 104f, 104g, 104h, 104i provided between the fixed unit 108 and the movable unit 103 to support the movable unit 103. In the optical deflectors as illustrated in FIG. 43 and FIG. 44, the deflection direction of light is not limited to a single axis. The light can be deflected in multiple axial directions.

FIG. 45 is a plan view of an optical deflector 150-2 according to a modification of the optical deflector 100-2 of the second embodiment. As illustrated in FIG. 45, the optical deflector 150-2 is a 2-axis optical deflector.

In the optical deflector 150-2 as illustrated in FIG. 45, the movable unit 153, including the mirror unit 101 and the mirror reflection surface 102, is supported by the support portions 104a, 104b constituting a pair of actuators. One end of the movable unit 153 is connected to the mirror unit 101, and the other end of the movable unit 153 is connected to the movable unit beams 157a, 157b. The optical deflector 150-2 includes torsion beams 156a, 156b supporting the mirror unit 101 so that the mirror unit 101 is interposed between the torsion beams 156a, 156b in the second axial direction. Both ends of the movable unit beams 157a, 157b are connected to the inner side of the movable unit 153 in the frame shape.

In the optical deflector 150-2 as illustrated in FIG. 45, the movable unit 153 is supported in such a manner that the movable unit 153 can be resonantly driven by the movable unit beams 157a, 157b. For example, in a case where the torsional resonance frequency of the torsion beams 156a, 156b is set to about 20 kHz, drive signals at around the resonance frequency are input to the piezoelectric driving units provided on the +Z surface of the movable unit beams 157a, 157b connected to the torsion beams 156a, 156b. As a result, the movable unit beams 157a, 157b vibrate to cause a torsion of mechanical resonance in the torsion beams 156a, 156b, so that the mirror unit 101 can be rotated around the second axis by the movable unit beams 157a, 157b. Further, Lissajous scan and raster scan can be performed by combining this vibration around the second axis with the swing of the movable unit 103 around the first axis achieved with the support portions 104a, 104b of the meandering structure.

With this 2-axis optical deflector, even if the vibration generated by the support portions 104a, 104b propagates to the movable unit beams 157a, 157b, the beam units 115 closer to the movable unit 153 are shorter than and are deformed less easily than the beam units 115 closer to the fixed unit 108 in the support portions 104a, 104b. Therefore, the movable unit beams 157a, 157b are less affected by the vibration of the beam units 115 in the support portions 104a, 104b.

In the above explanation, the piezoelectric layers 132 are provided on the support portions 104a, 104b constituting the actuator to achieve piezoelectric driving. Alternatively, in the optical deflector 150-2 as illustrated in FIG. 45, the support portions 104a, 104b may be deformed by an electromagnetic field to achieve electromagnetic driving, or comb electrodes may be formed in the support portions 104a, 104b. Coils or magnet arrays may be formed on the support portions 104a, 104b constituting beams. The support portions 104a, 104b may be driven by either resonance driving or non-resonance driving.

Modified Embodiments of Second Embodiment

Next, optical deflectors, i.e., movable apparatuses, according to the modified embodiments of the second embodiment are explained. In the modified embodiments of the second embodiment, not only the lengths but also the thicknesses and the widths are changed in the beam units of the support portions.

FIG. 46 is a plan view of an optical deflector according to a modified embodiment of the optical deflector 100-2 of the second embodiment. As illustrated in FIG. 46, the planar shape of the optical deflector according to the present embodiment is the same as the planar shape of the optical deflector illustrated in FIG. 33. Each of support portions 204a, 204b on both sides provided in the X direction of the movable unit 103 includes a beam unit 215a closer to the movable unit 103 and a beam unit 215b closer to the fixed unit 108. The beam unit 215b is thicker than the beam unit 215a.

FIG. 47 is a cross sectional view taken along the alternate long and short dashed line 31A-31B of FIG. 46. As illustrated in FIG. 47, the two beam units 215b closer to the fixed unit 108 are formed by stacking a lower electrode 131, a piezoelectric layer 132, and an upper electrode 133 in this order on the +Z surface of the silicon layer 130. A silicon oxide layer 231 and a silicon layer 232 are stacked in this order on the −Z surface of the silicon layer 130, and the thickness of the stacked silicon layer 232 is, for example, 30 μm to 40 μm. The two beam units 215a closer to the movable unit 103 are formed by stacking a lower electrode 131, a piezoelectric layer 132, and an upper electrode 133 in this order on the +Z surface of the silicon layer 130, but the beam units 215a do not include the silicon oxide layer 231 and the silicon layer 232 on the −Z surface. Therefore, as compared with the first embodiment, the beam unit 215a is lighter than the beam unit 215b. Although FIG. 47 illustrates a structure in which two layers, i.e., the silicon oxide layer 231 and the silicon layer 232 are stacked in this order, a single layer may be formed on the −Z surface of the silicon layer 130.

FIG. 48 is a cross sectional view taken along the alternate long and short dashed line 31C-31D of FIG. 46. As illustrated in FIG. 48, a connection unit 216b connecting two beam units 215b is formed by stacking a silicon oxide layer 231, a silicon layer 232, a silicon oxide layer 233, and a silicon support layer 234 in this order on the −Z surface of the silicon layer 130. In contrast, in a connection unit 216a connecting two beam units 215a, nothing is provided on the −Z surface of the silicon layer 130. In this manner, on the side of the fixed unit 108, the silicon support layer 234 and the like are formed on the back surface of the connection unit connecting beam units constituting the meandering structure, and this is known to be effective for reducing vibration of unnecessary natural mode and for improving the deflection efficiency per single beam unit. Therefore, the thickness of the silicon support layer 234 and the like closer to the fixed unit 108 is greater than the thickness of the silicon support layer 234 and the like closer to the movable unit 103, so that the effect of the present disclosure can be further enhanced.

Although FIG. 48 illustrates a structure in which multiple layers, i.e., the silicon oxide layer 231, the silicon layer 232, the silicon oxide layer 233, and the silicon support layer 234 formed on the back surface of the connection unit are stacked in this order, a single layer may be formed on the back surface of the connection unit. In this case, when there are many beam units, the thicknesses of layers formed on the back surface of the connection unit may be relatively increased toward the fixed unit 108 and relatively decreased toward the movable unit 103.

FIG. 49 is a drawing illustrating an example of connection units having different curvature radiuses at corner portions according to a modified embodiment of the second embodiment. As illustrated in FIG. 49, the curvature radius of the corner portion 217a of the connection units 216a closer to the movable unit 103 may be formed to be larger than the curvature radius of the corner portion 217b of the connection units 216b closer to the fixed unit 108. In accordance with the increase in the curvature radius of the corner portion, the size of the cutout for forming the corner portion increases, and accordingly, the weight can be reduced.

FIG. 50 is a plan view of an optical deflector according to a modified embodiment of the optical deflector 100-2 of the second embodiment. As illustrated in FIG. 50, the widths of the beam units 225 in the support portions 214a, 214b supporting the movable unit 103 from both sides of the movable unit 103 in the X direction may be increased away from the movable unit 103 toward the fixed unit 108. When the width of the beam unit 225 is increased, the weight increases. Specifically, from the movable unit 103 to the fixed unit 108, the lengths of the beam units 225 in the support portions 214a, 214b gradually increase, and the widths of the beam units 225 in the support portions 214a, 214b gradually increase. Therefore, in the support portions 214a, 214b, the weights of the beam units 225 closer to the fixed unit 108 are heavier than the weights of the beam units 225 closer to the movable unit 103, and the effect of the present disclosure can be further enhanced.

FIG. 51 is a plan view of an optical deflector 100-2 according to a modified embodiment of the optical deflector 100-2 of the second embodiment. As illustrated in FIG. 51, the connection unit 316b connecting the beam units 115 closer to the fixed unit 108 may be formed to be wider than the connection unit 316a connecting the beam units 115 closer to the movable unit 103. In this manner, among the connection units connecting the beam units constituting the meandering structure, the width of the connection unit 316b closer to the fixed unit 108 is greater than the width of the connection unit 316a closer to the movable unit 103. Therefore, the effect of the present disclosure can be further enhanced.

Third Embodiment

Next, an optical deflector 100-3 (i.e., a movable apparatus) according to the third embodiment is explained. The optical deflector 100-3 is configured in a manner similar to the optical deflector 100 according to the first and second embodiments except that the beam units 115 are formed in a shape different from the first and second embodiments as described below. In the third embodiment, constituent elements corresponding to the first and second embodiments are denoted with the same reference numerals as the reference numerals of the first and second embodiment, and repeated explanation thereabout is omitted as appropriate. Also, the drawings referred to in the first and second embodiments are referred to in this third embodiment as necessary.

Before the optical deflector 100-3 according to the third embodiment is explained, technology related to the third embodiment is hereinafter explained. In recent years, with the development of micromachining technology, progress has been made in the development of MEMS (Micro Electro Mechanical Systems) devices. An example of a known MEMS device includes a movable apparatus as described in PTL 1, for example. A two-dimensional optical deflection apparatus and an image display apparatus are implemented with such a movable apparatus. In order to increase a mechanical driving sensitivity and obtaining a large scan angle with an optical deflector (an example of a movable apparatus), it is conceivable to increase the lengths of beam units serving as vibration beams constituting the meandering structure. However, when the length of the beam unit serving as the vibration beam is increased, there is a problem in that the natural resonance frequency of the entire actuator decreases and consequently, the mechanical strength decreases and shaking tends to occur, and there is a problem in that it is difficult to reduce the size of the movable apparatus.

First, an optical deflector of a single axis (i.e., a movable apparatus) is explained. FIG. 15 is a plan view of an optical deflector 900 that is a dual-end supported type and is capable of swinging around the first axis. As illustrated in FIG. 15, for example, the optical deflector 900 includes a mirror unit 901 in a circular shape, a mirror reflection surface 902 formed on a +Z surface of the substrate of the mirror unit 901, and the like. For example, the mirror unit 901 is made of a silicon layer. The mirror unit 901 may be made of, for example, an oxidizing material, an inorganic material, or an organic material. The mirror unit 901 may be made of, for example, multiple layers made of multiple materials or the same material. The mirror reflection surface 902 is made of, for example, a metal thin film or a multilayer film containing aluminum, gold, silver, and the like. A rib structure for reinforcement of the mirror unit may be formed on a −Z surface of the substrate of the mirror unit 901. The rib is made of, for example, a silicon support layer and a silicon oxide layer, and reduces the deformation distortion of the mirror unit 901 and the mirror reflection surface 902 caused by movement.

The movable unit 903 including the mirror unit 901 and the mirror reflection surface 902 is rotatably supported by support portions 904a, 904b constituting a pair of actuators. Specifically, one end portion (first end) of each of the support portions 904a, 904b is connected via a movable unit connection unit 905 to the movable unit 903. Opposite from the one end portion, the other end portion (second end) of each of the support portions 904a, 904b is connected to a fixed unit 908.

In FIG. 15, the fixed unit 908 is formed in a frame shape, but the fixed unit 908 does not have to be formed in the frame shape. The fixed unit 908 may have an actuator for applying deformation to the fixed unit 908, or may be connected to an actuator for moving the fixed unit 908. The support portions 904a, 904b are provided with multiple beam units 915 extending in the Y direction. Adjacent beam units 915 are connected by connection units 916 alternately on the +Y side and the −Y side to form a meandering structure.

Specifically, the support portions 904a, 904b have a meandering structure (bellow structure) in which the beam units 915 extending in the Y direction are connected by the connection units 916 such that the beam units 915 wrap back. A piezoelectric driving unit group 925A and a piezoelectric driving unit group 925B are provided alternately on the +Z surfaces of the respective beam units 915. The fixed unit 908 is provided with electric contact electrode terminals 909. Electric wires (not illustrated) are provided to connect the electric contact electrode terminals 909 with the piezoelectric driving unit group 925A and the piezoelectric driving unit group 925B. Voltage signal are input to the electric contact electrode terminals 909 to apply voltage signals to the piezoelectric driving unit group 925A and the piezoelectric driving unit group 925B via the electric wires, so that the movable unit 903 including the mirror unit 901 can be rotated around the first axis, i.e., the X-axis of FIG. 1.

In the optical deflector 900, the lengths of the beam units 915 in the Y direction are formed to be substantially the same as one another, and the +Y end portions and the −Y end portions of the beam units 915 are aligned in the X axis direction.

FIG. 16 is a cross sectional view taken along the alternate long and short dashed line 1A-1B of FIG. 15. The substrates of the beam units 915 and the movable unit connection units 905 of the support portion 904a having the meandering structure are made of elastic silicon layers 930. Also, the substrates of the beam units 915 and the movable unit connection units 905 have rigidity, and may be made of any material that can be processed by a semiconductor process, such as inorganic materials, organic materials, metallic glass, and the like. Alternatively, the substrates of the beam units 915 and the movable unit connection units 905 may have a multilayer structure including multiple layers made of multiple materials.

The piezoelectric driving units constituting the piezoelectric driving unit group 925A and the piezoelectric driving unit group 925B are formed by stacking a lower electrode 931, a piezoelectric layer 932, and an upper electrode 933 in this order on the +Z surface of the elastic silicon layer 930. The lower electrode 931 and the upper electrode 933 are made of, for example, gold (Au) or platinum (Pt). The piezoelectric layer 932 is made of, for example, PZT (lead zirconate titanate), i.e., a piezoelectric material. However, the piezoelectric layer 932 may be made of other piezoelectric materials, and is not limited to any particular type. The piezoelectric driving unit may have a structure including multiple stacked piezoelectric layers and including an intermediate electrode. The piezoelectric driving unit is a piezoelectric actuator electrically connected to an external control apparatus and is configured to be driven with an application of a voltage. The piezoelectric driving units on the piezoelectric driving unit group 925A and the piezoelectric driving unit group 925B may be covered with insulating films, not illustrated, made of silicon oxide and the like, and electric wires may be formed on +Z surfaces of the insulating films.

The movable unit connection unit 905 includes a silicon layer 930, an interlayer film 941 stacked on a −Z surface of the silicon layer 930, and a support layer 942. The interlayer film 941 is formed by an insulating film such as silicon oxide. The support layer 942 is made of monocrystalline silicon, but as long as the support layer 942 can support the silicon layer 930 and keep the silicon layer 930 fixed in place, the support layer 942 is not limited to silicon. Insulating films and electric wires, not illustrated, may be formed on +Z surfaces of the movable unit 903, the connection units 916, and the movable unit connection units 905.

In the optical deflector with the single axis having the structure as illustrated in FIG. 15, voltages are applied to the piezoelectric driving units in the piezoelectric driving unit group 925A and the piezoelectric driving unit group 925B, so that the movable unit 903 can be rotated around the first axis.

In order to improve the deflection angle of a mirror in an optical deflector with a single axis having the structure as illustrated in FIG. 15, it is conceivable to increase the lengths of the beam units 915 serving as vibration beams constituting the meandering structure. However, when the length of the beam unit 915 serving as the vibration beam is increased, the natural resonance frequency of the entire actuator decreases. Consequently, the mechanical strength decreases and shaking tends to occur.

Therefore, an optical deflector capable of alleviating the reduction in the natural resonance frequency and capable of obtaining a large scan angle is desired.

Next, a 2-axis optical deflector is explained. FIG. 17 is a plan view of an optical deflector 950 that is a dual-end supported type and is capable of swinging around the first axis and the second axis. In the 2-axis optical deflector, it is common to drive the optical deflector 950 to swing around one of the axes with resonant vibration at a mechanical resonant frequency and swing around the other of the axes with non-resonant vibration.

In the optical deflector 950 as illustrated in FIG. 17, a movable unit 953 including a mirror unit 901 and a mirror reflection surface 902 is supported by support portions 904a, 904b constituting a pair of actuators. One end of the movable unit 953 is connected to the mirror unit 901, and the other end of the movable unit 953 is connected to movable unit beams 957a, 957b. The optical deflector 950 includes torsion beams 956a, 956b supporting the mirror unit 901 so that the mirror unit 901 is interposed between the torsion beams 956a, 956b in the second axial direction. Both ends of the movable unit beams 957a, 957b are connected to the inner side of the movable unit 953 in the frame shape so that the torsion beams 956a, 956b are interposed between the movable unit beams 957a, 957b.

For example, in a case where the torsional resonance frequency of the torsion beams 956a, 956b is set to about 20 kHz, drive signals at around the resonance frequency are input to the piezoelectric driving units provided on the +Z surface of the movable unit beams 957a, 957b connected to the torsion beams 956a, 956b. As a result, the movable unit beams 957a, 957b vibrate to cause a torsion of mechanical resonance in the torsion beams 956a, 956b, so that the movable unit 953 can be vibrated around the second axis, i.e., the Y-axis of FIG. 1. Further, Lissajous scan and raster scan can be performed by combining this vibration around the second axis with the swing of the movable unit 953 around the first axis achieved with the support portions 904a, 904b of the meandering structure.

The 2-axis optical deflector 950 as illustrated in FIG. 17 is also desired to alleviate the reduction in the natural resonance frequency and obtain a large scan angle.

(Optical Deflector)

Next, the optical deflector 100-3 (i.e., a movable apparatus) according to the third embodiment is explained. FIG. 52 is a plan view of the optical deflector 100-3 that is a dual-end supported type and is capable of swinging the movable unit 103 around the first axis (rotation axis), i.e., the X-axis of FIG. 52. The optical deflector 100 according to the present embodiment is an optical deflector of a single axis as illustrated in FIG. 52.

As illustrated in FIG. 52, for example, the optical deflector 100 includes a mirror unit 101 in a circular shape, a mirror reflection surface 102 formed on a +Z surface of the substrate of the mirror unit 101, and the like. For example, the mirror unit 101 is made of a silicon layer. The mirror unit 101 may be made of, for example, an oxidizing material, an inorganic material, or an organic material. The mirror unit 101 may be made of, for example, multiple layers made of multiple materials or the same material.

The mirror reflection surface 102 is made of, for example, a metal thin film or a multilayer film containing aluminum, gold, silver, and the like. A rib structure for reinforcement of the mirror unit may be formed on a −Z surface of the substrate of the mirror unit 101. The rib is made of, for example, a silicon support layer and a silicon oxide layer, and reduces the deformation distortion of the mirror unit 101 and the mirror reflection surface 102 caused by movement.

The movable unit 103, substantially in the circular shape and including the mirror unit 101 and the mirror reflection surface 102, is rotatably supported by support portions 104a, 104b constituting a pair of actuators. Specifically, one end portion (first end) of each of the support portions 104a, 104b is connected via a movable unit connection unit 105 to the movable unit 103. Opposite from the one end portion, the other end portion (second end) of each of the support portions 104a, 104b is connected to a fixed unit 108.

In FIG. 52, the fixed unit 108 is formed in a frame shape, but the fixed unit 108 does not have to be formed in the frame shape. The support portions 104a, 104b are provided with multiple beam units 115. Adjacent beam units 115 are connected by connection units 116 alternately on the +Y side and the −Y side to form a meandering structure.

It should be noted that the mirror unit 101 and the movable unit 103 may be formed in an elliptic or polygonal shape. In the support portions 104a, 104b, connection units 116 connecting adjacent beam units 115 do not have to connect end portions in the longitudinal direction of the adjacent beam units 115, and may connect portions closer to the central portion than the end portions in the longitudinal direction of the adjacent beam units 115.

The support portions 104a, 104b include: multiple beam units 115 serving as vibration beams; and connection units 116 connecting adjacent beam units 115. The support portions 104a, 104b have two beam unit groups having different characteristics. The two beam unit groups are obtained by dividing the support portions 104a, 104b at a predetermined or given portion.

Specifically, the support portion 104a includes: a first beam unit group 141a which is a beam unit group closer to the fixed unit 108; and a second beam unit group 141b which is a beam unit group closer to the movable unit 103. The support portion 104b includes: a first beam unit group 142a which is a beam unit group closer to the fixed unit 108; and a second beam unit group 142b which is a beam unit group closer to the movable unit 103.

The beam units 115 in the first beam unit groups 141a, 142a are formed to be in arc shapes, the center of which coincides with the center of the movable unit 103 substantially in a circular shape, and are formed to have the same width in the Y direction.

Specifically, as illustrated in FIG. 52, a line L1 connecting the +Y end portions of the multiple beam units 115 in the first beam unit groups 141a, 142a is formed to be parallel with the first axis, and a line L2 connecting the −Y end portions of the multiple beam units 115 in the first beam unit groups 141a, 142a is formed to be parallel with the first axis. Also, a line L3 connecting the +Y end portions of connection units 116 connecting the beam units 115 is formed to be parallel with the first axis, and a line L4 connecting the −Y end portions of connection units 116 connecting the beam units 115 is formed to be parallel with the first axis.

In the first beam unit groups 141a, 142a, the curvature radius of the beam unit 115 decreases in accordance with the decrease in the distance from the movable unit 103. For example, in the first beam unit group 141a, a curvature radius R12 of the beam unit 115 close to the fixed unit 108 and far from the movable unit 103 is larger than a curvature radius R11 of the beam unit 115 close to the movable unit 103.

Since the widths of the beam units 115 in the Y direction are the same, the length of the beam unit 115 having the small curvature radius R11 and located close to the movable unit 103 is greater than the length of the beam unit 115 having the large curvature radius R12 and located close to the fixed unit 108. In a case where there are three or more beam units 115 in the first beam unit groups 141a, 142a, the length of a beam unit 115 having a smaller curvature radius and located close to the movable unit 103 is larger than the length of a beam unit 115 having a larger curvature radius and located close to the fixed unit 108.

A longer beam unit 115 can move more easily, and a shorter beam unit 115 is more rigid and moves less easily. In the present disclosure, a term "rigidity" means a degree of resistance to movement caused by a certain force applied to a beam unit. In other words, when a certain force is applied, a more rigid beam unit moves less easily than a less rigid beam unit.

Therefore, in the optical deflector 100 according to the present embodiment, in accordance with the increase in the distance from the movable unit 103, the beam units 115 in the first beam unit groups 141a, 142a become shorter and thus have higher rigidities. Specifically, if the first beam unit groups 141a, 142a are divided into two at a predetermined or given position, the beam unit 115 closer to the movable unit 103 are longer than the beam unit 115 closer to the fixed unit 108, and the beam unit 115 closer to the fixed unit 108 have higher rigidities than the beam unit 115 closer to the movable unit 103.

When the first beam unit groups 141a, 142a are divided into two at a predetermined or given position, there may be multiple beam units 115 in a beam unit group closer to the movable unit 103 and multiple beam units 115 in a beam unit group closer to the fixed unit 108. In this case, in the first beam unit groups 141a, 142a, the multiple beam units 115 in the beam unit group closer to the movable unit 103 are longer than the multiple beam units 115 in the beam unit group closer to the fixed unit 108, and the multiple beam units 115 in the beam unit group closer to the fixed unit 108 have higher rigidities than the multiple beam units 115 in the beam unit group closer to the movable unit 103.

The beam units 115 in the second beam unit groups 141b, 142b are formed to be in arc shapes, the center of which coincides with the center of the movable unit 103 substantially in a circular shape, and are formed such that the lengths of the beam units 115 gradually increase away from the movable unit 103 toward the fixed unit 108. Therefore, in the plan view (i.e., a seen in the Z direction), the shapes of the beam units 115 are arc shapes that are convex from the center of the movable unit 103 toward the fixed unit 108.

Therefore, the beam units 115 closer to the fixed unit 108 are longer than the beam units 115 closer to the movable unit 103, and the beam units 115 closer to the movable unit 103 are lighter than the beam units 115 closer to the fixed unit 108.

Specifically, if the second beam unit groups 141b, 142b are divided into two at a predetermined or given position, the beam units 115 closer to the fixed unit 108 are longer than the beam units 115 closer to the movable unit 103, and the beam units 115 closer to the movable unit 103 are lighter than the beam units 115 closer to the fixed unit 108.

When the second beam unit groups 141b, 142b are divided into two at a predetermined or given position, there may be multiple beam units 115 in a beam unit group closer to the movable unit 103 and multiple beam units 115 in a beam unit group closer to the fixed unit 108. In this case, in the second beam unit groups 141b, 142b, the multiple beam units 115 in the beam unit group closer to the fixed unit 108 are longer than the multiple beam units 115 in the beam unit group closer to the movable unit 103, and the multiple beam units 115 in the beam unit group closer to the movable unit 103 are lighter than the multiple beam units 115 in the beam unit group closer to the fixed unit 108.

The second beam unit groups 141b, 142b are preferably in a fan shape in which an intersection between an extension line L5 connecting the end portions of +Y side connection units 116 and an extension line L6 connecting the end portions of −Y side connection units 116 is located on the first axis. When the second beam unit groups 141b, 142b are formed in a fan shape in which an intersection between an extension line connecting the end portions of +Y side connection units 116 and an extension line connecting the end portions of −Y side connection units 116 is located on the first axis, the movable unit 103 can be stably swung around the first axis.

The second beam unit groups 141b, 142b may be formed such that the intersection between the extension line L5 connecting the end portions of +Y side connection units 116 and the extension line L6 connecting the end portions of −Y side connection units 116 coincides with the center of the movable unit 103. In this case, the movable unit 103 can be swung around the first axis in a more stable manner.

If there is an object that reflects light around the mirror reflection surface 102 of the movable unit 103, light reflected at the location of the object results in stray light with respect to desired reflected light which reduces the signal-to-noise ratio. Specifically, the performance of a module including the optical deflector 100 is reduced. For example, if the module is an image projection apparatus, the image quality is reduced, and if the module is an optical inspection apparatus, the detection accuracy is reduced.

Therefore, a gap, in which nothing but the connection unit with the beam units 115 exists, is preferably provided around the mirror reflection surface 102 of the movable unit 103. Specifically, a gap of a substantially constant width is preferably formed, along the outermost peripheral portion of the movable unit 103, between the outermost peripheral portion of the movable unit 103 and the innermost peripheral portion of the beam unit 115 closest to the movable unit 103 in the second beam unit groups 141b, 142b. In order to not only avoid stray light but also reduce the production process error, the gap formed between the outermost peripheral portion of the movable unit 103 and the innermost peripheral portion of the beam unit 115 preferably has a substantially constant width along the outermost peripheral portion of the movable unit 103. In this case, the substantially constant width means that errors such as variation of production in semiconductor processes are tolerated.

In FIG. 52, the movable unit 103 is supported by the two support portions 104a, 104b provided on the +X side and the −X side of the movable unit 103, but as explained later, the movable unit 103 may be supported by a single support portion to rotate around the first axis, or may be supported by multiple support portions to rotate around multiple axes.

In a manner as described above, the support portions 104a, 104b have a meandering structure in which the beam units 115 are connected by the connection units 116 such that the beam units 115 wrap back. A piezoelectric driving unit group 125A and a piezoelectric driving unit group 125B are provided alternately on the +Z surfaces of the respective beam units 115. The fixed unit 108 is provided with electric contact electrode terminals 109. Electric wires (not illustrated) are provided to connect the electric contact electrode terminals 109 with the piezoelectric driving unit group 125A and the piezoelectric driving unit group 125B. Voltage signal are input to the electric contact electrode terminals 109 to apply voltage signals to the piezoelectric driving unit group 125A and the piezoelectric driving unit group 125B via the electric wires, so that the movable unit 103 including the mirror unit 101 can be rotated around the first axis.

FIG. 53 is a cross sectional view taken along the alternate long and short dashed line 4A-4B of FIG. 52. The substrates of the beam units 115 of the support portions 104a, 104b having the meandering structure are made of elastic silicon layers 130. Also, the substrates of the beam units 115 have rigidity, and may be made of any material that can be processed by a semiconductor process, such as inorganic materials, organic materials, metallic glass, and the like. Alternatively, the substrates of the beam units 115 may have a multilayer structure including multiple layers made of multiple materials.

The piezoelectric driving units constituting the piezoelectric driving unit group 125A and the piezoelectric driving unit group 125B are formed by stacking a lower electrode 131, a piezoelectric layer 132, and an upper electrode 133 in this order on the +Z surface of the elastic silicon layer 130. The lower electrode 131 and the upper electrode 133 are made of, for example, gold (Au) or platinum (Pt). The piezoelectric layer 132 is made of, for example, PZT (lead zirconate titanate), i.e., a piezoelectric material. However, the piezoelectric layer 132 may be made of other piezoelectric materials, and is not limited to any particular type.

The piezoelectric driving unit may have a structure including multiple stacked piezoelectric layers and including an intermediate electrode. The piezoelectric driving unit is a piezoelectric actuator electrically connected to an external control apparatus and is configured to be driven with an application of a voltage. The +Z side of the piezoelectric driving units on the piezoelectric driving unit group 125A and the piezoelectric driving unit group 125B may be covered with insulating films, not illustrated, made of silicon oxide and the like, and electric wires may be formed on +Z surfaces of the insulating films.

In FIG. 52, the piezoelectric driving units are provided on parts of the beam units 115, but the piezoelectric driving units is not necessarily provided on the parts of the beam units 115. As illustrated in FIG. 15, the piezoelectric driving units may be provided on the entire surfaces of the beam units 915. Also, the piezoelectric driving units do not have to be provided on all of the beam units 115. That is, the piezoelectric driving units may instead be provided on only some of the multiple beam units 115.

The movable unit connection unit 105 includes a silicon layer 130; and an interlayer film and a silicon support layer that are stacked in this order on the −Z surface of the silicon layer 130. The interlayer film is formed by an insulating film such as silicon oxide. The support layer is made of monocrystalline silicon, but as long as the support layer can support the silicon layer and keep the silicon layer fixed in place, the support layer is not limited to silicon. Insulating films and electric wires, not illustrated, may be formed on +Z surfaces of the movable unit 103, the connection unit 116, and the movable unit connection unit 105.

In the optical deflector with the single axis having the structure as illustrated in FIG. 52, voltages are applied to the piezoelectric driving units in the piezoelectric driving unit group 125A and the piezoelectric driving unit group 125B, so that the movable unit 103 can be rotated around the first axis.

As illustrated in FIG. 52, in the present embodiment, the optical deflector 100 is formed point-symmetrically with respect to the center of the movable unit 103. Alternatively, for example, the optical deflector 100 may be formed line-symmetrically with respect to a straight line perpendicular to the first axis and passing through the center of the movable unit 103.

In the case where the optical deflector 100 is formed line-symmetrically, the fixation ends for the meandering structure on both sides of the movable unit 103 and the movable unit connection units on both sides of the movable unit 103 are arranged without the rotation axis (i.e., the first axis) being interposed between the fixation ends and between the movable unit connection units (i.e., the fixation ends are arranged parallel to the rotation axis, and the movable unit connection units are arranged parallel to the rotation axis), so that the rotation axis of the natural resonance mode does not easily incline. Therefore, even when the deflection angle increases, the rotation axis does not easily shift. Also, the optical deflector 100 being formed line-symmetrically is preferable because a component (i.e., crosstalk) in the direction perpendicular to the desired rotation axis can be reduced.

In the case where the optical deflector 100 is formed line-symmetrically, however, the mirror reflection surface 102 of the movable unit 103 may incline even in the natural mode in which the entire structure including the movable unit 103 and the meandering structure translates in the Z direction. In other words, the mirror reflection surface 102 tends to rotate in response to disturbance vibration, and therefore, an un-intended vibration component may be superimposed on the optical scanning, and the optical deflector 100 may be damaged by a sudden impact. However, the above characteristics are advantageous if the movable unit 103 is desired to be efficiently moved by an external vibration, for example, with a power generation device.

In contrast, in the case where the optical deflector 100 is formed point-symmetrically, the fixation ends for the meandering structure on both sides of the movable unit 103 and the movable unit connection units on both sides of the movable unit 103 are arranged with the rotation axis (i.e., the first axis) being interposed between the fixation ends and between the movable unit connection units (i.e., the fixation ends are arranged across the rotation axis, and the movable unit connection units are arranged across the rotation axis), so that the mirror does not tend to rotate in response to disturbance vibration, and is resistant against a sudden impact. On the other hand, because the movable unit connection units are not in parallel to the rotation axis, the rotation axis of the natural resonance mode may easily incline. Therefore, as the deflection angle increases, the rotation axis may incline accordingly.

That is, since the point symmetry and the line symmetry have advantages and disadvantages, it is preferable to selectively use the point symmetry and the line symmetry according to the purpose. For example, the point symmetry is preferable in order to improve vibration resistance against disturbance, and the line symmetry is preferable in order to improve the deflection angle of the mirror reflection surface 102 of the movable unit 103.

In this manner, in the present embodiment, in the first beam unit groups 141a, 142a, the beam units 115 closer to the fixed unit 108 are shorter and have higher rigidities than the beam units 115 closer to the movable unit 103. In the present embodiment, in the second beam unit groups 141b, 142b, the beam units 115 closer to the fixed unit 108 are longer than the beam units 115 closer to the movable unit 103, and the beam units 115 closer to the movable unit 103 are lighter than the beam units 115 closer to the fixed unit 108.

Accordingly, the entire length of the support portions 104a, 104b constituting the actuator is increased, and the weights of the beam units 115 closer to the movable unit 103 are lower. Therefore, a large scan angle can be obtained while mechanical strength against resonance is increased. In the first beam unit groups 141a, 142a, the rigidities of the beam units 115 closer to the fixed unit 108 are higher. Therefore, a large scan angle can be obtained while mechanical strength against resonance is increased. Note that, in a case where the rigidities of the beam units 115 closer to the fixed unit 108 are higher than the rigidities of the beam units 115 closer to the movable unit 103, the mechanical strength against resonance are higher than in a case where the rigidities of the beam units 115 closer to the movable unit 103 are higher than the rigidities of the beam units 115 closer to the fixed unit 108.

Hereinafter, a structure in which the support portion is constituted by only the second beam unit groups 141b, 142b without the first beam unit groups 141a, 142a to enable the second beam unit groups 141b, 142b to have more beam units 115 is assumed. Even in this case, in the second beam unit groups 141b, 142b, the beam units 115 closer to the movable unit 103 are lighter than the beam units 115 closer to the fixed unit 108, and therefore, this case is also advantageous in obtaining a large scan angle. However, in this case, in accordance with the decrease in the distance to the fixed unit 108, the length of the beam unit 115 increases. Accordingly, the length of the support portion in the Y direction increases, and the entire size of the optical deflector increases. Also, the dead space in proximity to the movable unit 103 increases, and the area efficiency decreases.

In contrast, in the present embodiment, the first beam unit groups 141a, 142a including beam units 115 of which the lengths decrease in accordance with the decrease in the distance to the fixed unit 108 are provided between the fixed unit 108 and the second beam unit groups 141b, 142b. Therefore, even when the number of beam units 115 are increased in the first beam unit groups 141a, 142a, the dead space in proximity to the movable unit 103 does not increase, and the size of the entire optical deflector can be reduced. In other words, according to the present embodiment, the optical deflector achieves a large scan angle, and in addition, the size of the optical deflector can be reduced.

In the present embodiment, the number of beam units of the first beam unit groups 141a, 142a and the second beam unit groups 141b, 142b can be determined as appropriate, and is not limited to the example as illustrated in FIG. 52. The ratio of the number of beam units in the first beam unit groups 141a, 142a and the ratio of the number of beam units in the second beam unit groups 141b, 142b can be determined as appropriate, but the ratio of the number of beam units in the first beam unit groups 141a, 142a and the ratio of the number of beam units in the second beam unit groups 141b, 142b are preferably the same, or the ratio of the number of beam units in the first beam unit groups 141a, 142a is preferably higher than the ratio of the number of beam units in the second beam unit groups 141b, 142b. Specifically, the number of beam units in the first beam unit groups 141a, 142a is preferably equal to or more than the number of beam units in the second beam unit groups 141b, 142b.

This is because, when the ratio of the number of beam units in the second beam unit groups 141b, 142b is high, the meander length (the length of the support portion in the Y direction) becomes too large, which excessively increases the weight closer to the movable unit 103. For example, where the ratio of the number of beam units in the second beam unit groups 141b, 142b is defined as 1, the ratio of the number of beam units in the first beam unit groups 141a, 142a may be 1 or 2.

Examples of methods for causing the rigidity of the beam units 115 closer to the fixed unit 108 to be higher than the rigidity of the beam units 115 closer to the movable unit 103 include a method for adjusting the physical properties (Young's modulus, Poisson's ratio, density, and the like), the widths, the lengths, the thicknesses, and the like of the beam units 115 closer to the fixed unit 108 and the beam units 115 closer to the movable unit 103. Alternatively, two or more physical properties from among the above may be used in combination. The rigidity increases in accordance with the increase in the width, the decrease in the length, and the increase in the thickness. When a protective film and the like are formed on the beam unit 115, the physical properties (Young's modulus, Poisson's ratio, density, and the like), the width, the length, the thickness, and the like of the protective film may be adjusted.

In the present embodiment, the support portions 104a, 104b preferably have the meandering structure because the displacements in position of multiple beam units can be efficiently accumulated. When the meandering structure is used, piezoelectric driving is desirable because the actuators can be arranged efficiently in the beam units. Accordingly, the increase in the size of the entire optical deflector can be alleviated. For example, in the electrostatic driving, the comb electrodes are arranged on the outer periphery of the beam units, so that the size of the entire optical deflector is likely to increase. In electromagnetic driving, it is difficult to make a wiring layout for multiple beam units and arrange magnets for applying a magnetic field to the beam units, and accordingly, the size of the entire optical deflector is likely to increase.

FIG. 54 illustrates a relationship between the resonance frequency of the first mode and the deflection angle of the mirror (i.e., the swing angle of the movable unit 103) in the optical deflector as illustrated in FIG. 15 and in the optical deflector according to the present embodiment as illustrated in FIG. 52. The resonance frequency of the first mode is the lowest resonance frequency of the resonance frequencies. The deflection angle of the mirror corresponds to the scan angle of the mirror. As illustrated in FIG. 54, both the resonance frequency of the first mode and the deflection angle of the mirror are higher in the optical deflector according to the present embodiment as illustrated in FIG. 52 than in the optical deflector as illustrated in FIG. 15.

As explained above, in the optical deflector 100 according to the present embodiment, the line L1 connecting the +Y end portions of multiple beam units 115 in the first beam unit groups 141a, 142a is formed to be parallel with the first axis, and the line L2 connecting the −Y end portions of multiple beam units 115 in the first beam unit groups 141a, 142a is formed to be parallel with the first axis.

In this manner, the widths between the first axis and the end portions of the beam units 115 in the first beam unit groups 141a, 142a contributing to the rotational moment are constant, so that the rotating force can be efficiently transmitted to the movable unit 103. Specifically, unless the widths between the first axis and the end portions of the beam units 115 in first beam unit groups 141a, 142a are constant, vibrations contributing to the deflection angle become out-of-phase in the respective beam units 115, and these out-of-phase vibrations cause non-linear vibration when the deflection angle is increased, resulting in unstable rotation. Therefore, in order to stably rotate the movable unit 103 around the first axis, the widths between the first axis and the end portions of the beam units 115 in the first beam unit groups 141a, 142a are preferably constant.

FIG. 55 is a plan view of an optical deflector 100-3A according to a modification of the optical deflector 100-3 of the third embodiment. The optical deflector 100-3A of FIG. 55 is different from the fixed unit 108 in the frame shape as illustrated in FIG. 52 in that the optical deflector 100-3A includes fixed units 108 in a shape divided to form an optical transmission area in the direction perpendicular to the swing axis (the first axis) of the movable unit 103. With this configuration, the scanning light is less likely to be shielded by the frame even in a case where the scan angle of the light by the optical deflector 100A is large. The optical transmission area may be a space as illustrated in FIG. 55, or may be constituted by a member transmitting light such as glass.

FIG. 56 is a plan view of an optical deflector 100-3B according to a modification of the optical deflector 100-3 of the third embodiment. As illustrated in FIG. 56, the optical deflector 100-3B is formed with a smaller gap between the fixed unit 108 and the movable unit 103 and a smaller gap between the fixed unit 108 and the support portions 104a, 104b. For example, the gap between the fixed unit 108 and the movable unit 103 and the gap between the fixed unit 108 and the support portions 104a, 104b are constant.

FIG. 57 is a plan view of an optical deflector 100-3C according to a modification of the optical deflector 100-3 of the third embodiment. As illustrated in FIG. 57, the first beam unit groups 141a, 142a are formed such that the widths in the Y direction between the end portions of the beam units 115 closer to the movable unit 103 are longer, and the widths in the Y direction between the end portions of the beam units 115 closer to the fixed unit 108 are shorter. In this case, in the first beam unit groups 141a, 142a, the lengths of the beam units 115 closer to the movable unit 103 can be increased more greatly with respect to the lengths of the beam units 115 closer to the fixed unit 108.

As illustrated in FIG. 57, in the first beam unit groups 141a, 142a, an intersection between an extension line L11 connecting the end portions of +Y side connection units 116 and an extension line L12 connecting the end portions of −Y side connection units 116 is located on the first axis. When the first beam unit groups 141a, 142a are formed such that an intersection between the extension line L11 and the extension line L12 is located on the first axis, the movable unit 103 can be stably swung around the first axis.

FIG. 58 is a plan view of an optical deflector 100-3D according to a modification of the optical deflector 100-3 of the third embodiment. In the optical deflector 100-3D as illustrated in FIG. 58, the movable unit 103 is in a substantially rectangular shape, and in the first beam unit groups 141a, 142a and in the second beam unit groups 141b, 142b, the beam units 115 are formed in straight-line shapes extending in the Y direction. With this configuration, effects similar to the effects obtained with the optical deflector 100-3C of FIG. 57 can be achieved.

In the optical deflector 100-3D as illustrated in FIG. 58, in the second beam unit groups 141b, 142b, an intersection between an extension line L21 connecting the end portions of the connection unit 116 at one side and an extension line L22 connecting the end portions of the connection unit 116 at the other side may coincide with the center of the movable unit 103. Therefore, the movable unit 103 can be swung around the first axis in a more stable manner.

FIG. 59 is a plan view of an optical deflector 100-3E according to a modification of the optical deflector 100-3 of the third embodiment. The optical deflector 100-3E as illustrated in FIG. 59 is formed such that, in the first beam unit groups 141a, 142a and the second beam unit groups 141b, 142b, the beam units 115 are constituted by multiple straight-line sections connected with bends to make substantially arc shapes as a whole. Alternatively, parts of the beam units 115 may be formed in straight-line shapes extending in the Y direction, and other portions of the beam units 115 may be formed in arc shapes of which the center coincides with the center of the movable unit 103. Therefore, the movable unit 103 can be swung around the first axis in a more stable manner.

FIG. 60 is a plan view of an optical deflector 100-3F according to a modification of the optical deflector 100-3 of the third embodiment. In the optical deflector 100-3F as illustrated in FIG. 60, the movable unit 103 is supported by a single support portion 104a provided between the fixed unit 108 and the movable unit 103.

FIG. 61 is a plan view of an optical deflector 100-3G according to a modification of the optical deflector 100-3 of the third embodiment. In the optical deflector 100-3G as illustrated in FIG. 61, the movable unit 103 is supported by three support portions, i.e., support portions 104c, 104d, 104e, provided between the fixed unit 108 and the movable unit 103. For example, the support portions 104c, 104d, and 104e have the same structures as the support portions 104a, 104b.

FIG. 62 is a plan view of an optical deflector 100-3H according to a modification of the optical deflector 100-3 of the third embodiment. In the optical deflector 100-3H as illustrated in FIG. 62, the movable unit 103 is supported by four support portions, i.e., support portions 104f, 104g, 104h, 104i, provided between the fixed unit 108 and the movable unit 103. For example, the support portions 104f, 104g, 104h, and 104i have the same structures as the support portions 104a, 104b.

In the optical deflector 100-3G as illustrated in FIG. 61 and in the optical deflector 100-3H as illustrated in FIG. 62, the deflection direction of light is not limited to a single axial direction. The light can be deflected in multiple axial directions.

Hereinabove, the optical deflector 100-3G including three support portions between the fixed unit 108 and the movable unit 103 and the optical deflector 100-3H including four support portions between the fixed unit 108 and the movable unit 103 have been explained with reference to FIG. 61 and FIG. 62, respectively. However, five or more support portions may be provided.

FIG. 63 is a plan view of an optical deflector 150-3 according to a modification of the optical deflector 100-3 of the third embodiment. As illustrated in FIG. 63, the optical deflector 150-3 is a 2-axis optical deflector. In the optical deflector 150, the movable unit 153, including the mirror unit 101 and the mirror reflection surface 102, is supported by support portions 104a, 104b constituting a pair of actuators.

In FIG. 63, movable unit beams 157a, 157b facing each other with the mirror unit 101 interposed therebetween are connected to bridge the inside of the movable unit 153 in the frame shape. Torsion beams 156a, 156b extend from substantially the centers of the movable unit beams 157a, 157b, respectively, in a substantially vertical direction (i.e., the X direction) to support the mirror unit 101.

In the optical deflector 150-3 as illustrated in FIG. 63, the movable unit 153 is supported in such a manner that the movable unit 153 can be resonantly driven by the movable unit beams 157a, 157b. For example, in a case where the torsional resonance frequency of the torsion beams 156a, 156b is set to about 20 kHz, drive signals at around the resonance frequency are input to the piezoelectric driving units provided on the +Z surface of the movable unit beams 157a, 157b connected to the torsion beams 156a, 156b.

As a result, the movable unit beams 157a, 157b vibrate to cause a torsion of mechanical resonance in the torsion beams 156a, 156b, so that the mirror unit 101 can be rotated around the second axis by the movable unit beams 157a, 157b. Further, Lissajous scan and raster scan can be performed by combining this vibration around the second axis with the swing of the movable unit 103 around the first axis achieved with the support portions 104a, 104b of the meandering structure.

With this 2-axis optical deflector, even if the vibration generated by the support portions 104a, 104b propagates to the movable unit beams 157a, 157b, the beam units 115 closer to the movable unit 153 are shorter than and are deformed less easily than the beam units 115 closer to the fixed unit 108 in the support portions 104a, 104b. Therefore, the movable unit beams 157a, 157b are less affected by the vibration of the beam units 115 in the support portions 104a, 104b.

In the above explanation, the piezoelectric layers 132 are provided on the support portions 104a, 104b constituting the actuator to achieve piezoelectric driving. However, electromagnetic driving to deform the support portions 104a, 104b by an electromagnetic field or electrostatic driving with comb electrodes formed in the support portions 104a, 104b can also be employed. Coils or magnet arrays may be formed on the support portions 104a, 104b constituting beams. The support portions 104a, 104b may be driven by either resonance driving or non-resonance driving.

The shape and configuration of the support portions 104a, 104b constituting the actuator are not limited. A certain sensor may be formed with the beam unit. The sensor is not particularly limited. Examples of such sensors include displacement detection sensors (e.g., piezoelectric sensors, resistance type strain gauges, and the like) for outputting signals according to deformation, temperature sensors, and the like.

Modified Embodiments of Third Embodiment

Next, optical deflectors, i.e., movable apparatuses, according to the modified embodiments of the third embodiment are explained. In the modified embodiments of the third embodiment, not only the lengths but also the thicknesses and the widths are changed in the beam units of the support portions. In the modified embodiment of the third embodiment, constituent elements corresponding to the embodiments explained above are denoted with the same reference numerals, and repeated explanation thereabout is omitted as appropriate.

FIG. 64 is a plan view of an optical deflector 200-3 according to a modified embodiment of the optical deflector 100-3 of the third embodiment. The planar shape of the optical deflector 200-3 is the same as the planar shape of the optical deflector 100-3 as illustrated in FIG. 52.

FIG. 65 is a cross sectional view taken along the alternate long and short dashed line 16A-16B of FIG. 64. As illustrated in FIG. 65, a first beam unit group 141a of a first support portion 204a provided in the X direction of the movable unit 103 includes a beam unit 215a closer to the fixed unit 108 and a beam unit 215b closer to the movable unit 103. The beam unit 215a closer to the fixed unit 108 is thicker than the beam unit 215b closer to the movable unit 103. The above explanation is also applicable to a first beam unit group 142a of a second support portion 204b provided in the X direction of the movable unit 103.

A second beam unit group 141b of the first support portion 204a provided in the X direction of the movable unit 103 includes a beam unit 215c closer to the fixed unit 108 and a beam unit 215d closer to the movable unit 103. The beam unit 215c closer to the fixed unit 108 and the beam unit 215d closer to the movable unit 103 have the same thickness as the thickness of the beam unit 215b of the first beam unit group 141a. The above explanation is also applicable to a second beam unit group 142b of the second support portion 204b provided in the X direction of the movable unit 103.

The beam unit 215a is formed by stacking a lower electrode 131, a piezoelectric layer 132, and an upper electrode 133 in this order on the +Z surface of the silicon layer 130. In the beam unit 215a, the silicon oxide layer 231 and the silicon layer 232 are stacked in this order on the −Z surface of the silicon layer 130. For example, the thickness of the stacked silicon layer 232 is 30 μm to 40 μm.

The beam units 215b, 215c, and 215d are formed by stacking a lower electrode 131, a piezoelectric layer 132, and an upper electrode 133 in this order on the +Z surface of the silicon layer 130. However, in the beam units 215b, 215c, and 215d, the silicon oxide layer 231 and the silicon layer 232 are not provided on the −Z surface. In this manner, the beam unit 215a is configured to be shorter and thicker than the beam units 215b, 215c, and 215d. Therefore, as compared with the third embodiment, the beam unit 215a has an even higher rigidity than the beam units 215b, 215c, and 215d. In FIG. 65, the two layers, i.e., the silicon oxide layer 231 and the silicon layer 232, are stacked and formed. However, there may be only one layer.

FIG. 66 is a cross sectional view taken along the alternate long and short dashed line 16C-16D of FIG. 64. As illustrated in FIG. 66, portions of the connection unit 216a, connecting the beam unit 215a and the beam unit 215b, located on both ends the beam unit 215a in the longitudinal direction are thicker than the remaining portion of the connection unit 216a. The portions of the connection unit 216a located on both ends the beam unit 215a in the longitudinal direction are formed by stacking a silicon oxide layer 231, a silicon layer 232, a silicon oxide layer 233, and a silicon support layer 234 in this order on the −Z surface of the silicon layer 130, but in the remaining portion of the connection unit 216a, no layer is provided on the −Z surface of the silicon layer 130. In the connection unit 216b connecting the beam unit 215c and the beam unit 215d, no layer is provided on the −Z surface of the silicon layer 130.

The silicon support layer 234 and the like provided on the back surface of the connection unit connecting the beam units constituting the meandering structure in this manner are known to be effective for reducing unnecessary vibration of the natural mode and for improving the deflection efficiency per single beam unit. Therefore, the thickness of the connection unit 216a closer to the fixed unit 108 can be configured to be greater than the thickness of the connection unit 216a closer to the movable unit 103, so that the effect of the present disclosure can be further enhanced.

Although FIG. 66 illustrates the multi-layer structure in which the silicon oxide layer 231, the silicon layer 232, the silicon oxide layer 233, and the silicon support layer 234 are stacked in this order on the back surface of the connection unit, there may be only a single layer. In this case, when there are many beam units, the thicknesses of layers formed on the back surface of the connection unit may be relatively increased toward the fixed unit 108 and relatively decreased toward the movable unit 103.

FIG. 67 is a plan view of an optical deflector 200-3A according to a modified embodiment of the optical deflector 100-3 of the third embodiment. In the optical deflector 200-3A as illustrated in FIG. 67, the widths of the beam units 225 increase away from the movable unit 103 toward the fixed unit 108 in a first beam unit group 141a of a first support portion 214a provided in the X direction of the movable unit 103. The above explanation is also applicable to a first beam unit group 142a of a second support portion 214b provided in the X direction of the movable unit 103.

In this manner, in the first beam unit groups 141a, 142a, the widths of the beam units 225 closer to the fixed unit 108 are increased, so that the rigidities are increased. Specifically, from the movable unit 103 to the fixed unit 108, the lengths of the beam units 225 in the first beam unit groups 141a, 142a gradually decrease, and the widths of the beam units 225 in the first beam unit groups 141a, 142a gradually increase. In other words, in the first beam unit groups 141a, 142a, the lengths of the beam units 225 closer to the movable unit 103 are longer than the lengths of the beam units 225 closer to the fixed unit 108, and the rigidities of the beam units 225 closer to the fixed unit 108 are higher than the rigidities of the beam units 225 closer to the movable unit 103. Therefore, the effect of the present disclosure can be further enhanced.

FIG. 68 is a plan view of an optical deflector 200-3B according to a modified embodiment of the optical deflector 100-3 of the third embodiment. In the optical deflector 200-3B as illustrated in FIG. 68, in a first beam unit group 141a of a first support portion 224a provided in the X direction of the movable unit 103, the width of a connection unit 316a increases away from the movable unit 103 toward the fixed unit 108. The above explanation is also applicable to a first beam unit group 142a of a second support portion 224b provided in the X direction of the movable unit 103. In this configuration, in the connection unit 316a connecting the beam units 115 constituting the meandering structure in each of the first beam unit groups 141a, 142a, the widths of the beam units 225 closer to the fixed unit 108 are configured to be wider than the widths of the beam units 225 closer to the movable unit 103, so that the rigidities on the side of the fixed unit 108 are higher than the rigidities on the side of the movable unit 103. Therefore, the effect of the present disclosure can be further enhanced.

When the movable apparatus according to the embodiments explained above is used for an optical scanning system, the size of the optical scanning system can be reduced, and the optical scanning system can achieve a large scan angle.

When the movable apparatus according to the embodiments explained above is used for an image projection apparatus, the size of the image projection apparatus can be reduced, and the image projection apparatus can achieve a large projectable area.

When the movable apparatus according to the embodiments explained above is used for an optical writing apparatus, the size of the optical writing apparatus can be reduced, and the optical writing apparatus can achieve a large writable area.

When the movable apparatus according to the embodiments explained above is used for an object recognition apparatus, the size of the object recognition apparatus can be reduced, and the object recognition apparatus can achieve a large recognition range.

When the movable apparatus according to the embodiments explained above is used for a laser headlamp, the size of the laser headlamp can be reduced, and the laser headlamp can achieve a large illumination area.

When the movable apparatus according to the embodiments explained above is used for a head mounted display, the size of the head mounted display can be reduced, and the head mounted display can achieve a large image formable area.

For example, in each of the above embodiments, the movable unit includes the mirror unit. Instead of the mirror unit, the movable unit may have a diffraction grating, a photodiode, a heater (for example, a heater using SiN), a light source (for example, a surface emitting laser), and the like.

Although the example of the embodiment of the present disclosure has been hereinabove described, the present disclosure is not limited to such a specific embodiment, and various modifications and changes can be made within the scope of the gist of the present disclosure described in the claims.

REFERENCE SIGNS LIST 10 optical scanning system
11 control apparatus 12, 12b light source apparatus
13 movable apparatus
14 reflection surface
15 scan surface
25 light source apparatus driver
26 movable apparatus driver
30 control unit
31 drive signal output unit
50 laser headlamp
51 mirror
52 transparent plate
60 head mounted display
60a front part
60b temple part
61 light guide plate
62 half mirror
63 wearer
100 optical deflector (movable apparatus)
101 mirror unit
102 mirror reflection surface
103 movable unit
104a, 104b support portion
105 movable unit connection unit
108 fixed unit
109 electric contact electrode terminal
115 beam unit
116 connection unit
125A, 125B piezoelectric driving unit group
130 silicon layer
131 lower electrode
132 piezoelectric layer
133 upper electrode
400 automobile (example of vehicle)
500 head-up display device (example of image projection apparatus, example of head-up display)
600 writing apparatus
650 laser printer
700 LiDAR apparatus (example of object recognition apparatus)
702 target object
801 package member
802 attachment member
803 transparent member

CITATION LIST

Patent Literature

[PTL 1] Unexamined Japanese Patent Application Publication No. 2014-232176

The present application is based on and claims the benefit of priorities of Japanese Priority Application No. 2019-190737 filed on Oct. 18, 2019, Japanese Priority Application No. 2019-190738 filed on Oct. 18, 2019, Japanese Priority Application No. 2020-045695 filed on Mar. 16, 2020, the contents of which are incorporated herein by reference.

The invention claimed is:

1. A movable apparatus comprising:
a movable unit including a mirror configured to reflect light;
a support portion including a first end and a second end, the first end being connected to the movable unit, and the support portion configured to swingably support the movable unit; and
a fixed unit connected to the second end of the support portion,
wherein the support portion includes:
a plurality of beam units including more than two beam units; and
at least one connection unit connecting adjacent beam units of the plurality of beam units,
wherein among the plurality of beam units including more than two beam units, lengths of the plurality of beam units gradually decrease from the movable unit to the fixed unit.

2. A movable apparatus comprising:
a movable unit including a mirror configured to reflect light;
a support portion including a first end and a second end, the first end being connected to the movable unit, and the support portion configured to swingably support the movable unit; and
a fixed unit connected to the second end of the support portion,
wherein the support portion includes:
a plurality of beam units; and
at least one connection unit connecting adjacent beam units of the plurality of beam units,
wherein where the support portion is divided into a first part and a second part at a predetermined or given position, the first part being closer to the fixed unit, and the second part being closer to the movable unit,
wherein, among the plurality of beam units, a beam unit in the first part is longer than a beam unit in the second part,
wherein the beam unit in the second part is lighter than the beam unit in the first part, and
wherein a width of the beam unit in the first part is different from a width of the beam unit in the second part.

3. The movable apparatus according to claim 1, wherein a thickness of the beam unit in the first part is greater than a thickness of the beam unit in the second part.

4. The movable apparatus according to claim 1, wherein the at least one connection unit includes:
a first connection unit connecting adjacent beam units in the first part among the plurality of beam units; and
a second connection unit connecting adjacent beam units in the second part among the plurality of beam units,
wherein a thickness of the first connection unit is greater than a thickness of the second connection unit.

5. The movable apparatus according to claim 1, wherein a width of the beam unit in the first part is greater than a width of the beam unit in the second part.

6. The movable apparatus according to claim 1, wherein the at least one connection unit includes:
a first connection unit connecting adjacent beam units in the first part among the plurality of beam units; and
a second connection unit connecting adjacent beam units in the second part among the plurality of beam units,
wherein a width of the first connection unit is greater than a width of second connection unit.

7. A movable apparatus comprising:
a movable unit;
a support portion including a first end and a second end, the first end being connected to the movable unit, and the support portion configured to swingably support the movable unit; and
a fixed unit connected to the second end of the support portion,
wherein the support portion includes:
a plurality of beam units including more than two beam units; and at least one connection unit connecting adjacent beam units of the plurality of beam units, wherein where the support portion is divided into a first part and a second part at a predetermined or given position, the first part being closer to the fixed unit, and the second part being closer to the movable unit, wherein among the plurality of beam units including more than two beam units, beam units in the first part are defined as a first beam unit group, and beam units in the second part are defined as a second beam unit group, wherein where the first beam unit group includes more than two beam units, among the plurality of beam units including more than two beam units, lengths of the plurality of beam units gradually decrease from the movable unit to the fixed unit, wherein where the second beam unit group is divided into a fifth beam unit group and a sixth beam unit group at a predetermined or given third position, the fifth beam unit group being closer to the fixed unit, and the sixth beam unit group being closer to the movable unit, among the plurality of beam units, a beam unit in the fifth beam unit group is longer than a beam unit in the sixth beam unit group, and the beam unit in the sixth beam unit group is lighter than the beam unit in the fifth beam unit group.

8. The movable apparatus according to claim 7, wherein a thickness of the beam unit in the third beam unit group is greater than a thickness of the beam unit in the fourth beam unit group.

9. The movable apparatus according to claim 7, wherein the at least one connection unit includes:
   a first connection unit connecting adjacent beam units in the third beam unit group among the plurality of beam units; and
   a second connection unit connecting adjacent beam units in the fourth beam unit group among the plurality of beam units,
   wherein a thickness of the first connection unit is greater than a thickness of the second connection unit.

10. The movable apparatus according to claim 7, wherein a width of the beam unit in the fifth beam unit group is greater than a thickness of the beam unit in the sixth beam unit group.

11. The movable apparatus according to claim 1, wherein the support portion has a shape including an arc of which a center coincides with a center of the movable unit or a center of the mirror unit.

12. The movable apparatus according to claim 1, wherein the at least one support portion includes a first support portion and a second support portion, and
   the first support portion and the second support portion support the movable unit from both sides of the movable unit to enable the movable unit to be rotated about the first axis.

13. The movable apparatus according to claim 1, wherein the movable unit includes:
   a first movable unit beam; and
   a second movable unit beam including a first end connected to the first movable unit beam and a second end connected to the mirror unit,
   wherein the second movable unit beam supports the mirror unit to enable the mirror unit to be resonantly driven.

14. The movable apparatus according to claim 1, wherein the at least one support portion includes three or more support portions, and
   the three or more support portions support the movable unit to enable the movable unit to be rotated about a plurality of axes.

15. The movable apparatus according to claim 1, wherein one or more beam units of the plurality of beam units is provided with a piezoelectric driving unit.

16. The movable apparatus according to claim 1, wherein:
   where the support portion is divided into two parts at a predetermined or given position, the two parts including a first part closer to the fixed unit and a second part closer to the movable unit,
   a beam unit in the first part has a higher rigidity than a beam unit in the second part, and
   the beam unit in the second part is longer than the beam unit in the first part.

17. The movable apparatus according to claim 7, wherein:
   where the first beam unit group is divided into a third beam unit group and a fourth beam unit group at a predetermined or given second position, the third beam unit group being closer to the fixed unit, and the fourth beam unit group being closer to the movable unit,
   among the plurality of beam units, a beam unit in the third beam unit group has a higher rigidity than a beam unit in the fourth beam unit group, and
   the beam unit in the fourth beam unit group is longer than the beam unit in the third beam unit group.

* * * * *